(12) United States Patent
Fukutome

(10) Patent No.: US 10,591,791 B2
(45) Date of Patent: Mar. 17, 2020

(54) SEMICONDUCTOR DEVICE AND ELECTRONIC DEVICE

(71) Applicant: Semiconductor Energy Laboratory Co., Ltd., Atsugi-shi, Kanagawa-ken (JP)

(72) Inventor: Takahiro Fukutome, Atsugi (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 86 days.

(21) Appl. No.: 15/563,663

(22) PCT Filed: Apr. 11, 2016

(86) PCT No.: PCT/IB2016/052033
§ 371 (c)(1),
(2) Date: Oct. 2, 2017

(87) PCT Pub. No.: WO2016/170443
PCT Pub. Date: Oct. 27, 2016

(65) Prior Publication Data
US 2018/0095336 A1    Apr. 5, 2018

(30) Foreign Application Priority Data
Apr. 20, 2015    (JP) .................. 2015-085794

(51) Int. Cl.
*G02F 1/1362*    (2006.01)
*H01L 27/12*    (2006.01)
(Continued)

(52) U.S. Cl.
CPC ..... *G02F 1/136286* (2013.01); *G09G 3/3677* (2013.01); *H01L 27/10* (2013.01);
(Continued)

(58) Field of Classification Search
CPC ................. G02F 1/133555; G02F 1/133514
See application file for complete search history.

(56) References Cited

U.S. PATENT DOCUMENTS

| 6,862,008 B2 | 3/2005 | Yamazaki et al. |
|---|---|---|
| 7,573,469 B2 | 8/2009 | Yamazaki et al. |
| (Continued) | | |

FOREIGN PATENT DOCUMENTS

| CN | 001407373 A | 4/2003 |
|---|---|---|
| CN | 101944506 A | 1/2011 |
| (Continued) | | |

OTHER PUBLICATIONS

International Search Report (Application No. PCT/IB2016/052033) dated Jul. 12, 2016.
(Continued)

*Primary Examiner* — Thien F Tran
(74) *Attorney, Agent, or Firm* — Robinson Intellectual Property Law Office; Eric J. Robinson

(57) ABSTRACT

A semiconductor device with an improved aperture ratio is provided. Furthermore, a semiconductor device having lower power consumption is provided. The semiconductor device includes a first wiring, a second wiring, a third wiring, a first driver circuit, a second driver circuit, and a cell array, and the cell array includes a plurality of cells each including a transistor and a storage capacitor. The first wiring is electrically connected to the first driver circuit, the second wiring is electrically connected to the second driver circuit, the transistor is positioned above the second wiring, the second wiring includes a region serving as a first gate electrode of the transistor in a region overlapping with the transistor, the third wiring is positioned above the transistor and includes a region overlapping with the second wiring,
(Continued)

and the second wiring is electrically connected to the third wiring in a region outside the cell array.

16 Claims, 38 Drawing Sheets

(51) Int. Cl.
    *H01L 27/108*     (2006.01)
    *H01L 27/10*     (2006.01)
    *H01L 29/786*     (2006.01)
    *G09G 3/36*     (2006.01)

(52) U.S. Cl.
    CPC .......... *H01L 27/108* (2013.01); *H01L 27/124* (2013.01); *H01L 27/1225* (2013.01); *H01L 27/1255* (2013.01); *H01L 29/78648* (2013.01); *G02F 2001/136295* (2013.01); *G09G 3/3648* (2013.01); *G09G 2300/0426* (2013.01)

(56) References Cited

U.S. PATENT DOCUMENTS

| | | |
|---|---|---|
| 7,952,551 B2 | 5/2011 | Kawata |
| 8,304,300 B2 | 11/2012 | Sakata et al. |
| 8,735,884 B2 | 5/2014 | Sakata et al. |
| 9,105,594 B2 | 8/2015 | Yamazaki et al. |
| 9,130,046 B2 | 9/2015 | Sakata et al. |
| 2003/0030381 A1 | 2/2003 | Yamazaki et al. |
| 2008/0012812 A1 | 1/2008 | Kawata |
| 2010/0073272 A1 | 3/2010 | Yamazaki et al. |
| 2011/0003418 A1 | 1/2011 | Sakata et al. |
| 2012/0032730 A1 | 2/2012 | Koyama |
| 2014/0034954 A1 | 2/2014 | Yamazaki et al. |
| 2014/0042432 A1 | 2/2014 | Yamazaki |
| 2014/0042443 A1 | 2/2014 | Yamazaki |
| 2015/0084045 A1 | 3/2015 | Yamazaki et al. |
| 2015/0097181 A1 | 4/2015 | Yamazaki |
| 2015/0131019 A1* | 5/2015 | Kita .................... G09G 3/3648 349/42 |
| 2015/0325600 A1 | 11/2015 | Sakata et al. |
| 2016/0225797 A1 | 8/2016 | Sakata et al. |

FOREIGN PATENT DOCUMENTS

| | | |
|---|---|---|
| JP | 2003-058075 A | 2/2003 |
| JP | 2008-020530 A | 1/2008 |
| JP | 2011-029635 A | 2/2011 |
| JP | 2012-257187 A | 12/2012 |
| JP | 2014-063141 A | 4/2014 |
| JP | 2014-199402 A | 10/2014 |
| JP | 2014-199899 A | 10/2014 |
| JP | 2015-088739 A | 5/2015 |
| JP | 2015-092556 A | 5/2015 |
| KR | 2003-0014598 A | 2/2003 |
| KR | 2011-0003265 A | 1/2011 |
| KR | 2015-0034093 A | 4/2015 |
| TW | 546597 | 8/2003 |
| TW | 201110243 | 3/2011 |

OTHER PUBLICATIONS

Written Opinion (Application No. PCT/IB2016/052033) dated Jul. 12, 2016.

* cited by examiner

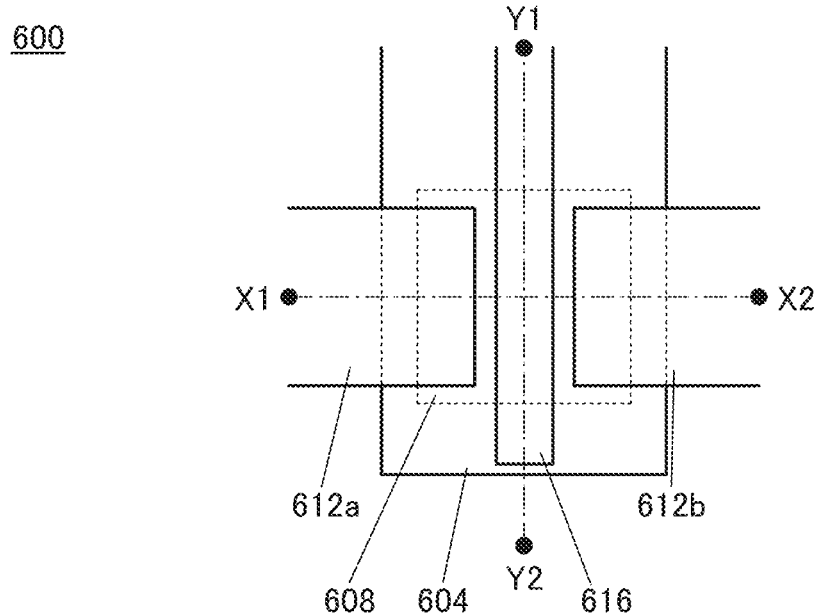
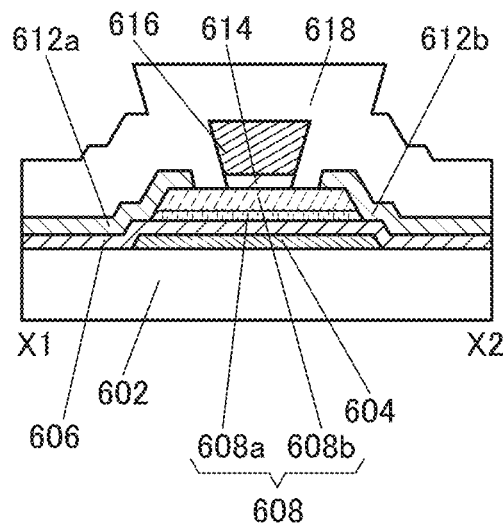 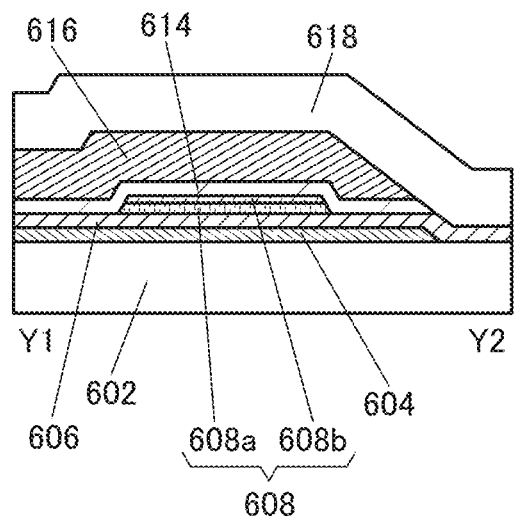

FIG. 10A out-of-plane method CAAC-OS
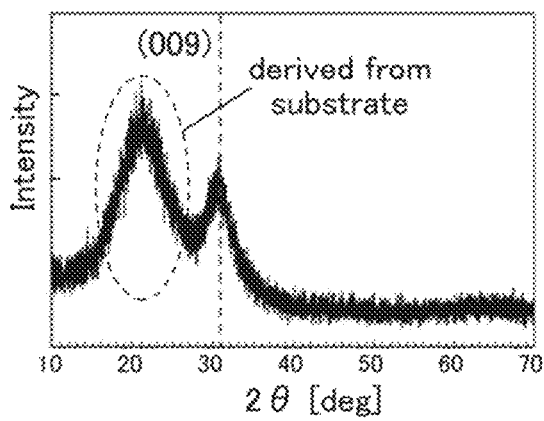
FIG. 10B in-plane method φ scan CAAC-OS
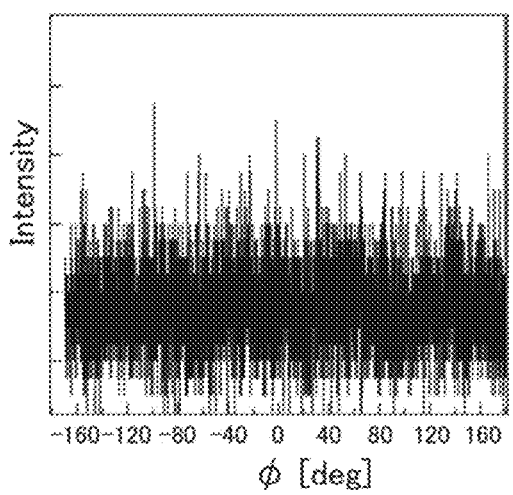
FIG. 10C in-plane method φ scan Single crystal OS
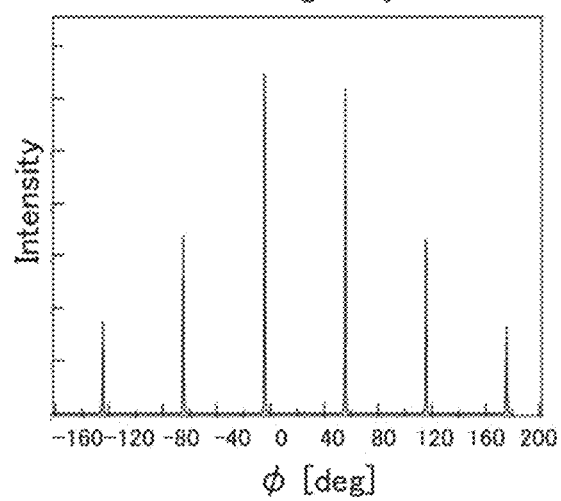
FIG. 10D
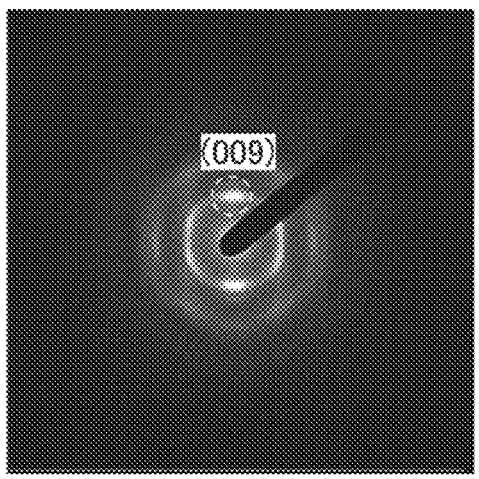
FIG. 10E
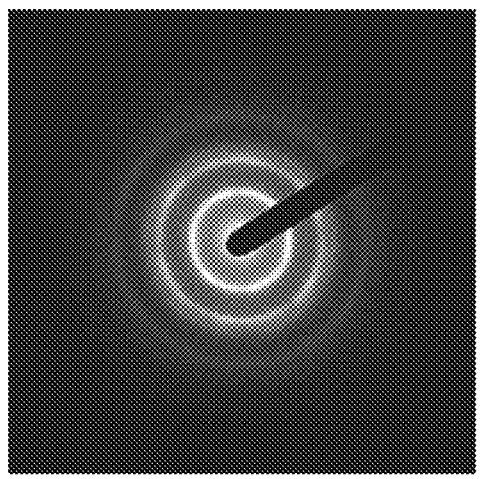

SEMICONDUCTOR DEVICE AND ELECTRONIC DEVICE

TECHNICAL FIELD

One embodiment of the present invention relates to a semiconductor device. Note that one embodiment of the present invention is not limited to the above technical field. The technical field of one embodiment of the invention disclosed in this specification and the like relates to an object, a method, or a manufacturing method. Furthermore, one embodiment of the present invention relates to a process, a machine, manufacture, or a composition of matter. Specific examples of the technical field of one embodiment of the present invention disclosed in this specification include a semiconductor device, a display device, a liquid crystal display device, a light-emitting device, a power storage device, an imaging device, a memory device, a method for driving any of them, and a method for manufacturing any of them.

BACKGROUND ART

In recent years, flat panel displays such as liquid crystal displays (LCDs) have been widespread. In a display device such as a flat panel display, in pixels arranged in the row direction and the column direction, a transistor serving as a switching element, a liquid crystal element electrically connected to the transistor, and a capacitor connected to the liquid crystal element in parallel are provided.

As a semiconductor material for forming a semiconductor film of the transistor, a silicon semiconductor such as amorphous silicon or polysilicon is generally used.

Metal oxides having semiconductor characteristics (hereinafter referred to as oxide semiconductors) are semiconductor materials which can be used for semiconductor films in transistors. For example, techniques for forming transistors using zinc oxide or an In—Ga—Zn-based oxide semiconductor are disclosed (see Patent Document 1 and Patent Document 2). Oxide semiconductors are used for, in addition to a display device, a variety of devices such as a memory and a CPU (see Patent Document 3).

REFERENCES

Patent Documents

[Patent Document 1] Japanese Published Patent Application No. 2014-63141
[Patent Document 2] Japanese Published Patent Application No. 2014-199402
[Patent Document 3] Japanese Published Patent Application No. 2012-257187

SUMMARY OF THE INVENTION

Problems to be Solved by the Invention

An object of one embodiment of the present invention is to provide a display device including a pixel portion with a high aperture ratio. Another object is to provide a high-definition display device. Another object is to provide a highly integrated semiconductor device. Another object is to provide a semiconductor device with low power consumption. Another object is to provide a semiconductor device including a transistor having high on-state current. Another object is to provide a semiconductor device which operates at high speed.

Another object is to provide a novel semiconductor device. Another object is to provide a module including the semiconductor device. Another object is to provide an electronic device including the semiconductor device or the module. Another object is to provide a method for manufacturing the semiconductor device.

Note that the descriptions of these objects do not disturb the existence of other objects. In one embodiment of the present invention, there is no need to achieve all the objects. Other objects will be apparent from the description of the specification, the drawings, the claims, and the like, and other objects can be derived from the description of the specification, the drawings, the claims, and the like.

Means for Solving the Problems

One embodiment of the present invention is a semiconductor device including a first wiring, a second wiring, a third wiring, a first driver circuit, a second driver circuit, and a cell array. The cell array includes a plurality of cells each including a transistor and a storage capacitor. The transistor includes a first insulating film, an oxide semiconductor film, and a second insulating film. The oxide semiconductor film includes a region overlapping with the second wiring with the first insulating film provided therebetween and a region overlapping with the third wiring with the second insulating film provided therebetween. The first wiring is electrically connected to the first driver circuit. The second wiring is electrically connected to the second driver circuit. The transistor is positioned above the second wiring. The second wiring includes a region serving as a first gate electrode of the transistor in a region overlapping with the transistor. The third wiring is positioned above the transistor and includes a region serving as a second gate electrode of the transistor in a region overlapping with the transistor. The third wiring includes a region overlapping with the second wiring. The second wiring is electrically connected to the third wiring in a region outside the cell array.

The second wiring and the third wiring are electrically connected to each other in at least one of the cells.

Another embodiment of the present invention is a semiconductor device including a first wiring, a second wiring, a third wiring, a first driver circuit, a second driver circuit, a third driver circuit, and a cell array. The cell array is positioned between the second driver circuit and the third driver circuit. The cell array includes a plurality of cells each including a transistor and a storage capacitor. The transistor includes a first insulating film, an oxide semiconductor film, and a second insulating film. The oxide semiconductor film includes a region overlapping with the second wiring with the first insulating film provided therebetween and a region overlapping with a fourth wiring with the second insulating film provided therebetween. The first wiring is electrically connected to the first driver circuit. The second wiring is electrically connected to the second driver circuit or the third driver circuit. The transistor is positioned above the second wiring. The second wiring includes a region serving as a first gate electrode of the transistor in a region overlapping with the transistor. The third wiring is positioned above the transistor and includes a region serving as a second gate electrode of the transistor in a region overlapping with the transistor. The third wiring includes a region overlapping with the second wiring.

The second wiring is electrically connected to the third wiring in a region outside the cell array.

The second wiring and the third wiring may be electrically connected to each other in a region between the cell array and the second driver circuit.

The width of the second wiring in a connection portion between the second wiring and the third wiring may be larger than the width of the second wiring in a region overlapping with the cell.

The electric resistance of the third wiring may be lower than or equal to the electric resistance of the second wiring.

The third wiring may contain copper.

Furthermore, the cell may be a pixel and the cell array may be a pixel portion.

Another embodiment of the present invention is an electronic device including the above-described semiconductor device.

Effect of the Invention

According to one embodiment of the present invention, a display device including a pixel portion with a high aperture ratio can be provided. Alternatively, a high-definition display device can be provided. Alternatively, a highly integrated semiconductor device can be provided. Alternatively, a semiconductor device with low power consumption can be provided. Alternatively, a semiconductor device including a transistor having high on-state current can be provided. Alternatively, a semiconductor device which operates at high speed can be provided.

Alternatively, a novel semiconductor device can be provided. Alternatively, a module including the semiconductor device can be provided. Alternatively, an electronic device including the semiconductor device or the module can be provided. Alternatively, a method for manufacturing the semiconductor device can be provided.

Note that the description of these effects does not preclude the existence of other effects. One embodiment of the present invention does not necessarily achieve all the effects listed above. Other effects will be apparent from the description of the specification, the drawings, the claims, and the like, and other effects can be derived from the description of the specification, the drawings, the claims, and the like.

BRIEF DESCRIPTION OF DRAWINGS

FIGS. 7A-7C A top view and cross-sectional views illustrating one embodiment of a semiconductor device.

FIGS. 10A-10E Views showing structural analysis of a CAAC-OS and a single crystal oxide semiconductor by XRD and views showing selected-area electron diffraction patterns of a CAAC-OS.

MODES FOR CARRYING OUT THE INVENTION

Figure 1A:
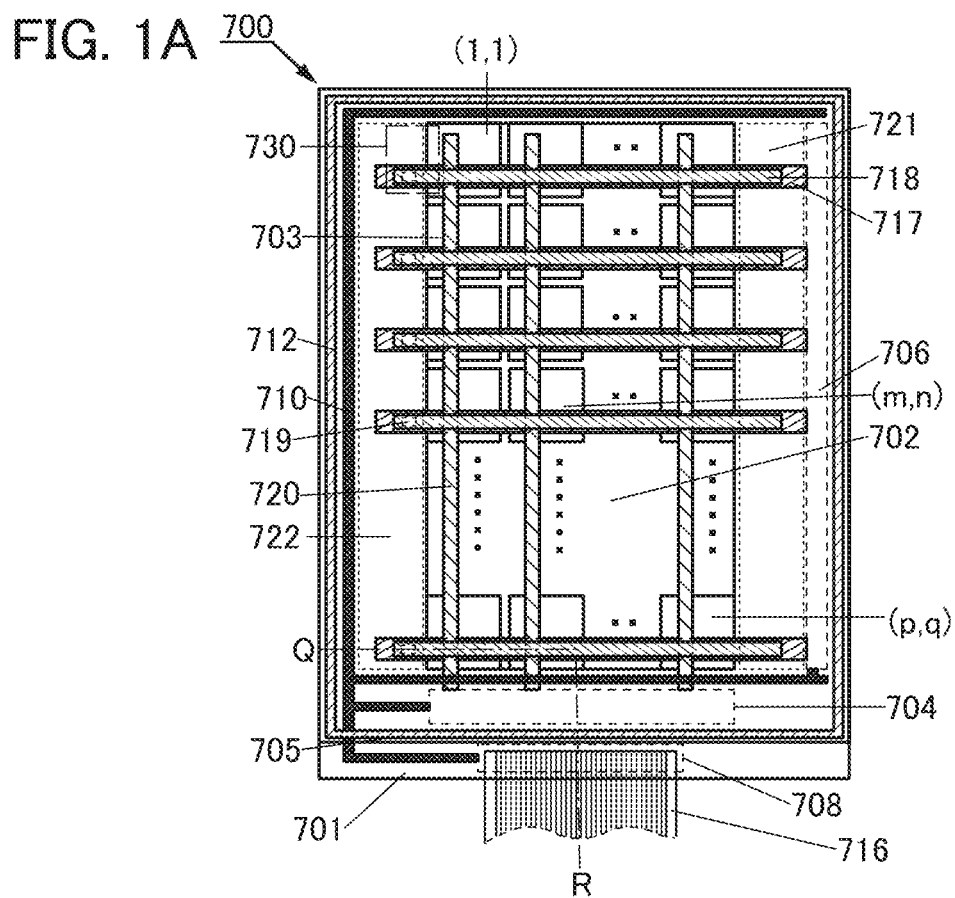
FIGS. 1A-1C Top views illustrating embodiments of a display device.

Embodiments of the present invention will be described below with reference to the drawings. However, the present invention is not limited to the following description. It is readily appreciated by those skilled in the art that modes and details of the present invention can be changed in various ways without departing from the spirit and the scope thereof. Therefore, the present invention should not be construed as being limited to the following description of the embodiments. Note that in describing the structure of the present invention with reference to the drawing, reference numerals denoting the same portions are used in different drawings in common.

In the drawings, the size, the layer thickness, or the region is exaggerated for clarity in some cases. Therefore, the size, the layer thickness, or the region is not limited to the illustrated scale. Note that the drawings are schematic views showing ideal examples, and embodiments of the present invention are not limited to shapes or values shown in the drawings.

The terms "first", "second", "third" to "n-th" (n is a natural number) used in this specification are assigned in order to avoid confusion between components and thus do not pose any numerical limitation.

In this specification, terms for describing arrangement, such as "over" and "under", are used for convenience for describing the positional relationship between components with reference to drawings. Furthermore, the positional relationship between components is changed as appropriate in accordance with a direction in which each component is described. Thus, there is no limitation on terms used in this specification, and description can be made appropriately depending on the situation.

In this specification and the like, a transistor is an element having at least three terminals of a gate, a drain, and a source. The transistor has a channel region between a drain (a drain terminal, a drain region, or a drain electrode) and a source (a source terminal, a source region, or a source electrode), and current can flow through the drain, the channel region, and the source. Note that in this specification and the like, a channel region refers to a region through which current mainly flows.

The functions of a source and a drain might be interchanged with each other when transistors having different polarities are employed or the direction of current flow is changed in circuit operation, for example. Therefore, the terms "source" and "drain" can be interchanged with each other in this specification and the like.

In this specification and the like, the expression "electrically connected" includes the case where components are connected through an "object having any electric function". There is no particular limitation on the "object having any electric function" as long as electric signals can be transmitted and received between components that are connected through the object. Examples of an "object having any electric function" are a switching element such as a transistor, a resistor, an inductor, a capacitor, and an element with a variety of functions as well as an electrode and a wiring.

The terms "film" and "layer" can be interchanged with each other depending on the case or circumstances. For example, the term "conductive layer" can be changed into the term "conductive film" in some cases. Also, the term "insulating film" can be changed into the term "insulating layer" in some cases.

In this specification and the like, an oxide conductive film can also be referred to as an oxide semiconductor film having a high carrier density and a low resistance, an oxide semiconductor film having conductivity, an oxide semiconductor film having high conductivity, or the like.

In this specification, a pixel portion refers to a region including a scan line, a signal line, a transistor serving as a selection switch, a storage capacitor, a pixel electrode, and a counter electrode, i.e., a region for optical modulation of an RGB image.

The terms "pixel" and "pixel portion" can be interchanged with each other depending on the case or circumstances.

Note that in this specification, "pixel" and "cell" can be interchanged with each other depending on the circumstances or situation. Furthermore, "pixel portion" and "cell array" can be interchanged with each other depending on the circumstances or situation.

(Embodiment 1)

In this embodiment, examples of a semiconductor device including a transistor are described below with reference to FIG. 1 to FIG. 3.

FIG. 1(A) is a top view illustrating an example of a semiconductor device. A semiconductor device 700 illustrated in FIG. 1(A) includes a first substrate 701, a pixel portion 702, a source driver 704, a second substrate 705, a gate driver 706, an FPC terminal portion 708 (FPC: Flexible Printed Circuit), a wiring 710, a sealant 712, an FPC 716, a scan line 717, a wiring 718, a contact hole 719, and a signal line 720.

The pixel portion 702, the source driver 704, the gate driver 706, the FPC terminal portion 708, the wiring 710, the FPC 716, the scan line 717, and the signal line 720 are provided over the first substrate 701. The second substrate 705 is provided to face the first substrate 701. Note that although not illustrated in FIG. 1(A), a display element is provided between the first substrate 701 and the second substrate 705. Furthermore, the first substrate 701 and the second substrate 705 are sealed with the sealant 712. That is, the pixel portion 702, the source driver 704, and the gate driver 706 are enclosed by the first substrate 701, the sealant 712, and the second substrate 705.

The pixel portion 702 includes a plurality of pixels 703 arranged in a matrix of p rows and q columns (p and q are each an integer of 2 or more), and although not illustrated, transistors which serve as selection switches of the pixels 703 are provided over the scan line 717. In addition, the wiring 718 is provided to overlap with the scan line 717.

The FPC terminal portion 708 is electrically connected to the pixel portion 702, the source driver 704, and the gate driver 706. Furthermore, the FPC 716 is connected to the FPC terminal portion 708, and a variety of signals and the like are supplied from the FPC 716 to the pixel portion 702, the source driver 704, and the gate driver 706. Furthermore, a wiring 710 is connected to the pixel portion 702, the source driver 704, the gate driver 706, and the FPC terminal portion 708. Through the wiring 710, a variety of signals and the like are supplied from the FPC 716 to the pixel portion 702, the source driver 704, the gate driver 706, and the FPC terminal portion 708.

The scan line 717 and the signal line 720 are connected to the gate driver 706 and the source driver 704, respectively.

The scan line 717 and the wiring 718 are electrically connected to each other through the contact hole 719 which is provided in a region other than the pixel portion 702. Thus, a contact hole for electrically connecting the scan line 717 to the wiring 718 does not need to be provided in the pixel 703, and the aperture ratio of the pixel portion 702 can be improved.

Note that the contact hole 719 is provided in a region 722 between the pixel portion 702 and the wiring 710; however, one embodiment of the present invention is not limited thereto. For example, the contact hole 719 can be provided in a region 721 between the pixel portion 702 and the gate driver 706.

Figure 1B:
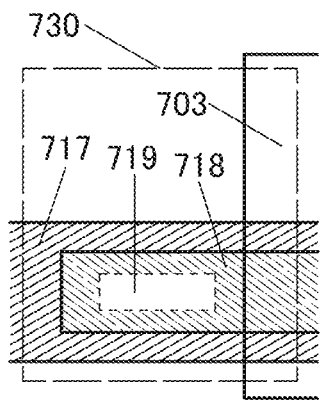
Figure 1C:
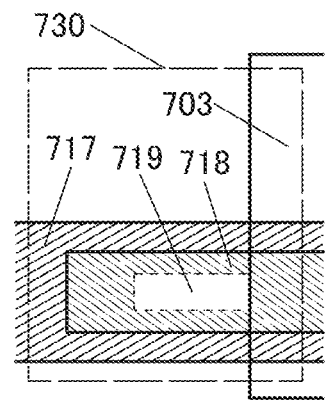

FIG. 1(B) is an enlarged view of a region 730 illustrated in FIG. 1(A). In addition, FIG. 1(C) is an enlarged view of the region 730 where the position of the contact hole 719 is different from that in FIGS. 1(A) and 1(B). Although the pixel 703 and the contact hole 719 are apart from each other in FIG. 1(B), the pixel 703 and the contact hole 719 may be in contact with each other as illustrated in FIG. 1(C).

The scan line 717 serves as a first gate electrode of a transistor serving as a selection switch which is provided in the pixel 703 and the wiring 718 serves as a second gate electrode. Although the details are described in Embodiment 2 later, when the second gate electrode is formed, the current drive capability of the transistor is improved and high on-state current characteristics can be obtained. Furthermore, since the on-state current can be increased, it is possible to reduce the size of the transistor.

The scan line 717 and the wiring 718 can each be formed using a metal element selected from chromium (Cr), copper (Cu), aluminum (Al), gold (Au), silver (Ag), zinc (Zn), molybdenum (Mo), tantalum (Ta), titanium (Ti), tungsten (W), manganese (Mn), nickel (Ni), iron (Fe), and cobalt (Co); an alloy including any of these metal elements as its component; an alloy in which any of these metal elements are combined; or the like.

Furthermore, the scan line 717 and the wiring 718 may each have a single-layer structure or a stacked-layer structure of two or more layers. For example, the scan line 717 and the wiring 718 can each have a single-layer structure of an aluminum film containing silicon, a two-layer structure in which a titanium film is stacked over an aluminum film, a two-layer structure in which a titanium film is stacked over a titanium nitride film, a two-layer structure in which a tungsten film is stacked over a titanium nitride film, a two-layer structure in which a tungsten film is stacked over a tantalum nitride film or a tungsten nitride film, a three-layer structure which includes a titanium film, an aluminum film stacked over the titanium film, and a titanium film formed over them, or the like. Alternatively, an alloy film or a nitride film in which aluminum and one or more elements selected from titanium, tantalum, tungsten, molybdenum, chromium, neodymium, and scandium are combined may be used.

Alternatively, a Cu—X alloy film (X is Mn, Ni, Cr, Fe, Co, Mo, Ta, or Ti) may be used. The use of the Cu—X alloy film can reduce the wiring resistance.

Alternatively, a light-transmitting conductive material such as indium tin oxide, indium tungsten oxide, indium zinc tungsten oxide, indium titanium oxide, indium tin titanium oxide, indium zinc oxide, or indium tin silicon oxide can also be used. In particular, a light-transmitting conductive material such as indium tungsten oxide, indium zinc tungsten oxide, indium titanium oxide, indium tin titanium oxide, indium tin oxide (ITO), indium zinc oxide, or indium tin silicon oxide (ITSO) can be used.

Furthermore, an oxide semiconductor film whose resistance is reduced may be used. As the oxide semiconductor film, zinc oxide or an In—Ga—Zn-based oxide semiconductor film can be used. Alternatively, a material which is the same as that of an oxide semiconductor film described in Embodiment 2 later can be used. As a method for reducing the resistance, for example, an insulating film containing a large amount of hydrogen may be formed in contact with the oxide semiconductor film. Even if the oxide semiconductor film, which can function as a transparent electrode, is used for the wiring 718, the aperture ratio does not decrease.

Note that the scan line 717 and the wiring 718 may be formed using the same material or may be formed using different materials. However, when the resistance of the scan line 717 is different from that of the wiring 718, signal delay occurs; thus, it is preferable that the widths and the like of the scan line 717 and the wiring 718 be adjusted so that the scan line 717 and the wiring 718 have the same resistance. In addition, the resistance of the wiring 718 may be lower than that of the scan line 717.

Figure 2A:
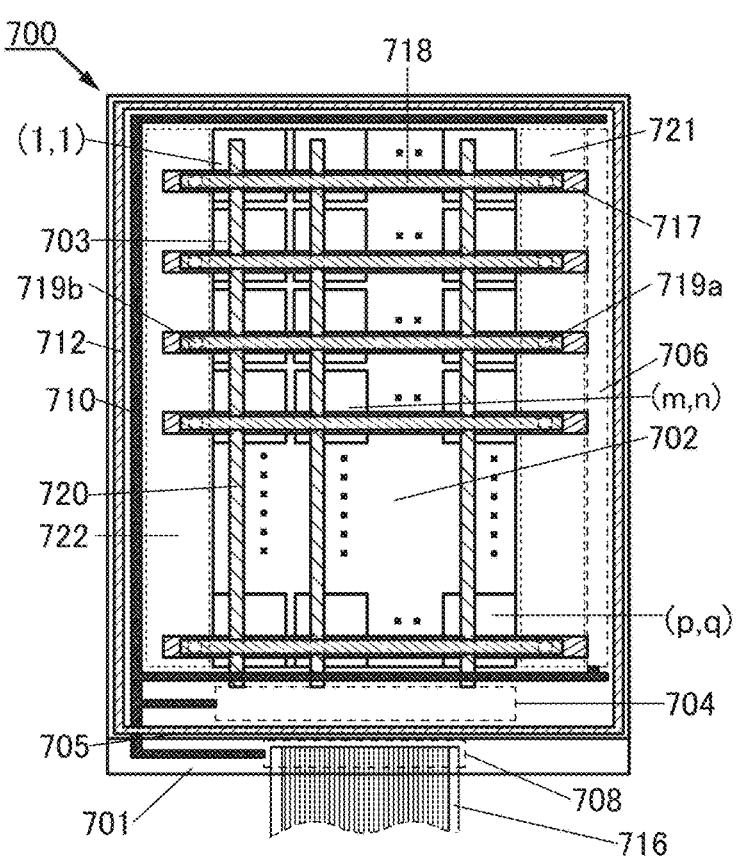
FIGS. 2A-2B Top views illustrating embodiments of a display device.

Furthermore, as illustrated in FIG. 2(A), a plurality of contact holes 719 for electrically connecting the scan line 717 to the wiring 718 are provided, whereby signal delay can be reduced. For example, a contact hole 719a and a contact hole 719b are provided, and the contact hole 719a and the contact hole 719b can be provided in the region 721 and the region 722, respectively.

Figure 2B:
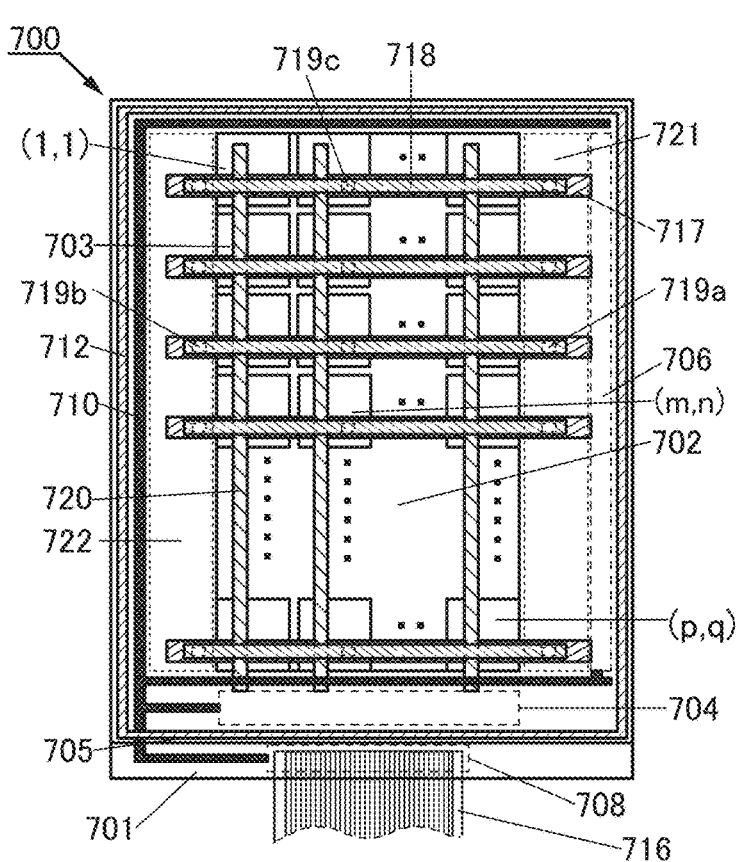

Moreover, in addition to the contact hole 719a and the contact hole 719b, another contact hole can be provided in the pixel portion 702. FIG. 2(B) is a top view of the semiconductor device 700 in which, in addition to the contact hole 719a and the contact hole 719b, a contact hole 719c is provided in the pixel 703[2, n] in the pixel portion 702. The contact hole 719c can be provided in any position in which the scan line 717 and the wiring 718 overlap with each other. Note that in this specification, for example, the pixel 703 in the m-th row (m is a natural number of p or less) and the n-th column (n is a natural number of q or less) is referred to as the pixel 703[m, n].

Alternatively, in addition to the contact hole 719a and the contact hole 719b, a contact hole can be provided for every plurality of pixels. For example, a contact hole can be provided in the pixel 703[m, n] in any m-th row. For example, a contact hole can be provided in the pixel 703[(an odd number, such as 1, 3, or 5), n] in each odd-numbered row or in the pixel 703[(an even number, such as 2, 4, or 6), n] in each even-numbered row. Furthermore, for example, a contact hole can be provided in the pixel 703[(a multiple of 3, such as 3, 6, or 9), n] in each (a multiple of 3)-th row. Furthermore, for example, a contact hole can be provided in the pixel 703 [(a multiple of 4, such as 4, 8, or 12), n] in each (a multiple of 4)-th row. Furthermore, for example, a contact hole can be provided in the pixel 703 [(a multiple of x, such as x, 2x, or 3x), n] in each (a multiple of x)-th row (x is a natural number of p or less), and a contact hole can be provided in the pixel 703 [(x+y, 2x+y, 3x+y, or the like), n] in each (a multiple of x+y)-th row (x is a natural number of p or less and y is a natural number of x or less).

Note that the above-described formation positions of the contact holes can be combined with each other. For example, a contact hole can be provided in the pixel 703 [(a multiple of 3 or a multiple of 4, such as 3, 4, 6, 8, 9, or 12), n] in each (a multiple of 3 or a multiple of 4)-th row.

Signal delay can be reduced as the distance between the contact holes is shorter. Thus, in addition to the contact hole 719a and the contact hole 719b, another contact hole is provided in the pixel portion 702, whereby signal delay of the scan line 717 and the wiring 718 can be reduced as compared with the case where no contact hole is provided in the pixel portion 702. The distance between the contact holes can be shortened as the number of contact holes is larger; thus, signal delay can be reduced. Note that the contact holes are preferably, but not necessarily, provided at regular intervals as much as possible.

In one embodiment of the present invention, not all the pixels 703 are provided with the contact holes for electrically connecting the scan line 717 to the wiring 718; thus, even when a contact hole is provided in the pixel portion 702, the aperture ratio of the pixel portion 702 can be improved as compared with the case where contact holes are provided in all of the pixels 703.

Figure 3:
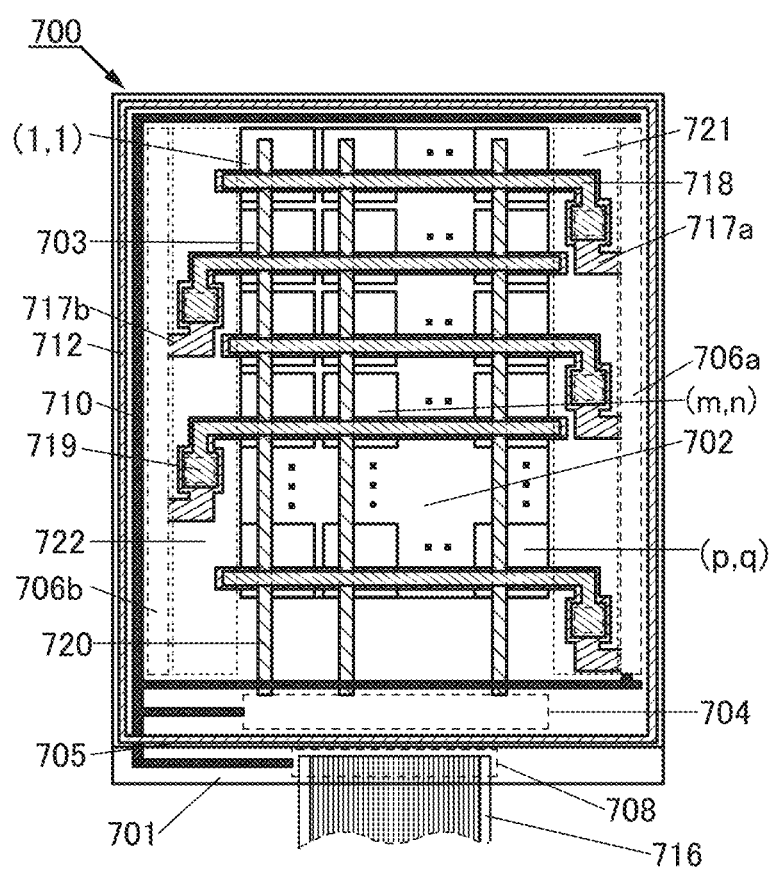
FIG. 3 A top view illustrating one embodiment of a display device.

Alternatively, as illustrated in FIG. 3, a plurality of gate drivers may be provided in the semiconductor device 700. For example, a gate driver 706a and a gate driver 706b are provided, and a scan line 717a connected to the pixel 703[(an odd number, such as 1, 3, or 5), n] in each odd-numbered row and a scan line 717b connected to the pixel 703[(an even number, such as 2, 4, or 6), n] in each even-numbered row are connected to the gate driver 706a and the gate driver 706b, respectively, whereby the area of the contact hole 719 can be enlarged. Note that the plurality of contact holes 719 may be provided as in the case of FIG. 2.

Note that in FIG. 3, the widths of the scan line 717 and the wiring 718 in portions around the contact hole 719 are larger than those in portions other than the portions around the contact hole 719. Alternatively, it is possible to increase only the width of the scan line 717 in a portion around the contact hole 719 and make the width of the wiring 718 in a portion around the contact hole 719 equal to the width of the wiring 718 in a portion other than the portion around the contact hole 719.

The structure of the semiconductor device 700 is not limited to the example shown here, in which the source driver 704 and the gate driver 706 as well as the pixel portion 702 are formed over the first substrate 701. For example, only the gate driver 706 may be formed over the first substrate 701. Alternatively, only the source driver 704 may be formed over the first substrate 701. In this case, a substrate where a source driver circuit, a gate driver circuit, or the like is formed (e.g., a driver-circuit substrate formed using a single-crystal semiconductor film or a polycrystalline semiconductor film) may be mounted on the first substrate 701. Note that there is no particular limitation on the method of connecting a separately prepared driver circuit substrate, and a COG (chip on glass) method, a wire bonding method, or the like can be used.

Furthermore, the pixel portion 702, the source driver 704, and the gate driver 706 included in the semiconductor device 700 include a plurality of transistors, and transistors that are semiconductor devices of embodiments of the present invention can be used.

The semiconductor device 700 can employ various modes or include various display elements. Examples of the display element include at least one of a liquid crystal element, an EL (electroluminescence) element (an EL element including an organic material and an inorganic material, an organic EL element, or an inorganic EL element) including an LED (e.g., a white LED, a red LED, a green LED, or a blue LED) and the like, a transistor (a transistor that emits light depending on current), an electron emitter, an electrophoretic element, a display element using MEMS (micro electro mechanical system) such as a grating light valve (GLV), a digital micromirror device (DMD), a DMS (digital micro shutter) element, a MIRASOL (registered trademark) display, an IMOD (interferometric modulator display) element, and a piezoelectric ceramic display, and an electrowetting element. In addition to the above, a display medium whose contrast, luminance, reflectivity, transmittance, or the like changes by electrical or magnetic action may be included. Alternatively, quantum dots may be used as the display element. Examples of display devices including liquid crystal elements include a liquid crystal display (e.g., a transmissive liquid crystal display, a transflective liquid crystal display, a reflective liquid crystal display, a direct-view liquid crystal display, or a projection liquid crystal display). Note that examples of display devices having EL elements include an EL display. Examples of a display device including an electron emitter include a field emission display (FED) and an SED-type flat panel display (SED: surface-conduction electron-emitter display). Examples of display devices including quantum dots include a quantum dot display. Examples of a display device having electronic ink or an electrophoretic element include electronic paper. In the case where a transflective liquid crystal display or a reflective liquid crystal display is fabricated, some or all of pixel electrodes function as reflective electrodes. For example, some or all of pixel electrodes contain aluminum, silver, or the like. In such a case, a memory circuit such as an SRAM can be provided under the reflective electrodes. Thus, power consumption can be further reduced.

Note that as a display method in the semiconductor device 700, a progressive method, an interlace method, or the like can be employed. Furthermore, color elements controlled in a pixel at the time of color display are not limited to three colors: RGB (R, G, and B correspond to red, green, and blue, respectively). For example, four pixels of the R pixel, the G pixel, the B pixel, and a W (white) pixel may be included. Alternatively, a color element may be composed of two colors among R, G, and B as in PenTile layout. The two colors may differ among color elements. Alternatively, one or more colors of yellow, cyan, magenta, and the like may be added to RGB. Furthermore, the size of a display region may be different depending on respective dots of the color elements. Embodiments of the disclosed invention are not limited to a display device for color display; the disclosed invention can also be used in a display device for monochrome display.

A coloring layer (also referred to as a color filter) may be used in order to obtain a full-color display device in which white light (W) (e.g., an organic EL element, an inorganic EL element, an LED, or a fluorescent lamp) is used for a backlight. As the coloring layer, red (R), green (G), blue (B), yellow (Y), or the like may be combined as appropriate, for example. With the use of the coloring layer, higher color reproducibility can be obtained than in the case without the coloring layer. In this case, by providing a region with the coloring layer and a region without the coloring layer, white light in the region without the coloring layer may be directly utilized for display. By partly providing the region without the coloring layer, a decrease in luminance due to the coloring layer can be suppressed, and 20% to 30% of power consumption can be reduced in some cases when an image is displayed brightly. Note that in the case where full-color display is performed using a self-luminous element such as an organic EL element or an inorganic EL element, elements may emit light of their respective colors R, G, B, Y, and white (W). By using a self-luminous element, power consumption can be further reduced as compared with the case of using the coloring layer in some cases.

The structure described in this embodiment can be used in appropriate combination with the structure described in any of the other embodiments.

(Embodiment 2)

In this embodiment, semiconductor devices that are embodiments of the present invention and methods of manufacturing the semiconductor devices are described with reference to FIG. 4 to FIG. 30.

<Structure Example of Semiconductor Device>

Figure 4A:
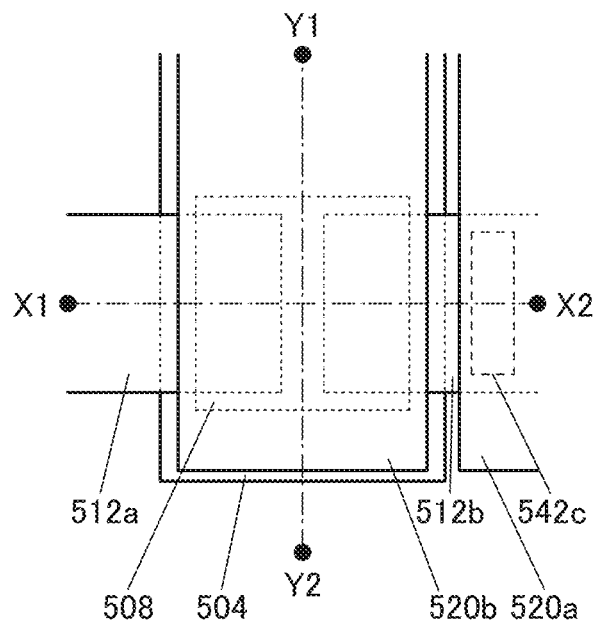
FIGS. 4A-4C A top view and cross-sectional views illustrating one embodiment of a semiconductor device.
Figure 4B:
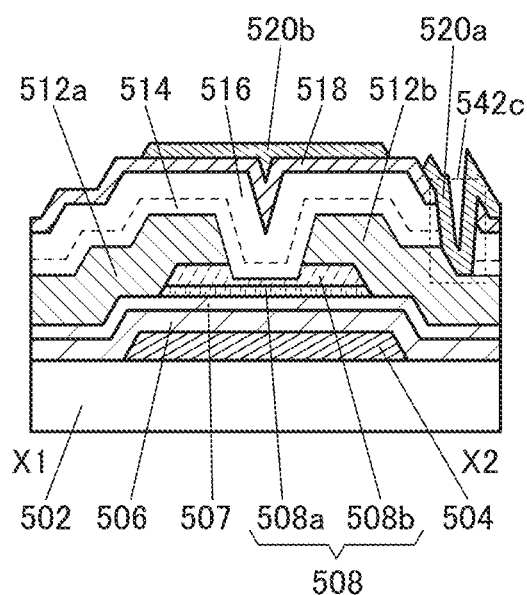
Figure 4C:
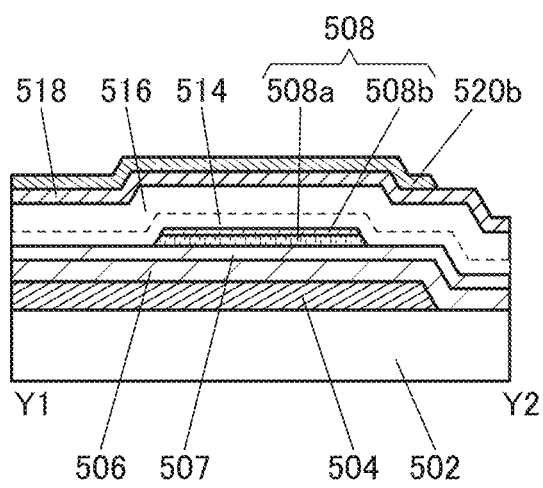

FIG. 4(A) is a top view of a transistor 500 that is a semiconductor device of one embodiment of the present invention, and FIG. 4(B) is a cross-sectional view taken along the dashed-dotted line X1-X2 in FIG. 4(A) and FIG. 4(C) is a cross-sectional view taken along the dashed-dotted line Y1-Y2.

Note that in FIG. 4(A), some components of the transistor 500 (e.g., an insulating film functioning as a gate insulating film) are not illustrated to avoid complexity. The direction of the dashed-dotted line X1-X2 may be called a channel length direction, and the direction of the dashed-dotted line Y1-Y2 may be called a channel width direction. As in FIG. 4(A), some components in top views of transistors might not be illustrated in the following drawings.

The transistor 500 includes a substrate 502, a conductive film 504, an insulating film 506, an insulating film 507, an oxide semiconductor film 508, a conductive film 512a, a conductive film 512b, an insulating film 514, an insulating film 516, an insulating film 518, a conductive film 520a, and a conductive film 520b. In addition, the oxide semiconductor film 508 includes an oxide semiconductor film 508a on the conductive film 504 side and an oxide semiconductor film 508b over the oxide semiconductor film 508a.

The conductive film 504 is provided over the substrate 502. The insulating film 506 is provided over the substrate 502 and the conductive film 504. The insulating film 507 is provided over the insulating film 506. The oxide semiconductor film 508 is provided over the insulating film 507. The conductive film 512a is provided over the insulating film 507 and the oxide semiconductor film 508. The conductive film 512b is provided over the insulating film 507 and the oxide semiconductor film 508. The insulating film 514 is provided over the oxide semiconductor film 508, the conductive film 512a, and the conductive film 512b. The insulating film 516 is provided over the insulating film 514. The insulating film 518 is provided over the insulating film 516. The conductive film 520b is provided over the insulating film 518. Furthermore, the conductive film 520a is provided over the conductive film 512b and the insulating film 518 through a contact hole 542c which is provided in the insulating film 514, the insulating film 516, and the insulating film 518 and reaches the conductive film 512b.

The oxide semiconductor film 508 is electrically connected to the conductive film 512a and the conductive film 512b. Furthermore, the conductive film 520a is electrically connected to the conductive film 512b.

The conductive film 504 and the conductive film 520b serve as a first gate electrode and a second gate electrode (also referred to as a back gate electrode), respectively. Furthermore, the conductive film 512a serves as one of a source electrode and a drain electrode, and the conductive film 512b serves as the other of the source electrode and the drain electrode. Furthermore, the conductive film 520a functions as, for example, a pixel electrode used in a display device.

In addition, as described in Embodiment 1, the conductive film 504 is a part of the scan line 717 in FIG. 1 to FIG. 3, and the conductive film 520b is a part of the wiring 718 in FIG. 1 to FIG. 3.

Figure 5A:
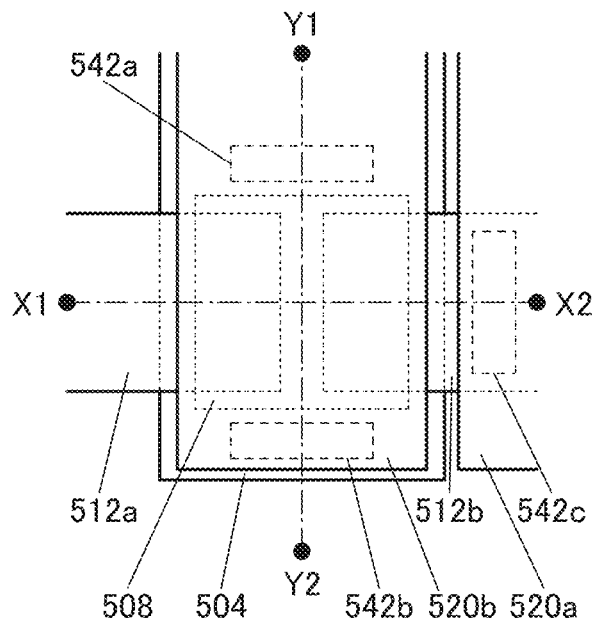
FIGS. 5A-5C A top view and cross-sectional views illustrating one embodiment of a semiconductor device.
Figures 5B, 5C:
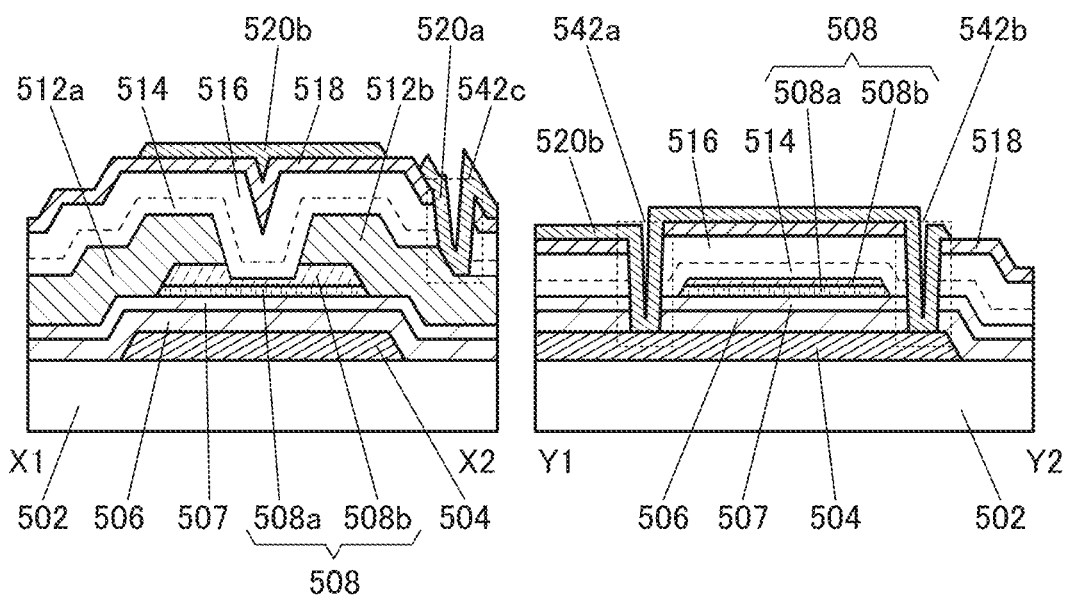

Here, as a comparative example, FIG. 5 shows a transistor 570 in which the first gate electrode and the second gate electrode are electrically connected to each other through a contact hole opened in each pixel.

In the case of the transistor 500, the conductive film 504 and the conductive film 520b are electrically connected to each other in a region other than the pixel portion, whereby the conductive film 504 and the conductive film 520b have the same potential. In contrast, in the case of the transistor 570, the conductive film 504 and the conductive film 520b are electrically connected to each other through the contact hole 542a and the contact hole 542b, whereby the conductive film 504 and the conductive film 520b have the same potential. Since only the transistor 500 does not have the contact hole 542a or the contact hole 542b, the aperture ratio of the transistor 500 is higher than the aperture ratio of the transistor 570.

Note that the oxide semiconductor film 508 included in the transistor 500 and the transistor 570 is positioned to face each of the conductive film 504 and the conductive film 520b and is sandwiched between the conductive films serving as the two gate electrodes. The length of the conductive film 520b in the channel length direction and the length in the channel width direction are longer than the length of the oxide semiconductor film 508 in the channel length direction and the length in the channel width direction, respectively. The whole oxide semiconductor film 508 is covered with the conductive film 520b with the insulating film 514, the insulating film 516, and the insulating film 518 positioned therebetween.

With such a structure, the oxide semiconductor film 508 included in the transistor 500 and the transistor 570 can be electrically surrounded by electric fields of the conductive film 504 and the conductive film 520b. A device structure of a transistor in which electric fields of a first gate electrode and a second gate electrode electrically surround an oxide semiconductor film where a channel region is formed as in the transistor 500 and the transistor 570 can be referred to as a surrounded channel (s-channel) structure.

Since the transistor 500 and the transistor 570 each have an s-channel structure, the conductive film 504 can effectively apply an electric field for inducing a channel to the oxide semiconductor film 508. Thus, as described in Embodiment 1, the current drive capability of each of the transistor 500 and the transistor 570 can be improved and high on-state current characteristics can be obtained as compared with the case where the conductive film 520b is not provided. Since the on-state current can be increased, the sizes of the transistor 500 and the transistor 570 can be reduced.

Figure 6A:
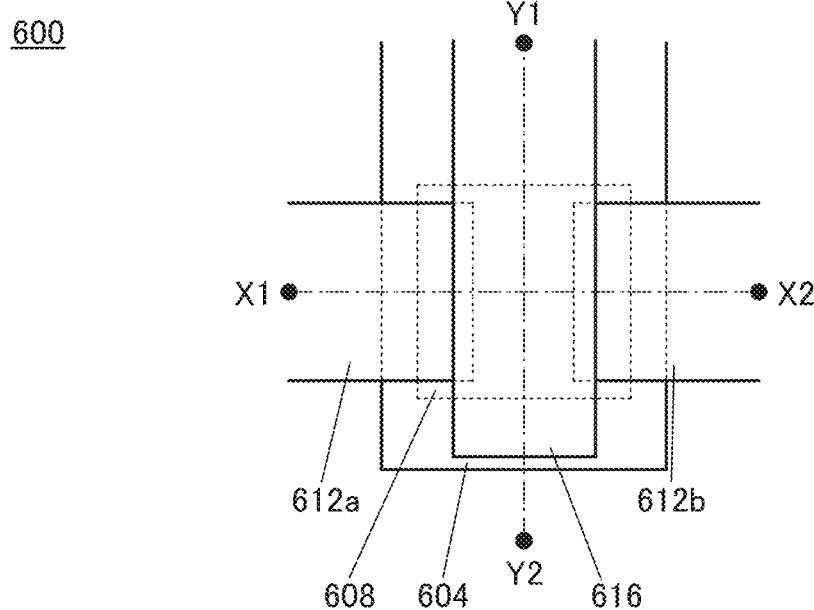
FIGS. 6A-6C A top view and cross-sectional views illustrating one embodiment of a semiconductor device.
Figure 6B:
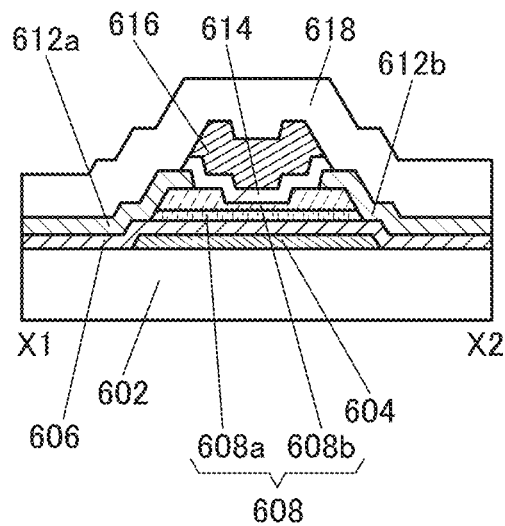
Figure 6C:
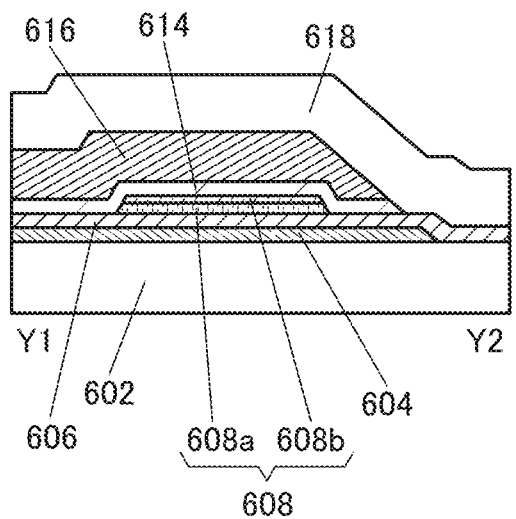

FIG. 6 illustrates a transistor 600 which is a modification example of this embodiment. The transistor 600 includes a substrate 602, a conductive film 604, an insulating film 606, an oxide semiconductor film 608, a conductive film 612a, a conductive film 612b, an insulating film 614, a conductive film 616, and an insulating film 618. In addition, the oxide semiconductor film 608 includes an oxide semiconductor film 608a on the conductive film 604 side and an oxide semiconductor film 608b over the oxide semiconductor film 608a.

The conductive film 604 is provided over the substrate 602, the insulating film 606 is provided over the substrate 602 and the conductive film 604, the oxide semiconductor film 608 is provided over the insulating film 606, the conductive film 612a is provided over the insulating film 606 and the oxide semiconductor film 608, the conductive film 612b is provided over the insulating film 606 and the oxide semiconductor film 608, the insulating film 614 is provided over the oxide semiconductor film 608, the conductive film 612a, and the conductive film 612b, the conductive film 616 is provided over the insulating film 614, and the insulating film 618 is provided over the insulating film 606, the conductive film 612a, and the conductive film 612b. In addition, the oxide semiconductor film 608 is electrically connected to the conductive film 612a and the conductive film 612b. The conductive film 612a serves as one of a source electrode and a drain electrode, and the conductive film 612b serves as the other of the source electrode and the drain electrode.

The transistor 600 has a top-gate structure in which the conductive film 604 serving as a second gate electrode (also referred to as a back gate electrode) is formed under the conductive film 616 serving as a first gate electrode.

The oxide semiconductor film 608 is positioned to face each of the conductive film 616 and the conductive film 604 and is sandwiched between the conductive film 616 and the conductive film 604. That is, the transistor 600 has the s-channel structure described above. Thus, high on-state current characteristics can be obtained.

Furthermore, the conductive film 616 is a part of the scan line 717 in FIG. 1 to FIG. 3, and the conductive film 604 is a part of the wiring 718 in FIG. 1 to FIG. 3. That is, the wiring 718 is formed under the scan line 717.

The transistor 600 may have a structure illustrated in FIG. 7. The structure is a self-aligned structure which does not include a region where the conductive film 616 does not overlap with the conductive film 612a or the conductive film 612b. A transistor having a self-aligned structure has extremely low parasitic capacitance between a conductive film serving as a source electrode or a drain electrode and a conductive film serving as a first gate electrode, which is suitable for applications that require high-speed operation.

Figure 8A:
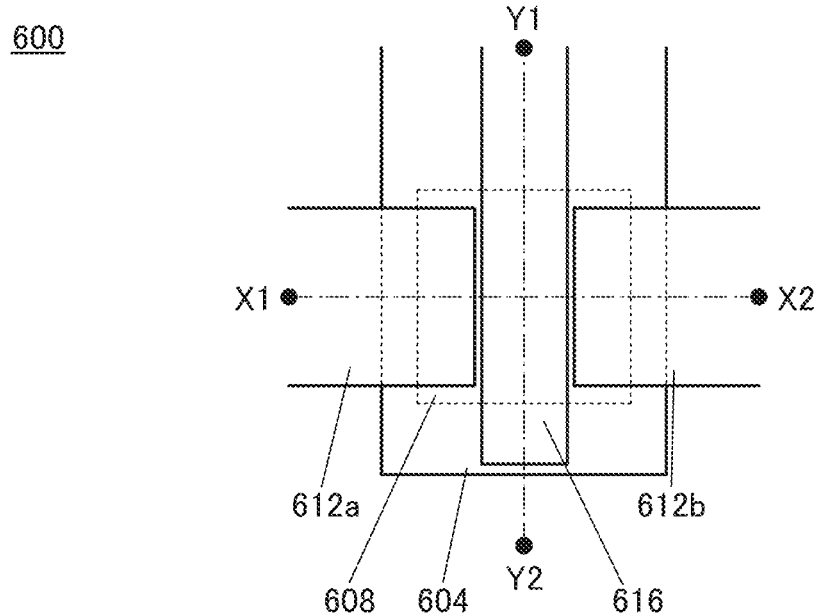
FIGS. 8A-8C A top view and cross-sectional views illustrating one embodiment of a semiconductor device.

Alternatively, the transistor 600 may have a structure illustrated in FIG. 8. In the structure, the insulating film 614 and the conductive film 616 are provided in a contact hole which is provided in the insulating film 618 and reaches the oxide semiconductor film 608b and the insulating film 606.

Figure 8B:
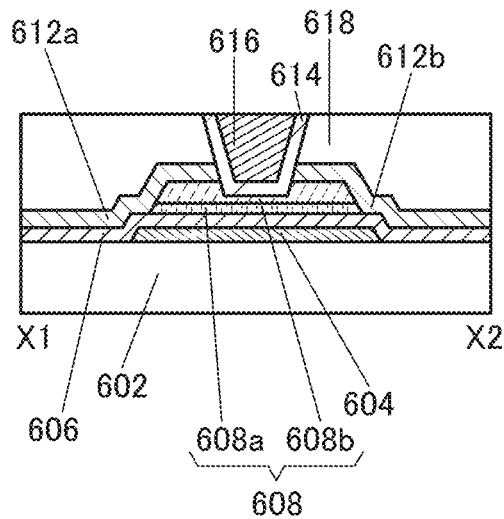
Figure 8C:
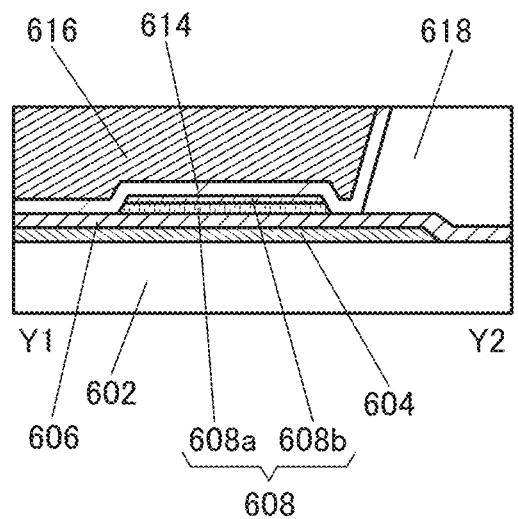

A region where the conductive film serving as a source electrode or a drain electrode overlaps with the conductive film serving as a first gate electrode is smaller in the structure of the transistor 600 illustrated in FIG. 8 than in the structures of the other transistors described above, and thus the parasitic capacitance in the structure of the transistor 600 can be reduced. Thus, the transistor is suitable for a component of a circuit that needs high-speed operation. As illustrated in FIGS. 8(B) and 8(C), the top surface of the transistor is preferably planarized by a CMP (chemical mechanical polishing) method or the like; however, a structure in which the top surface is not planarized can be used.

Components included in the transistor 500 will be described below in detail. Note that for the conductive film 504 and the conductive film 520b, respective materials similar to those for the scan line 717 and the wiring 718, which are described in Embodiment 1, can be used.

<Substrate>

As the substrate 502, a substrate which has heat resistance high enough to withstand at least later heat treatment, such as a glass substrate, a ceramic substrate, a quartz substrate, or a sapphire substrate, is preferably used. Alternatively, a single crystal semiconductor substrate or a polycrystalline semiconductor substrate made of silicon, silicon carbide, or the like, a compound semiconductor substrate made of silicon germanium or the like, an SOI substrate, or the like can be used as the substrate 502. Further alternatively, any of these substrates provided with a semiconductor element may be used as the substrate 502. In the case where a glass substrate is used as the substrate 502, a large-area substrate of the 6th generation, the 7th generation, the 8th generation, the 9th generation, and the 10th generation is used, whereby a large-sized display device can be fabricated. Such a large-area substrate, which enables manufacturing cost reduction, is preferably used. A flexible substrate may also be used as the substrate 502.

<Insulating Film Functioning as First Gate Insulating Film>

As each of the insulating film 506 and the insulating film 507 functioning as first gate insulating films of the transistor 500, an insulating film including at least one of a silicon oxide film, a silicon oxynitride film, a silicon nitride oxide film, a silicon nitride film, an aluminum oxide film, a hafnium oxide film, an yttrium oxide film, a zirconium oxide film, a gallium oxide film, a tantalum oxide film, a magnesium oxide film, a lanthanum oxide film, a cerium oxide film, and a neodymium oxide film by a plasma enhanced chemical vapor deposition (PECVD) method, a sputtering method, or the like. Note that instead of a stacked-layer structure of the insulating film 506 and the insulating film 507, an insulating film of a single layer formed using a material selected from the above or an insulating film of three or more layers may be used.

The insulating film 506 has a function as a blocking film which inhibits penetration of oxygen. For example, in the case where excess oxygen is supplied to the insulating film 507, the insulating film 514, the insulating film 516, and/or the oxide semiconductor film 508, the insulating film 506 can inhibit penetration of oxygen.

Note that the insulating film 507 that is in contact with the oxide semiconductor film 508 functioning as a channel region of the transistor 500 is preferably an oxide insulating film and preferably includes a region including oxygen in excess of the stoichiometric composition (oxygen-excess region). In other words, the insulating film 507 is an insulating film capable of releasing oxygen.

In the case where hafnium oxide is used for the insulating film 507, the following effect is attained. Hafnium oxide has a higher dielectric constant than silicon oxide and silicon oxynitride. Therefore, by using hafnium oxide, the thickness of the insulating film 507 can be made large as compared with the case where silicon oxide is used; thus, leakage current due to tunnel current can be low. That is, it is possible to provide a transistor with a low off-state current. Moreover, hafnium oxide with a crystalline structure has higher dielectric constant than hafnium oxide with an amorphous structure. Therefore, it is preferable to use hafnium oxide with a crystalline structure in order to provide a transistor with a low off-state current. Examples of the crystalline structure include a monoclinic crystal structure and a cubic crystal structure. Note that one embodiment of the present invention is not limited thereto.

In this embodiment, a silicon nitride film is formed as the insulating film 506, and a silicon oxide film is formed as the insulating film 507. The silicon nitride film has a higher dielectric constant than a silicon oxide film and needs a larger thickness for capacitance equivalent to that of the silicon oxide film. Thus, when the silicon nitride film is included in the gate insulating film of the transistor 500, the physical thickness of the insulating film can be increased. This makes it possible to reduce a decrease in withstand voltage of the transistor 500 and furthermore to increase the withstand voltage, thereby reducing electrostatic discharge damage to the transistor 500.

<Oxide Semiconductor Film>

The oxide semiconductor film 508 can be formed using the materials described above. In the case where the oxide semiconductor film 508 includes In-M-Zn oxide, it is preferable that the atomic ratio of metal elements of a sputtering target used for forming the In-M-Zn oxide satisfy In≥M (the number of In atoms is greater than or equal to the number of M atoms) and Zn≥M (the number of Zn atoms is greater than or equal to the number of M atoms). As the atomic ratio of metal elements of such a sputtering target, In:M:Zn=1:1:1, In:M:Zn=1:1:1.2, In:M:Zn=2:1:3, In:M:Zn=3:1:2, and In:M:Zn=4:2:4.1 are preferable. In the case where the oxide semiconductor film 508 is formed of In-M-Zn oxide, it is preferable to use a target including polycrystalline In-M-Zn oxide as the sputtering target. The use of the target including polycrystalline In-M-Zn oxide facilitates formation of the oxide semiconductor film 508 having crystallinity. Note that the atomic ratios of metal elements in the formed oxide semiconductor film 508 vary from the above atomic ratio of metal elements of the sputtering target within a range of ±40% as an error. For example, when a sputtering target with an atomic ratio of In to Ga and Zn of 4:2:4.1 is used, the atomic ratio of In to Ga and Zn in the oxide semiconductor film 508 may be approximately 4:2:3.

The oxide semiconductor film 508a can be formed using the sputtering target having an atomic ratio of In:M:Zn=2:1:3, In:M:Zn=3:1:2, In:M:Zn=4:2:4.1, or the like. It is preferable that the oxide semiconductor film 508a have an atomic ratio of In:M:Zn=4:α1 (1.5≤α1≤2.5) (α1 is 1.5 or more and 2.5 or less):α2 (2.5≤α2≤3.5) (α2 is 2.5 or more and 3.5 or less).

The oxide semiconductor film 508b can be formed using the sputtering target having an atomic ratio of In:M:Zn=1:1:1, In:M:Zn=1:1:1.2, or the like. It is preferable that the oxide semiconductor film 508b have an atomic ratio of In:M:Zn=1:β1 (0.8≤β1≤1.2) (β1 is 0.8 or more and 1.2 or less):β2 (0.8≤β2≤1.2) (β2 is 0.8 or more and 1.2 or less). Note that the atomic ratio of metal elements in a sputtering target used for forming the second oxide semiconductor film 508b does not necessarily satisfy In≥M (the number of In atoms is greater than or equal to the number of M atoms) and Zn≥M (the number of Zn atoms is greater than or equal to the number of M atoms), and may satisfy In<M and/or Zn<M. Specifically, In:M:Zn=1:3:2, In:M:Zn=1:3:4, In:M:Zn=1:3:6, and the like are given.

The energy gap of the oxide semiconductor film 508 is 2 eV or more, preferably 2.5 eV or more, further preferably 3 eV or more. The use of an oxide semiconductor having a wide energy gap can reduce the off-state current of the transistor 500. In particular, an oxide semiconductor film having an energy gap more than or equal to 2.0 eV, preferably more than or equal to 2.0 eV and less than or equal to 3.0 eV is preferably used as the oxide semiconductor film 508a, and an oxide semiconductor film having an energy gap more than or equal to 2.5 eV and less than or equal to 3.5 eV is preferably used as the oxide semiconductor film 508b. Furthermore, the oxide semiconductor film 508b preferably has a higher energy gap than the oxide semiconductor film 508a.

Each thickness of the oxide semiconductor film 508a and the oxide semiconductor film 508b is more than or equal to 3 nm and less than or equal to 200 nm, preferably more than or equal to 3 nm and less than or equal to 100 nm, further preferably more than or equal to 3 nm and less than or equal to 50 nm.

Furthermore, an oxide semiconductor film with a low carrier density is used as the oxide semiconductor film 508a. For example, the carrier density of the oxide semiconductor film 508a is lower than $8\times10^{11}/cm^3$, preferably lower than $1\times10^{11}/cm^3$, or further preferably lower than $1\times10^{10}/cm^3$, and greater than or equal to $1\times10^{-9}/cm^3$. Furthermore, an oxide semiconductor film with a low carrier density is used as the oxide semiconductor film 508b. For example, the carrier density of the oxide semiconductor film 508b is lower than or equal to $1\times10^{17}/cm^3$, preferably lower than or equal to $1\times10^{15}/cm^3$, further preferably lower than or equal to $1\times10^{13}/cm^3$, still further preferably lower than or equal to $1\times10^{11}/cm^3$.

Note that, without limitation to the compositions and materials described above, a material with an appropriate combination may be used depending on required semiconductor characteristics and electrical characteristics (e.g., field-effect mobility and threshold voltage) of a transistor. Furthermore, in order to obtain required semiconductor characteristics of a transistor, it is preferable that the carrier density, the impurity concentration, the defect density, the atomic ratio of a metal element to oxygen, the interatomic distance, the density, and the like of the oxide semiconductor film 508a and the oxide semiconductor film 508b be set to be appropriate.

Note that it is preferable to use, as the oxide semiconductor film 508a and the oxide semiconductor film 508b, an oxide semiconductor film in which the impurity concentration is low and the density of defect states is low, in which case the transistor can have more excellent electrical characteristics. Here, the state in which the impurity concentration is low and the density of defect states is low (the amount of oxygen vacancy is small) is referred to as "highly purified intrinsic" or "substantially highly purified intrinsic". A highly purified intrinsic or substantially highly purified intrinsic oxide semiconductor film has few carrier generation sources, and thus can have a low carrier density. Thus, a transistor in which a channel region is formed in the oxide semiconductor film rarely has a negative threshold voltage (is rarely normally on). A highly purified intrinsic or substantially highly purified intrinsic oxide semiconductor film has a low density of defect states and thus has a low density of trap states in some cases. Furthermore, the highly purified intrinsic or substantially highly purified intrinsic oxide semiconductor film has an extremely low off-state current; even when an element has a channel width W of $1\times10^6$ μm and a channel length L of 10 μm, the off-state current can be less than or equal to the measurement limit of a semiconductor parameter analyzer, that is, less than or equal to $1\times10^{-13}$ A, at a voltage (drain voltage) between a source electrode and a drain electrode of from 1 V to 10 V.

Accordingly, the transistor in which the channel region is formed in the highly purified intrinsic or substantially highly purified intrinsic oxide semiconductor film can have a small change in electrical characteristics and high reliability. Charges trapped by the trap states in the oxide semiconductor film take a long time to be released and may behave like fixed charges. Thus, the transistor whose channel region is formed in the oxide semiconductor film having a high density of trap states has unstable electrical characteristics in some cases. As examples of the impurities, hydrogen, nitrogen, alkali metal, alkaline earth metal, and the like are given.

Hydrogen included in the oxide semiconductor film reacts with oxygen bonded to a metal atom to be water, and also causes oxygen vacancy in a lattice from which oxygen is released (or a portion from which oxygen is released). Due to entry of hydrogen into the oxygen vacancy, an electron serving as a carrier is generated in some cases. Furthermore, in some cases, bonding of part of hydrogen to oxygen bonded to a metal atom causes generation of an electron serving as a carrier. Thus, a transistor including an oxide semiconductor film which contains hydrogen is likely to be normally on. Accordingly, it is preferable that hydrogen be reduced as much as possible in the oxide semiconductor film 508. Specifically, in the oxide semiconductor film 508, the concentration of hydrogen which is measured by SIMS is lower than or equal to $2\times10^{20}$ atoms/cm$^3$, preferably lower than or equal to $5\times10^{19}$ atoms/cm$^3$, further preferably lower than or equal to $1\times10^{19}$ atoms/cm$^3$, further preferably lower than or equal to $5\times10^{18}$ atoms/cm$^3$, further preferably lower than or equal to $1\times10^{18}$ atoms/cm$^3$, further preferably lower than or equal to $5\times10^{17}$ atoms/cm$^3$, and further preferably lower than or equal to $1\times10^{16}$ atoms/cm$^3$.

The oxide semiconductor film 508a preferably includes a region in which hydrogen concentration is smaller than that in the oxide semiconductor film 508b. A semiconductor device including the oxide semiconductor film 508a having the region in which hydrogen concentration is smaller than that in the oxide semiconductor film 508b can be increased in reliability.

When silicon or carbon that is one of elements belonging to Group 14 is included in the oxide semiconductor film 508a, oxygen vacancy is increased in the oxide semiconductor film 508a, and the oxide semiconductor film 508a becomes an n-type film. Thus, the concentration of silicon or carbon (the concentration is measured by SIMS) in the oxide semiconductor film 508a or the concentration of silicon or carbon (the concentration is measured by SIMS) in the vicinity of an interface with the oxide semiconductor film 508a is set to be lower than or equal to $2\times10^{18}$ atoms/cm$^3$, preferably lower than or equal to $2\times10^{17}$ atoms/cm$^3$.

In addition, the concentration of alkali metal or alkaline earth metal of the oxide semiconductor film 508a, which is measured by SIMS, is lower than or equal to $1\times10^{18}$ atoms/cm$^3$, preferably lower than or equal to $2\times10^{16}$ atoms/cm$^3$. Alkali metal and alkaline earth metal might generate carriers when bonded to an oxide semiconductor, in which case the off-state current of the transistor might be increased. Therefore, it is preferable to reduce the concentration of alkali metal or alkaline earth metal of the oxide semiconductor film 508a.

Furthermore, when including nitrogen, the oxide semiconductor film 508a easily becomes n-type by generation of electrons serving as carriers and an increase of carrier density. Thus, a transistor including an oxide semiconductor film which contains nitrogen is likely to have normally-on characteristics. For this reason, nitrogen in the oxide semiconductor film is preferably reduced as much as possible. The concentration of nitrogen which is measured by SIMS is preferably set to be, for example, lower than or equal to $5\times10^{18}$ atoms/cm$^3$.

The oxide semiconductor film 508a and the oxide semiconductor film 508b may have a non-single-crystal structure, for example. The non-single crystal structure includes a CAAC-OS (c-axis aligned crystalline oxide semiconductor) which is described later, a polycrystalline structure, a microcrystalline structure, or an amorphous structure, for example. Among the non-single crystal structure, the amorphous structure has the highest density of defect states, whereas CAAC-OS has the lowest density of defect states.

Here, a band diagram including the oxide semiconductor film 508 and insulating films in contact with the oxide semiconductor film 508 is described with reference to FIG. 9.

Figure 9:
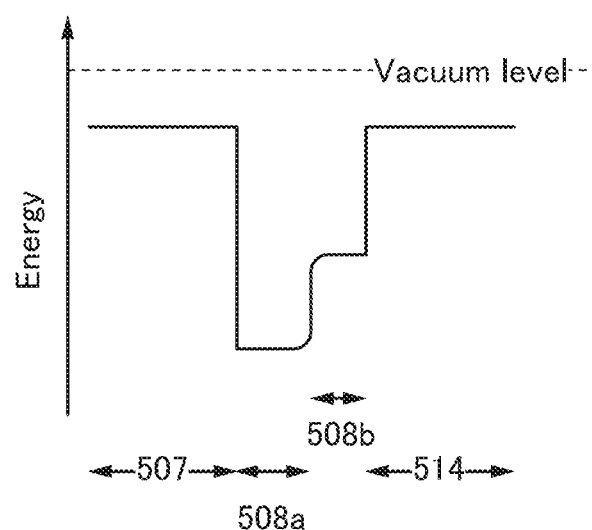
FIG. 9 A view illustrating a band structure.

FIG. 9 shows an example of a band structure in the thickness direction of a stack including the insulating film 507, the oxide semiconductor film 508a, the oxide semiconductor film 508b, and the insulating film 514. For easy understanding, energy level of the conduction band minimum ($E_c$) of each of the insulating film 507, the oxide semiconductor film 508a, the oxide semiconductor film 508b, and the insulating film 514 is shown in the band structure.

In the band diagram of FIG. 9, a silicon oxide film is used as each of the insulating film 507 and the insulating film 514, an oxide semiconductor film formed using a metal oxide target having an atomic ratio of metal elements of In:Ga:Zn=4:2:4.1 is used as the oxide semiconductor film 508a, and a metal oxide film formed using a metal oxide target having an atomic ratio of metal elements of In:Ga:Zn=1:1:1.2 is used as the oxide semiconductor film 508b.

As illustrated in FIG. 9, the energy level of the conduction band minimum gradually varies between the oxide semiconductor film 508a and the oxide semiconductor film 508b. In other words, the energy level of the conduction band minimum is continuously varied or continuously connected. To obtain such a band structure, there exists no impurity, which forms a defect state such as a trap center or a recombination center, at the interface between the oxide semiconductor film 508a and the oxide semiconductor film 508b.

To form a continuous junction between the oxide semiconductor film 508a and the oxide semiconductor film 508b, the films are formed successively without exposure to the air by using a multi-chamber deposition apparatus (sputtering apparatus) provided with a load lock chamber.

With the structure in FIG. 9, the oxide semiconductor film 508a serves as a well, and a channel region is formed in the oxide semiconductor film 508a in the transistor with the layered structure.

In the case where the oxide semiconductor film 508b is not provided, trap states might be formed in the oxide semiconductor film 508a. However, in the above layered structure, the trap states can be formed in the oxide semiconductor film 508b. Thus, the trap states can be distanced away from the oxide semiconductor film 508a.

In addition, the trap states might be more distant from the vacuum level than the energy level of the conduction band minimum ($E_c$) of the oxide semiconductor film 508a functioning as a channel region, so that electrons are likely to be accumulated in the trap states. When the electrons are accumulated in the trap states, the electrons become negative fixed electric charge, so that the threshold voltage of the transistor is shifted in the positive direction. Therefore, it is preferable that the energy level of the trap states be closer to the vacuum level than the energy level of the conduction band minimum ($E_c$) of the oxide semiconductor film 508a. Such a structure inhibits accumulation of electrons in the trap states. As a result, the on-state current and the field-effect mobility of the transistor can be increased.

In FIG. 9, the energy level of the conduction band minimum of the oxide semiconductor film 508b is closer to the vacuum level than that of the oxide semiconductor film 508a. Typically, a difference in energy level between the conduction band minimum of the oxide semiconductor film 508a and the conduction band minimum of the oxide semiconductor film 508b is 0.15 eV or more or 0.5 eV or more and 2 eV or less or 1 eV or less. That is, the difference between the electron affinity of the oxide semiconductor film 508b and the electron affinity of the oxide semiconductor film 508a is 0.15 eV or more or 0.5 eV or more and 2 eV or less or 1 eV or less.

In such a structure, the oxide semiconductor film 508a serves as a main path of current and functions as a channel region. In addition, since the oxide semiconductor film 508b includes one or more metal elements included in the oxide semiconductor film 508a in which a channel region is formed, interface scattering is less likely to occur at the interface between the oxide semiconductor film 508a and the oxide semiconductor film 508b. Thus, the transistor can have high field-effect mobility because the movement of carriers is not hindered at the interface.

To prevent the oxide semiconductor film 508b from functioning as part of a channel region, a material having sufficiently low conductivity is used for the oxide semiconductor film 508b. Alternatively, a material which has a smaller electron affinity (a difference in energy level between the vacuum level and the conduction band minimum) than the oxide semiconductor film 508a and has a difference in energy level in the conduction band minimum from the oxide semiconductor film 508a (band offset) is used for the oxide semiconductor film 508b. Furthermore, to inhibit generation of a difference between threshold voltages due to the value of the drain voltage, it is preferable to form the oxide semiconductor film 508b using a material whose energy level of the conduction band minimum is closer to the vacuum level than that of the oxide semiconductor film 508a by 0.2 eV or more, preferably 0.5 eV or more.

It is preferable that the oxide semiconductor film 508b not have a spinel crystal structure. This is because if the oxide semiconductor film 508b has a spinel crystal structure, constituent elements of the conductive film 512a and the conductive film 512b might be diffused into the oxide semiconductor film 508a at the interface between the spinel crystal structure and another region. Note that the oxide semiconductor film 508b is preferably a CAAC-OS, which is described later, in which case a higher blocking property against constituent elements of the conductive film 512a and the conductive film 512b, for example, copper, is obtained.

The thickness of the oxide semiconductor film 508b is large enough to inhibit diffusion of the constituent elements of the conductive film 512a and the conductive film 512b into the oxide semiconductor film 508b and small enough not to inhibit supply of oxygen from the insulating film 514 to the oxide semiconductor film 508b. For example, when the thickness of the oxide semiconductor film 508b is greater than or equal to 10 nm, diffusion of the constituent elements of the conductive film 512a and the conductive film 512b into the oxide semiconductor film 508a can be inhibited. When the thickness of the oxide semiconductor film 508b is less than or equal to 100 nm, oxygen can be effectively supplied from the insulating film 514 and the insulating film 516 to the oxide semiconductor film 508a.

<Structure of Oxide Semiconductor>

The structure of an oxide semiconductor will be described below.

In this specification, the term "parallel" indicates that the angle formed between two straight lines ranges from −10° to 10°, and accordingly also includes the case where the angle ranges from −5° to 5°. The term "substantially parallel" indicates that the angle formed between two straight lines ranges from −30° to 30°. The term "perpendicular" indicates that the angle formed between two straight lines ranges from 80° to 100°, and accordingly also includes the case where the angle ranges from 85° to 95°. The term "substantially perpendicular" indicates that the angle formed between two straight lines ranges from 60° to 120°.

In this specification, trigonal and rhombohedral crystal systems are included in a hexagonal crystal system.

An oxide semiconductor is classified into a single crystal oxide semiconductor and a non-single-crystal oxide semiconductor. Examples of a non-single-crystal oxide semiconductor include a CAAC-OS (c-axis-aligned crystalline oxide semiconductor), a polycrystalline oxide semiconductor, an nc-OS (nanocrystalline oxide semiconductor), an amorphous-like oxide semiconductor (a-like OS), and an amorphous oxide semiconductor.

From another perspective, an oxide semiconductor is classified into an amorphous oxide semiconductor and a crystalline oxide semiconductor. Examples of a crystalline oxide semiconductor include a single crystal oxide semiconductor, a CAAC-OS, a polycrystalline oxide semiconductor, and an nc-OS.

An amorphous structure is generally thought to be isotropic and have no non-uniform structure, to be metastable and not to have fixed positions of atoms, to have a flexible bond angle, and to have a short-range order but have no long-range order, for example.

This means that a stable oxide semiconductor cannot be regarded as a completely amorphous oxide semiconductor. Moreover, an oxide semiconductor that is not isotropic (e.g., an oxide semiconductor that has a periodic structure in a microscopic region) cannot be regarded as a completely amorphous oxide semiconductor. In contrast, an a-like OS, which is not isotropic, has an unstable structure that contains a void. Because of its instability, an a-like OS is close to an amorphous oxide semiconductor in terms of physical properties.

<CAAC-OS>

First, a CAAC-OS will be described.

A CAAC-OS is one of oxide semiconductors having a plurality of c-axis aligned crystal parts (also referred to as pellets).

Analysis of a CAAC-OS by X-ray diffraction (XRD) is described. For example, when the structure of a CAAC-OS including an InGaZnO$_4$ crystal, which is classified into the space group R-3m, is analyzed by an out-of-plane method, a peak appears at a diffraction angle (2θ) of around 31° as shown in FIG. 10(A). This peak is derived from the (009) plane of the InGaZnO$_4$ crystal, which indicates that crystals in the CAAC-OS have c-axis alignment, and that the c-axes are aligned in a direction substantially perpendicular to a surface over which the CAAC-OS film is formed (also referred to as a formation surface) or the top surface of the CAAC-OS film. Note that a peak sometimes appears at a 2θ of around 36° in addition to the peak at a 2θ of around 31°. The peak at a 2θ of around 36° is derived from a crystal structure classified into the space group Fd-3m. Therefore, it is preferred that the CAAC-OS do not show the peak at a 2θ of around 36°.

On the other hand, in structural analysis of the CAAC-OS by an in-plane method in which an X-ray is incident on the CAAC-OS in a direction parallel to the formation surface, a peak appears at a 2θ of around 56°. This peak is attributed to the (110) plane of the InGaZnO$_4$ crystal. When analysis (φ scan) is performed with 2θ fixed at around 56° while the sample is rotated around a normal vector to the sample surface as an axis (φ axis), as shown in FIG. 10(B), a peak is not clearly observed. In contrast, in the case where single crystal InGaZnO$_4$ is subjected to φ scan with 2θ fixed at around 56°, as shown in FIG. 10(C), six peaks which are derived from crystal planes equivalent to the (110) plane are observed. Accordingly, the structural analysis using XRD shows that the directions of a-axes and b-axes are irregularly oriented in the CAAC-OS.

Next, a CAAC-OS analyzed by electron diffraction will be described. For example, when an electron beam with a probe diameter of 300 nm is incident on a CAAC-OS including an InGaZnO$_4$ crystal in a direction parallel to the formation surface of the CAAC-OS, a diffraction pattern (also referred to as a selected-area electron diffraction pattern) shown in FIG. 10(D) can be obtained. In this diffraction pattern, spots derived from the (009) plane of an InGaZnO$_4$ crystal are included. Thus, the electron diffraction also indicates that pellets included in the CAAC-OS have c-axis alignment and that the c-axes are aligned in the direction substantially perpendicular to the formation surface or the top surface of the CAAC-OS. Meanwhile, FIG. 10(E) shows a diffraction pattern obtained in such a manner that an electron beam with a probe diameter of 300 nm is incident on the same sample in a direction perpendicular to the sample surface. As shown in FIG. 10(E), a ring-like diffraction pattern is observed. Thus, the electron diffraction using an electron beam with a probe diameter of 300 nm also indicates that the a-axes and b-axes of the pellets included in the CAAC-OS do not have regular orientation. The first ring in FIG. 10(E) is considered to be derived from the (010) plane, the (100) plane, and the like of the InGaZnO$_4$ crystal. The second ring in FIG. 10(E) is considered to be derived from the (110) plane and the like.

In a combined analysis image (also referred to as a high-resolution TEM image) of a bright-field image and a diffraction pattern of a CAAC-OS, which is obtained using a transmission electron microscope (TEM), a plurality of pellets can be observed. However, even in the high-resolution TEM image, a boundary between pellets, that is, a crystal grain boundary is not clearly observed in some cases. Thus, in the CAAC-OS, a reduction in electron mobility due to the grain boundary is less likely to occur.

Figure 11A:
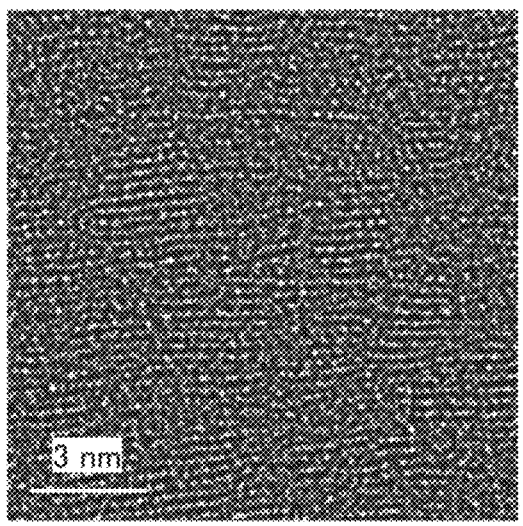
FIGS. 11A-11E A cross-sectional TEM image and plan-view TEM images of a CAAC-OS and images obtained through analysis thereof.

FIG. 11(A) shows an example of a high-resolution TEM image of a cross section of the CAAC-OS which is obtained from a direction substantially parallel to the sample surface. The high-resolution TEM image is obtained with a spherical aberration corrector function. The high-resolution TEM image obtained with a spherical aberration corrector function is particularly referred to as a Cs-corrected high-resolution TEM image. The Cs-corrected high-resolution TEM image can be observed with, for example, an atomic resolution analytical electron microscope JEM-ARM200F manufactured by JEOL Ltd.

FIG. 11(A) shows pellets in which metal atoms are arranged in a layered manner. FIG. 11(A) proves that the size of a pellet is greater than or equal to 1 nm or greater than or equal to 3 nm. Therefore, the pellet can also be referred to as a nanocrystal (nc). Furthermore, the CAAC-OS can also be referred to as an oxide semiconductor including CANC (c-axis aligned nanocrystals). A pellet reflects unevenness of a formation surface or a top surface of the CAAC-OS, and is parallel to the formation surface or the top surface of the CAAC-OS.

Figure 11B:
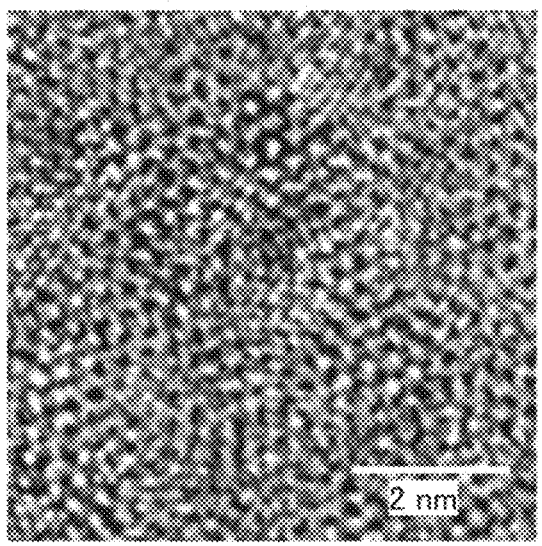
Figure 11C:
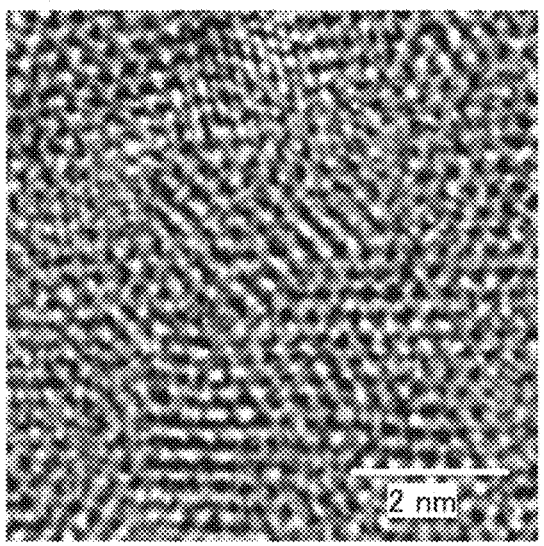
Figure 11D:
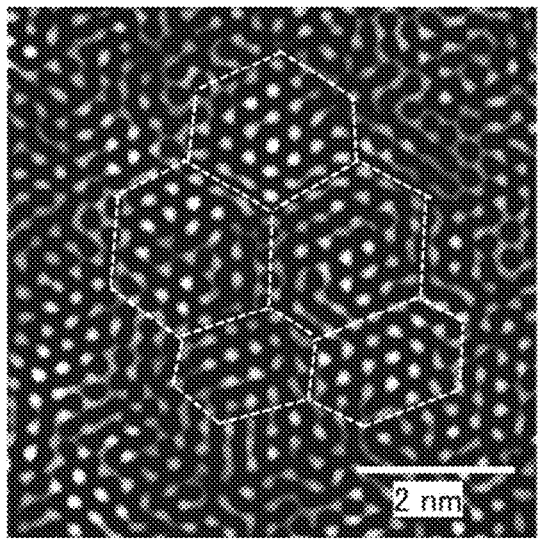
Figure 11E:
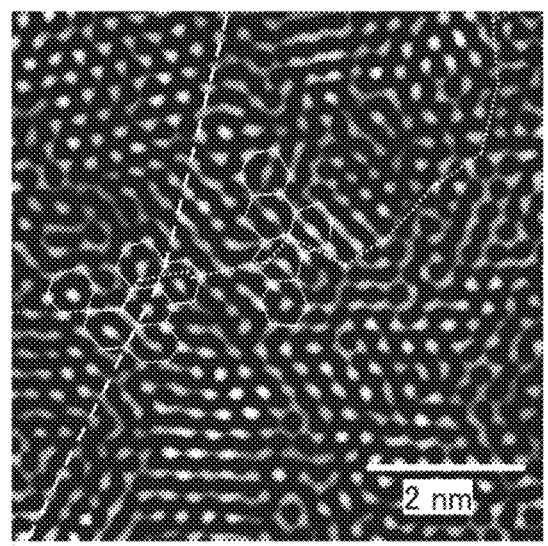

FIG. 11(B) and FIG. 11(C) show Cs-corrected high-resolution TEM images of a plane of the CAAC-OS observed in the direction substantially perpendicular to the sample surface. FIG. 11(D) and FIG. 11(E) are images obtained by image processing of FIGS. 11(B) and 11(C). The method of image processing is as follows. The image in FIG. 11(B) is subjected to fast Fourier transform (FFT) to obtain an FFT image. Then, mask processing is performed such that a range of from 2.8 nm$^{-1}$ to 5.0 nm$^{-1}$ from the origin in the obtained FFT image remains. After the mask processing, the FFT image is processed by inverse fast Fourier transform (IFFT) to obtain a processed image. The image obtained in this manner is called an FFT filtering image. The FFT filtering image is a Cs-corrected high-resolution TEM image from which a periodic component is extracted, and shows a lattice arrangement.

In FIG. 11(D), a portion in which the lattice arrangement is broken is shown by dashed lines. A region surrounded by a dashed line is one pellet. The portion denoted with the dashed line is a junction of pellets. The dashed line draws a hexagon, which means that the pellet has a hexagonal shape. Note that the shape of the pellet is not always a regular hexagon but is a non-regular hexagon in many cases.

In FIG. 11(E), a dotted line denotes a portion where the direction of a lattice arrangement changes between a region with a uniform lattice arrangement and another region with a uniform lattice arrangement, and a dashed line denotes the change in the direction of the lattice arrangement. A clear crystal grain boundary cannot be observed even in the vicinity of the dotted line. When a lattice point in the vicinity of the dotted line is regarded as a center and surrounding lattice points are joined, a distorted hexagon, pentagon, and/or heptagon can be formed, for example. That is, a lattice arrangement is distorted so that formation of a crystal grain boundary is inhibited. This is probably because the CAAC-OS can tolerate distortion owing to a low density of atom arrangement in the a-b plane direction, an interatomic bond distance changed by substitution of a metal element, and the like.

As described above, the CAAC-OS has c-axis alignment, its pellets (nanocrystals) are connected in an a-b plane direction, and the crystal structure has distortion. For this reason, the CAAC-OS can also be referred to as a CAA crystal (c-axis-aligned a-b-plane-anchored crystal).

The CAAC-OS is an oxide semiconductor with high crystallinity. Entry of impurities, formation of defects, or the like might decrease the crystallinity of an oxide semiconductor. This means that the CAAC-OS has small amounts of impurities and defects (e.g., oxygen vacancies).

Note that the impurity means an element other than the main components of the oxide semiconductor, such as hydrogen, carbon, silicon, or a transition metal element. For example, an element (specifically, silicon or the like) having higher strength of bonding to oxygen than a metal element included in an oxide semiconductor extracts oxygen from the oxide semiconductor, which results in disorder of the atomic arrangement and reduced crystallinity of the oxide semiconductor. A heavy metal such as iron or nickel, argon, carbon dioxide, or the like has a large atomic radius (or molecular radius), and thus disturbs the atomic arrangement of the oxide semiconductor and decreases crystallinity.

<nc-OS>

Next, an nc-OS is described.

Analysis of an nc-OS by XRD is described. When the structure of an nc-OS is analyzed by an out-of-plane method, a peak indicating orientation does not appear. That is, a crystal of an nc-OS does not have orientation.

Figure 12A:
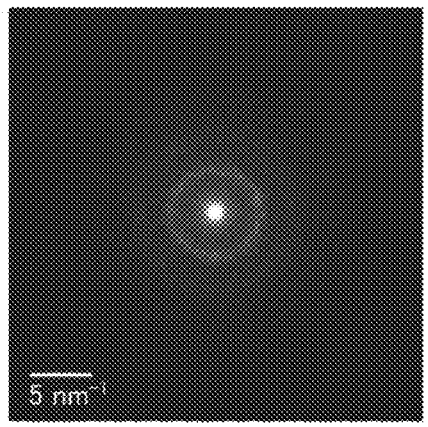
FIGS. 12A-12D Electron diffraction patterns of an nc-OS and a cross-sectional TEM image of an nc-OS.
Figure 12B:
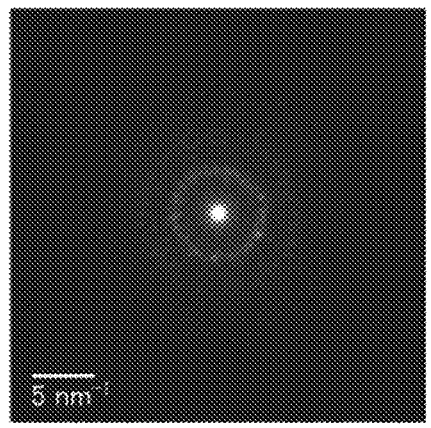

For example, when an electron beam with a probe diameter of 50 nm is incident on a 34-nm-thick region of a thinned nc-OS including an InGaZnO$_4$ crystal in a direction parallel to the formation surface, a ring-like diffraction pattern (nanobeam electron diffraction pattern) shown in FIG. 12(A) is observed. FIG. 12(B) shows a diffraction pattern obtained when an electron beam with a probe diameter of 1 nm is incident on the same sample. As shown in FIG. 12(B), a plurality of spots are observed in a ring-like region. In other words, ordering in an nc-OS is not observed with an electron beam with a probe diameter of 50 nm but is observed with an electron beam with a probe diameter of 1 nm.

Figure 12C:
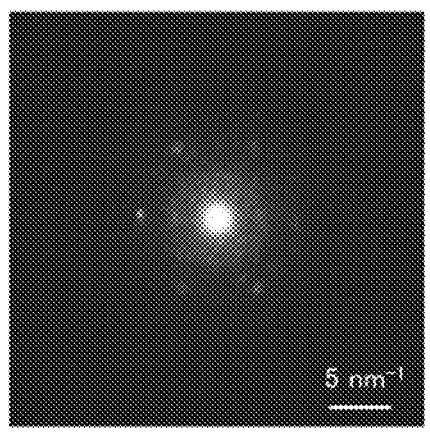

When an electron beam with a probe diameter of 1 nm is incident on a region with a thickness less than 10 nm, an electron diffraction pattern in which spots are arranged in an approximately regular hexagonal shape as shown in FIG. 12(C) is observed in some cases. This means that an nc-OS has a well-ordered region, i.e., a crystal, in the range of less than 10 nm in thickness. Note that an electron diffraction pattern having regularity is not observed in some regions because crystals are aligned in various directions.

Figure 12D:
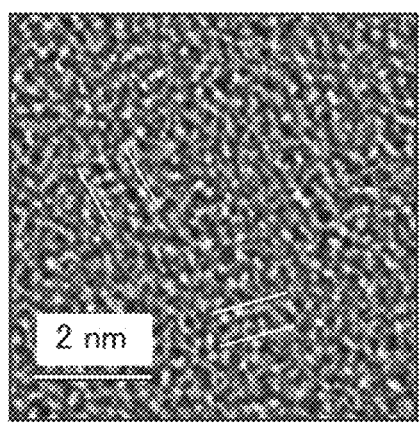

FIG. 12(D) shows a Cs-corrected high-resolution TEM image of a cross section of an nc-OS observed from the direction substantially parallel to the formation surface. In a high-resolution TEM image, an nc-OS has a region in which a crystal part is observed, such as the part indicated by additional lines, and a region in which a crystal part is not clearly observed. In most cases, the size of a crystal part included in the nc-OS is greater than or equal to 1 nm and less than or equal to 10 nm, or specifically, greater than or equal to 1 nm and less than or equal to 3 nm. Note that an oxide semiconductor including a crystal part whose size is greater than 10 nm and less than or equal to 100 nm is sometimes referred to as a microcrystalline oxide semiconductor. In a high-resolution TEM image of the nc-OS, for example, a crystal grain boundary is not clearly observed in some cases. Note that there is a possibility that the origin of the nanocrystal is the same as that of a pellet in a CAAC-OS. Therefore, a crystal part of the nc-OS may be referred to as a pellet in the following description.

As described above, in the nc-OS, a microscopic region (for example, a region with a size greater than or equal to 1 nm and less than or equal to 10 nm, in particular, a region with a size greater than or equal to 1 nm and less than or equal to 3 nm) has a periodic atomic arrangement. There is no regularity of crystal orientation between different pellets in the nc-OS. Thus, the orientation of the whole film is not observed. Accordingly, the nc-OS cannot be distinguished from an a-like OS or an amorphous oxide semiconductor, depending on an analysis method.

Since there is no regularity of crystal orientation between the pellets (nanocrystals) as mentioned above, the nc-OS can also be referred to as an oxide semiconductor including RANC (random aligned nanocrystals) or an oxide semiconductor including NANC (non-aligned nanocrystals).

The nc-OS is an oxide semiconductor that has high regularity as compared with an amorphous oxide semiconductor. Therefore, the nc-OS is likely to have a lower density of defect states than an a-like OS and an amorphous oxide semiconductor. Note that there is no regularity of crystal orientation between different pellets in the nc-OS. Therefore, the nc-OS has a higher density of defect states than the CAAC-OS.

<a-like OS>

An a-like OS has a structure intermediate between those of the nc-OS and the amorphous oxide semiconductor.

Figure 13A:
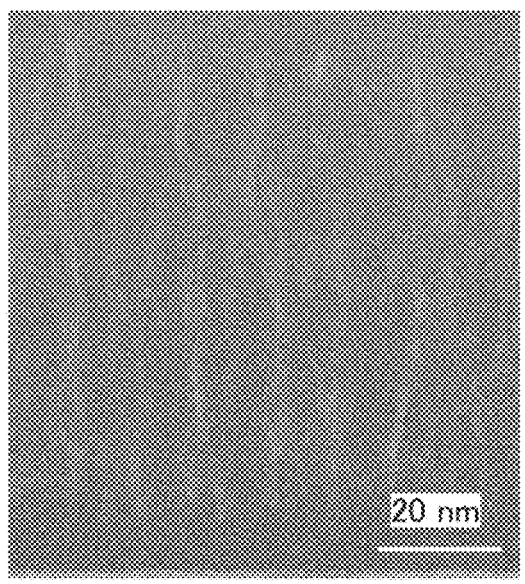
FIGS. 13A-13B Cross-sectional TEM images of an a-like OS.
Figure 13B:
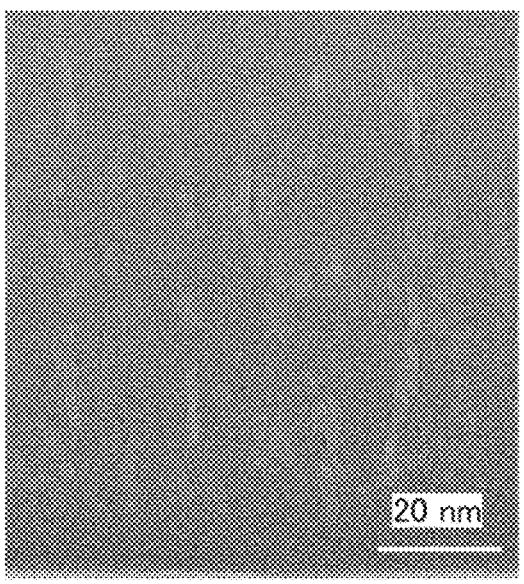

FIG. 13 is high-resolution cross-sectional TEM images of an a-like OS. FIG. 13(A) is the high-resolution cross-sectional TEM image of the a-like OS at the start of the electron irradiation. FIG. 13(B) is the high-resolution cross-sectional TEM image of a-like OS after the electron ($e^-$) irradiation at $4.3 \times 10^8$ $e^-/nm^2$. FIG. 13(A) and FIG. 13(B) show that stripe-like bright regions extending vertically are observed in the a-like OS from the start of the electron irradiation. It can also be found that the shape of the bright region changes after the electron irradiation. Note that the bright region is presumably a void or a low-density region.

The a-like OS has an unstable structure because it includes a void. To verify that an a-like OS has an unstable structure as compared with a CAAC-OS and an nc-OS, a change in structure caused by electron irradiation will be described below.

An a-like OS, an nc-OS, and a CAAC-OS are prepared as samples. Each of the samples is an In—Ga—Zn oxide.

First, a high-resolution cross-sectional TEM image of each sample is obtained. The high-resolution cross-sectional TEM images show that all the samples have crystal parts.

It is known that a unit cell of an $InGaZnO_4$ crystal has a structure in which nine layers including three In—O layers and six Ga—Zn—O layers are stacked in the c-axis direction. The distance between the adjacent layers is equivalent to the lattice spacing on the (009) plane (also referred to as d value). The value is calculated to be 0.29 nm from crystal structural analysis. Accordingly, a portion where the spacing between lattice fringes is greater than or equal to 0.28 nm and less than or equal to 0.30 nm is regarded as a crystal part of $InGaZnO_4$ in the following description. Each of lattice fringes corresponds to the a-b plane of the $InGaZnO_4$ crystal.

Figure 14:
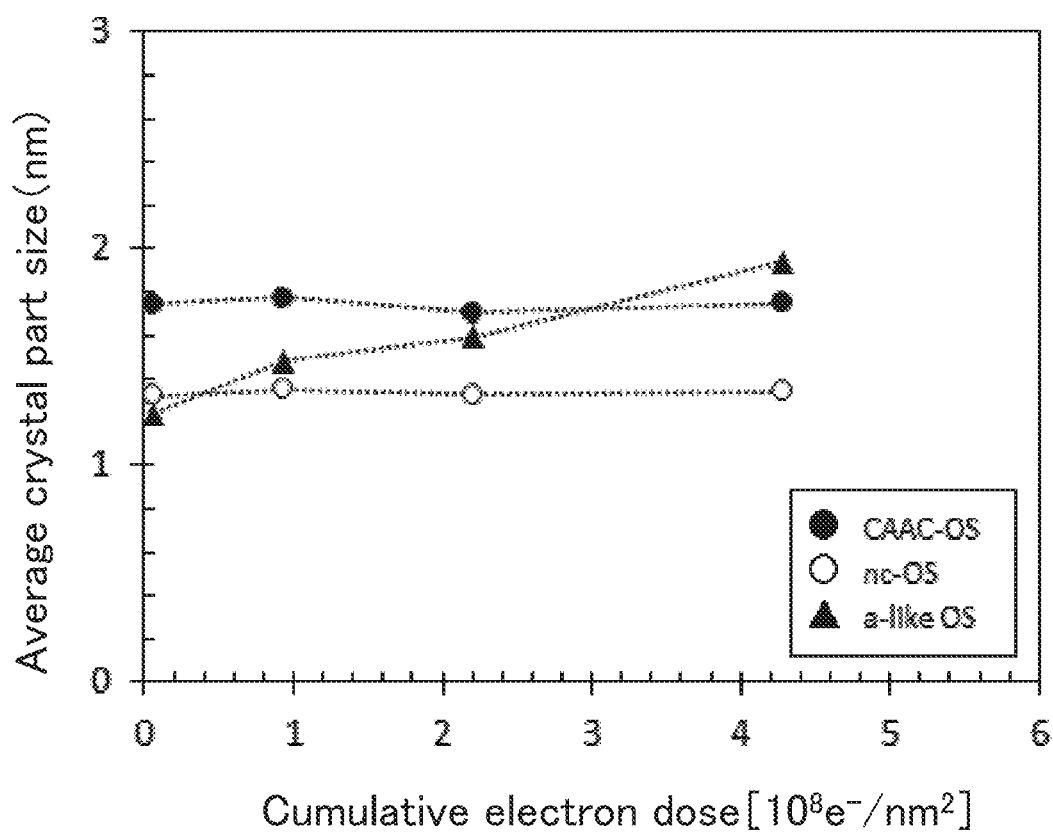
FIG. 14 A graph showing a change in crystal parts of an In—Ga—Zn oxide induced by electron irradiation.
Figure 15A:
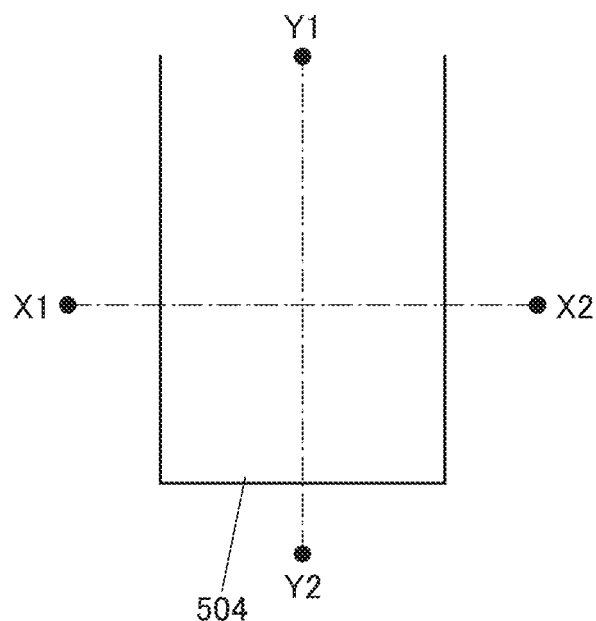
FIGS. 15A-15C A top view and cross-sectional views illustrating an example of a manufacturing process of a semiconductor device.
Figure 15B:
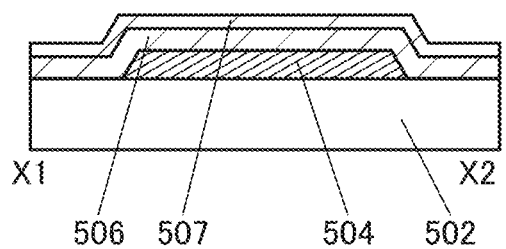
Figure 15C:
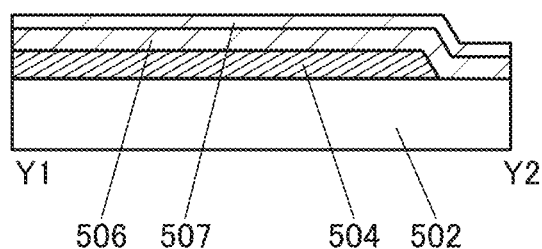
Figure 16A:
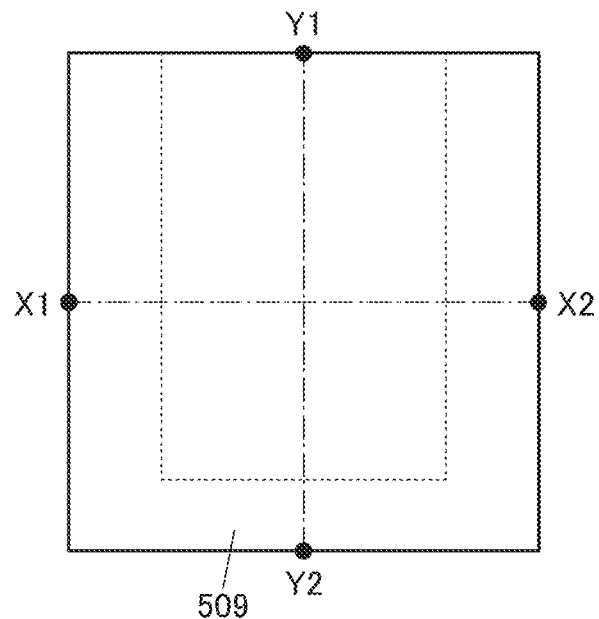
FIGS. 16A-16C A top view and cross-sectional views illustrating an example of a manufacturing process of a semiconductor device.
Figure 16B:
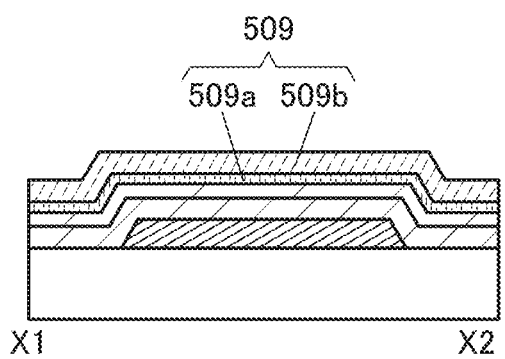
Figure 16C:
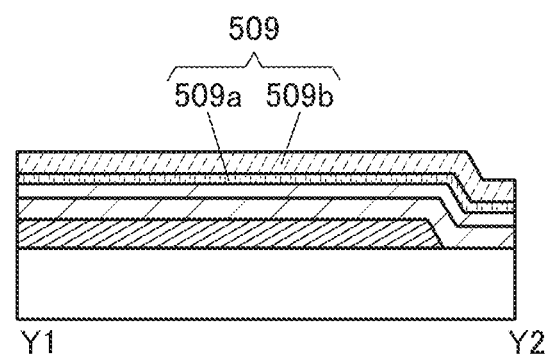
Figure 17A:
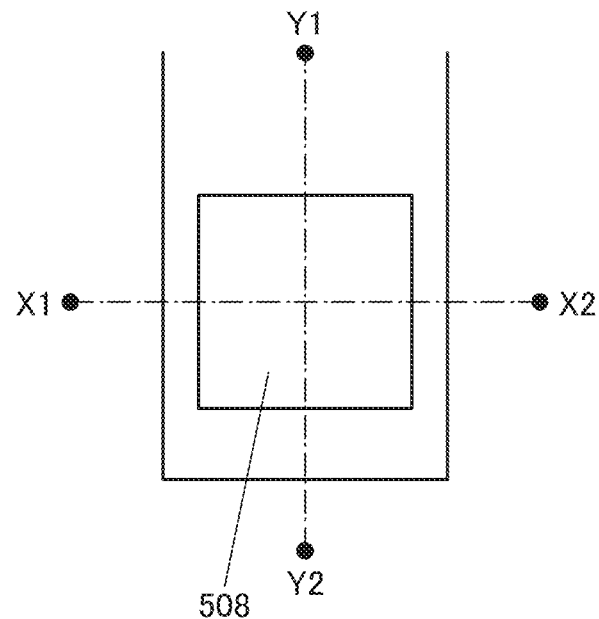
FIGS. 17A-17C A top view and cross-sectional views illustrating an example of a manufacturing process of a semiconductor device.
Figure 17B:
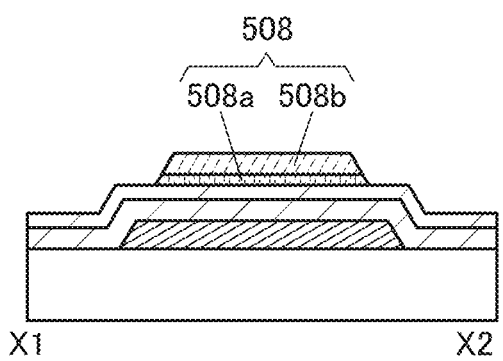
Figure 17C:
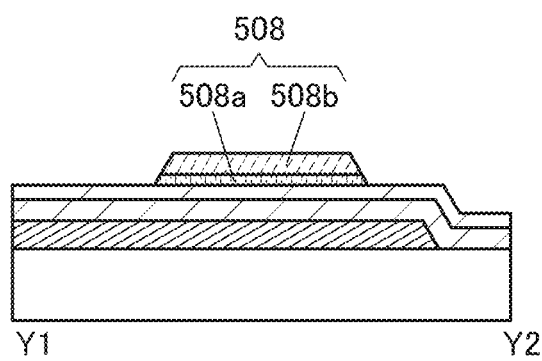

FIG. 14 shows changes in the average size of crystal parts (at 22 points to 30 points) in each sample. Note that the crystal part size corresponds to the length of a lattice fringe. FIG. 14 indicates that the crystal part size in the a-like OS increases with an increase in the cumulative electron dose in obtaining TEM images, for example. As shown in FIG. 14, a crystal part of approximately 1.2 nm (also referred to as an initial nucleus) at the start of TEM observation grows to a size of approximately 1.9 nm at a cumulative electron ($e^-$) dose of $4.2 \times 10^8$ $e^-/nm^2$. In contrast, the crystal part size in the nc-OS and the CAAC-OS shows little change from the start of electron irradiation to a cumulative electron dose of $4.2 \times 10^8$ $e^-/nm^2$. As shown in FIG. 14, the crystal part sizes in an nc-OS and a CAAC-OS are approximately 1.3 nm and approximately 1.8 nm, respectively, regardless of the cumulative electron dose. For the electron beam irradiation and TEM observation, a Hitachi H-9000NAR transmission electron microscope was used. The conditions of electron beam irradiation were as follows: the accelerating voltage was 300 kV; the current density was $6.7 \times 10^5$ $e^-/(nm^2 \cdot s)$; and the diameter of the irradiation region was 230 nm.

In this manner, growth of the crystal part in the a-like OS is induced by electron irradiation. In contrast, in the nc-OS and the CAAC-OS, growth of the crystal part is hardly induced by electron irradiation. Therefore, the a-like OS has an unstable structure as compared with the nc-OS and the CAAC-OS.

The a-like OS has a lower density than the nc-OS and the CAAC-OS because it includes a void. Specifically, the density of the a-like OS is higher than or equal to 78.6% and lower than 92.3% of the density of the single crystal oxide semiconductor having the same composition. The density of each of the nc-OS and the CAAC-OS is higher than or equal to 92.3% and lower than 100% of the density of the single crystal oxide semiconductor having the same composition. Note that it is difficult to deposit an oxide semiconductor having a density of lower than 78% of the density of the single crystal oxide semiconductor.

For example, in the case of an oxide semiconductor having an atomic ratio of In:Ga:Zn=1:1:1, the density of single crystal $InGaZnO_4$ with a rhombohedral crystal structure is 6.357 $g/cm^3$. Accordingly, in the case of the oxide semiconductor having an atomic ratio of In:Ga:Zn=1:1:1, the density of the a-like OS is higher than or equal to 5.0 $g/cm^3$ and lower than 5.9 $g/cm^3$. For example, in the case of the oxide semiconductor having an atomic ratio of In:Ga:Zn=1:1:1, the density of each of the nc-OS and the CAAC-OS is higher than or equal to 5.9 $g/cm^3$ and lower than 6.3 $g/cm^3$.

Note that in the case where an oxide semiconductor having a certain composition does not exist in a single crystal structure, single crystal oxide semiconductors with different compositions are combined at an adequate ratio, which makes it possible to calculate density equivalent to that of a single crystal oxide semiconductor with the desired composition. The density of a single crystal oxide semiconductor having the desired composition can be estimated using a weighted average according to the combination ratio of the single crystal oxide semiconductors with different compositions. Note that it is preferable to use as few kinds of single crystal oxide semiconductors as possible to estimate the density.

As described above, oxide semiconductors have various structures and various properties. Note that an oxide semiconductor may be a stacked layer including two or more films of an amorphous oxide semiconductor, an a-like OS, an nc-OS, and a CAAC-OS, for example.

<Carrier Density of Oxide Semiconductor>

Next, the carrier density of an oxide semiconductor will be described below.

Examples of a factor affecting the carrier density of an oxide semiconductor include oxygen vacancy (Vo) and impurities in the oxide semiconductor.

As the amount of oxygen vacancy in the oxide semiconductor increases, the density of defect states increases when hydrogen is bonded to the oxygen vacancy (this state is also referred to as VoH). The density of defect states also increases with an increase in the amount of impurity in the oxide semiconductor. Hence, the carrier density of an oxide semiconductor can be controlled by controlling the density of defect states in the oxide semiconductor.

A transistor using the oxide semiconductor in a channel region will be described below.

The carrier density of the oxide semiconductor is preferably reduced in order to inhibit the negative shift of the threshold voltage of the transistor or reduce the off-state current of the transistor. In order to reduce the carrier density of the oxide semiconductor, the impurity concentration in the oxide semiconductor is reduced so that the density of defect states can be reduced. In this specification and the like, a state with a low impurity concentration and a low density of defect states is referred to as a highly purified intrinsic or substantially highly purified intrinsic state. The carrier density of a highly purified intrinsic oxide semiconductor is lower than $8\times10^{15}$ cm$^{-3}$, preferably lower than $1\times10^{11}$ cm$^{-3}$, and further preferably lower than $1\times10^{10}$ cm$^{-3}$ and is higher than or equal to $1\times10^{-9}$ cm$^{-3}$.

In contrast, the carrier density of the oxide semiconductor is preferably increased in order to improve the on-state current of the transistor or improve the field-effect mobility of the transistor. In order to increase the carrier density of the oxide semiconductor, the impurity concentration or the density of defect states in the oxide semiconductor is slightly increased. Alternatively, the bandgap of the oxide semiconductor is preferably narrowed. For example, an oxide semiconductor that has a slightly high impurity concentration or a slightly high density of defect states in the range where a favorable on/off ratio is obtained in the $I_d$-$V_g$ characteristics of the transistor can be regarded as substantially intrinsic. Furthermore, an oxide semiconductor that has a high electron affinity and thus has a narrow bandgap so as to increase the density of thermally excited electrons (carriers) can be regarded as substantially intrinsic. Note that a transistor using an oxide semiconductor with higher electron affinity has lower threshold voltage.

The aforementioned oxide semiconductor with an increased carrier density has a slightly n-type conductivity; thus, it can be referred to as a "slightly-n" oxide semiconductor.

The carrier density of a substantially intrinsic oxide semiconductor is preferably higher than or equal to $1\times10^{5}$ cm$^{-3}$ and lower than $1\times10^{18}$ cm$^{-3}$, further preferably higher than or equal to $1\times10^{7}$ cm$^{-3}$ and lower than or equal to $1\times10^{17}$ cm$^{-3}$, still further preferably higher than or equal to $1\times10^{9}$ cm$^{-3}$ and lower than or equal to $5\times10^{16}$ cm$^{-3}$, yet further preferably higher than or equal to $1\times10^{10}$ cm$^{-3}$ and lower than or equal to $1\times10^{16}$ cm$^{-3}$, and yet still preferably higher than or equal to $1\times10^{11}$ cm$^{-3}$ and lower than or equal to $1\times10^{15}$ cm$^{-3}$.

<Insulating Film Serving as Protective Insulating Film and Second Gate Insulating Film of Transistor>

The insulating film 514 and the insulating film 516 have a function of supplying oxygen to the oxide semiconductor film 508. Furthermore, the insulating film 518 serves as a protective insulating film and a second gate insulating film of the transistor 500. Furthermore, the insulating film 514 and the insulating film 516 contain oxygen. The insulating film 514 is an insulating film that is permeable to oxygen. Note that the insulating film 514 also serves as a film which relieves damage to the oxide semiconductor film 508 when the insulating film 516 formed later is formed.

A silicon oxide film, a silicon oxynitride film, or the like with a thickness greater than or equal to 5 nm and less than or equal to 150 nm, preferably greater than or equal to 5 nm and less than or equal to 50 nm can be used as the insulating film 514.

In addition, it is preferable that the number of defects in the insulating film 514 be small and typically, the spin density corresponding to a signal that appears at g=2.001 due to a dangling bond of silicon be lower than or equal to $3\times10^{17}$ spins/cm$^3$ by ESR measurement. This is because if the density of defects in the insulating film 514 is high, oxygen is bonded to the defects and the transmittance of oxygen that passes through the insulating film 514 is decreased.

Note that all oxygen entering the insulating film 514 from the outside does not move to the outside of the insulating film 514 and some oxygen remains in the insulating film 514. Furthermore, movement of oxygen occurs in the insulating film 514 in some cases in such a manner that oxygen enters the insulating film 514 and oxygen included in the insulating film 514 is moved to the outside of the insulating film 514. When an oxide insulating film which can transmit oxygen is formed as the insulating film 514, oxygen released from the insulating film 516 provided over the insulating film 514 can be moved to the oxide semiconductor film 508 through the insulating film 514.

The insulating film 514 can be formed using an oxide insulating film having a low density of states due to nitrogen oxide. Note that the density of states due to nitrogen oxide can be formed between the energy of the valence band maximum ($E_{v\_os}$) and the energy of the conduction band minimum ($E_{c\_os}$) of the oxide semiconductor film. A silicon oxynitride film that releases less nitrogen oxide, an aluminum oxynitride film that releases less nitrogen oxide, or the like can be used as the above oxide insulating film.

Note that a silicon oxynitride film that releases less nitrogen oxide is a film which releases more ammonia than the nitrogen oxide in thermal desorption spectroscopy analysis; the number of ammonia molecules released from the silicon oxynitride film is typically greater than or equal to $1\times10^{18}$ molecules/cm$^3$ and less than or equal to $5\times10^{19}$ molecules/cm$^3$. Note that the number of ammonia molecules released from a film is the number of ammonia molecules released by heat treatment with which the surface temperature of the film becomes higher than or equal to 50° C. and lower than or equal to 650° C., preferably higher than or equal to 50° C. and lower than or equal to 550° C.

Nitrogen oxide (NO$_x$; x is greater than or equal to 0 and less than or equal to 2, preferably greater than or equal to 1 and less than or equal to 2), typically NO$_2$ or NO, forms levels in the insulating film 514, for example. The level is positioned in the energy gap of the oxide semiconductor film 508. Therefore, when nitrogen oxide is diffused to the interface between the insulating film 514 and the oxide semiconductor film 508, an electron is in some cases trapped by the level on the insulating film 514 side. As a result, the trapped electron remains in the vicinity of the interface between the insulating film 514 and the oxide semiconductor film 508; thus, the threshold voltage of the transistor is shifted in the positive direction.

Nitrogen oxide reacts with ammonia and oxygen in heat treatment. Since nitrogen oxide included in the insulating film 514 reacts with ammonia included in the insulating film 516 in heat treatment, nitrogen oxide included in the insulating film 514 is reduced. Therefore, an electron is hardly trapped at the interface between the insulating film 514 and the oxide semiconductor film 508.

By using the above oxide insulating film for the insulating film 514, a shift in the threshold voltage of the transistor can be reduced, which leads to reduced fluctuations in the electrical characteristics of the transistor.

Note that in an ESR spectrum at 100 K or lower of the insulating film 514, by heat treatment of a manufacturing process of the transistor, typically heat treatment at a temperature lower than 400° C. or lower than 375° C. (preferably, higher than or equal to 340° C. and lower than or equal to 360° C.), a first signal that appears at a g-factor of greater than or equal to 2.037 and less than or equal to 2.039, a second signal that appears at a g-factor of greater than or equal to 2.001 and less than or equal to 2.003, and a third signal that appears at a g-factor of greater than or equal to 1.964 and less than or equal to 1.966 are observed. The split width of the first and second signals and the split width of the second and third signals that are obtained by ESR measurement using an X-band are each approximately 5 mT. The sum of the spin densities of the first signal that appears at a g-factor of greater than or equal to 2.037 and less than or equal to 2.039, the second signal that appears at a g-factor of greater than or equal to 2.001 and less than or equal to 2.003, and the third signal that appears at a g-factor of greater than or equal to 1.964 and less than or equal to 1.966 is lower than $1\times10^{18}$ spins/cm$^3$, typically higher than or equal to $1\times10^{17}$ spins/cm$^3$ and lower than $1\times10^{18}$ spins/cm$^3$.

In the ESR spectrum at 100 K or lower, the first signal that appears at a g-factor of greater than or equal to 2.037 and less than or equal to 2.039, the second signal that appears at a g-factor of greater than or equal to 2.001 and less than or equal to 2.003, and the third signal that appears at a g-factor of greater than or equal to 1.964 and less than or equal to 1.966 correspond to signals attributed to nitrogen oxide (NO$_x$; x is greater than or equal to 0 and less than or equal to 2, preferably greater than or equal to 1 and less than or equal to 2). Typical examples of nitrogen oxide include nitrogen monoxide and nitrogen dioxide. In other words, the lower the total spin density of the first signal that appears at a g-factor of greater than or equal to 2.037 and less than or equal to 2.039, the second signal that appears at a g-factor of greater than or equal to 2.001 and less than or equal to 2.003, and the third signal that appears at a g-factor of greater than or equal to 1.964 and less than or equal to 1.966 is, the smaller amount of nitrogen oxide the oxide insulating film contains.

The nitrogen concentration in the above oxide insulating film measured by SIMS is lower than or equal to $6\times10^{20}$ atoms/cm$^3$.

The above oxide insulating film is formed by a PECVD method at a substrate temperature higher than or equal to 220° C. and lower than or equal to 350° C. using silane and dinitrogen monoxide, whereby a dense and hard film can be formed.

The insulating film 516 is formed using an oxide insulating film that contains oxygen in excess of that in the stoichiometric composition. Part of oxygen is released by heating from the oxide insulating film containing oxygen in excess of that in the stoichiometric composition. The oxide insulating film containing oxygen in excess of that in the stoichiometric composition is an oxide insulating film of which the amount of released oxygen converted into oxygen atoms is greater than or equal to $1.0\times10^{19}$ atoms/cm$^3$, preferably greater than or equal to $3.0\times10^{20}$ atoms/cm$^3$ in TDS analysis. Note that the temperature of the film surface in the TDS analysis is preferably higher than or equal to 100° C. and lower than or equal to 700° C., or higher than or equal to 100° C. and lower than or equal to 500° C.

A silicon oxide film, a silicon oxynitride film, or the like with a thickness greater than or equal to 30 nm and less than or equal to 500 nm, preferably greater than or equal to 50 nm and less than or equal to 400 nm can be used as the insulating film 516.

It is preferable that the number of defects in the insulating film 516 be small, and typically the spin density corresponding to a signal which appears at g=2.001 due to a dangling bond of silicon be lower than $1.5\times10^{18}$ spins/cm$^3$, preferably lower than or equal to $1\times10^{18}$ spins/cm$^3$ by ESR measurement. Note that the insulating film 516 is provided more apart from the oxide semiconductor film 508 than the insulating film 514 is; thus, the insulating film 516 may have higher density of defects than the insulating film 514.

Furthermore, the insulating film 514 and the insulating film 516 can be formed using insulating films formed of the same kinds of materials; thus, a boundary between the insulating film 514 and the insulating film 516 cannot be clearly observed in some cases. Thus, in this embodiment, the boundary between the insulating film 514 and the insulating film 516 is shown by a dashed line. Although a two-layer structure of the insulating film 514 and the insulating film 516 is described in this embodiment, the present invention is not limited to this structure. For example, a single-layer structure of either one of the insulating film 514 and the insulating film 516 may be employed.

The insulating film 518 has a function of blocking oxygen, hydrogen, water, alkali metal, alkaline earth metal, and the like. It is possible to prevent outward diffusion of oxygen from the oxide semiconductor film 508, outward diffusion of oxygen included in the insulating film 514 and the insulating film 516, and entry of hydrogen, water, or the like into the oxide semiconductor film 508 from the outside by providing the insulating film 518. A nitride insulating film, for example, can be used as the insulating film 518. The nitride insulating film is formed using silicon nitride, silicon nitride oxide, aluminum nitride, aluminum nitride oxide, or the like. In particular, a silicon nitride oxide film or a silicon nitride film is preferably used as the insulating film 518, in which case outward diffusion of oxygen can be prevented.

Note that instead of the nitride insulating film having a blocking effect against oxygen, hydrogen, water, alkali metal, alkaline earth metal, and the like, an oxide insulating film having a blocking effect against oxygen, hydrogen, water, and the like may be provided as the insulating film 518. As the oxide insulating film having a blocking effect against oxygen, hydrogen, water, and the like, an aluminum oxide film, an aluminum oxynitride film, a gallium oxide film, a gallium oxynitride film, an yttrium oxide film, an yttrium oxynitride film, a hafnium oxide film, a hafnium oxynitride film, and the like can be given. As the oxide insulating film having a blocking effect against oxygen, hydrogen, water, and the like, an aluminum oxide film, a hafnium oxide film, or an yttrium oxide film is particularly preferable.

<Method 1 for Manufacturing Semiconductor Device>

Next, a method for manufacturing the transistor 500 that is a semiconductor device of one embodiment of the present invention will be described in detail with reference to FIG. 15 to FIG. 30.

First, a conductive film is formed over the substrate 502 and processed through a lithography process and an etching process, whereby the conductive film 504 functioning as a gate electrode is formed. Then, the insulating film 506 and the insulating film 507 functioning as gate insulating films are formed over the conductive film 504 (see FIG. 15).

Next, an oxide semiconductor film 509 is formed over the insulating film 507 at a first temperature by a sputtering method, for example. Note that as the oxide semiconductor film 509, an insulating film 509a is formed and then an oxide semiconductor film 509b is formed (see FIG. 16).

The first temperature at which the oxide semiconductor film 509 is formed is higher than or equal to room temperature and lower than 340° C., preferably higher than or equal to room temperature and lower than or equal to 300° C., further preferably higher than or equal to 100° C. and lower than or equal to 250° C., and still further preferably higher than or equal to 100° C. and lower than or equal to 200° C. The oxide semiconductor film 509 is formed while heat treatment is performed, so that the crystallinity of the oxide semiconductor film 509 can be improved. In the case where a large-sized glass substrate (for example, any of glass substrates of the 6th to 10th generations) is used as the substrate 502, the substrate 502 is sometimes distorted when the first temperature is higher than or equal to 150° C. and lower than 340° C. However, even in the case where a large-sized glass substrate is used, distortion of the glass substrate can be prevented when the first temperature is higher than or equal to 100° C. and lower than 150° C.

The insulating film 509a and the oxide semiconductor film 509b are formed at either the same substrate temperature or different substrate temperatures. Preferably, the insulating film 509a and the oxide semiconductor film 509b are formed at the same substrate temperature because manufacturing cost can be reduced.

In the case where the oxide semiconductor film 509 is formed by a sputtering method, a rare gas (typically argon), oxygen, or a mixed gas of a rare gas and oxygen is used as a sputtering gas, as appropriate. In the case of using the mixed gas of a rare gas and oxygen, the proportion of oxygen to a rare gas is preferably increased. In addition, increasing the purity of a sputtering gas is necessary. For example, as an oxygen gas or an argon gas used for a sputtering gas, a gas which is highly purified to have a dew point of −40° C. or lower, preferably −80° C. or lower, further preferably −100° C. or lower, and still further preferably −120° C. or lower is used, whereby entry of moisture and the like into the oxide semiconductor film 509 can be minimized.

Furthermore, a chamber in a sputtering apparatus is preferably evacuated to be a high vacuum state (to the degree of approximately greater than or equal to $5\times10^{-7}$ Pa and less than or equal to $1\times10^{-4}$ Pa) with an adsorption vacuum evacuation pump such as a cryopump in order to remove water or the like, which serves as an impurity for the oxide semiconductor film 509, as much as possible. Alternatively, a turbo molecular pump and a cold trap are preferably combined so as to prevent a backflow of a gas, especially a gas containing carbon or hydrogen, from an exhaust system to the inside of the chamber.

Then, the oxide semiconductor film 509 is processed, so that the island-shaped oxide semiconductor film 508 is formed. Note that the insulating film 509a is processed into the island-shaped oxide semiconductor film 508a, and the oxide semiconductor film 509b is processed into the island-shaped oxide semiconductor film 508b (see FIG. 17).

Figure 18A:
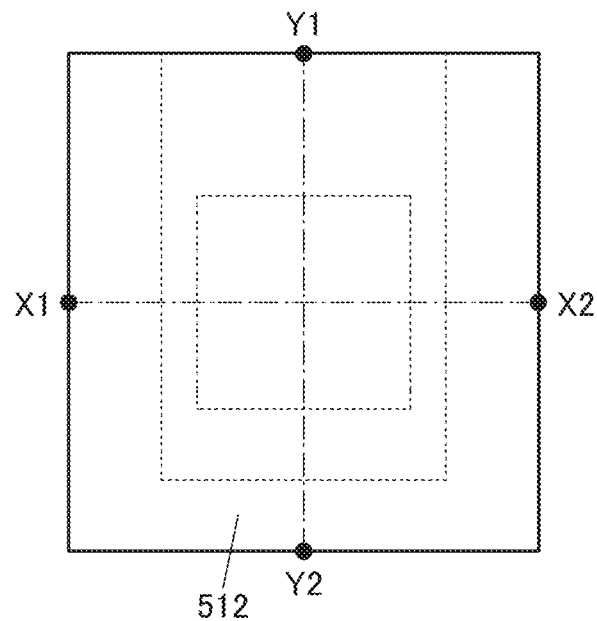
FIGS. 18A-18C A top view and cross-sectional views illustrating an example of a manufacturing process of a semiconductor device.
Figure 18B:
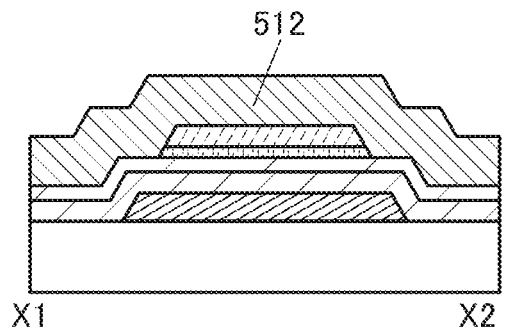
Figure 18C:
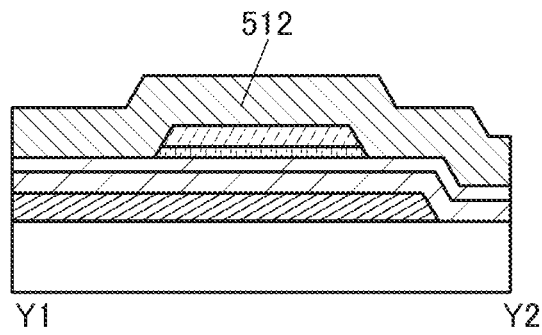

After that, a process at a temperature higher than the first temperature is not performed, and a conductive film 512 to be the source electrode and the drain electrode is formed over the insulating film 507 and the oxide semiconductor film 508 (see FIG. 18).

Figure 19A:
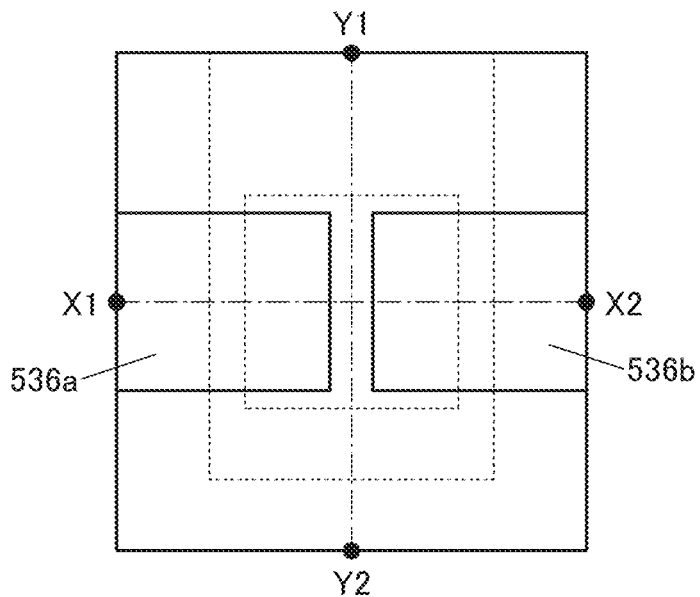
FIGS. 19A-19C A top view and cross-sectional views illustrating an example of a manufacturing process of a semiconductor device.
Figure 19B:
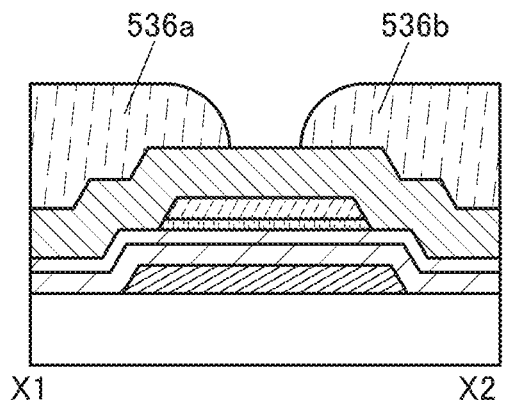
Figure 19C:
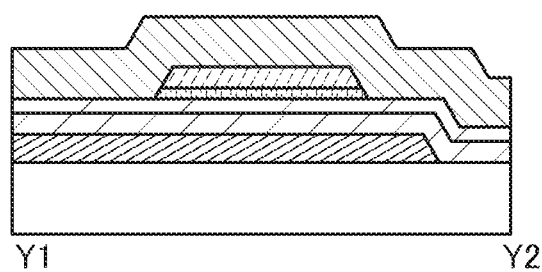

Next, a mask 536a and a mask 536b are formed in desired regions over the conductive film 512 (see FIG. 19).

In this embodiment, the mask 536a and the mask 536b are formed in such a manner that a photosensitive resin film is formed over the conductive film 512 and is patterned through a lithography process.

Figure 20A:
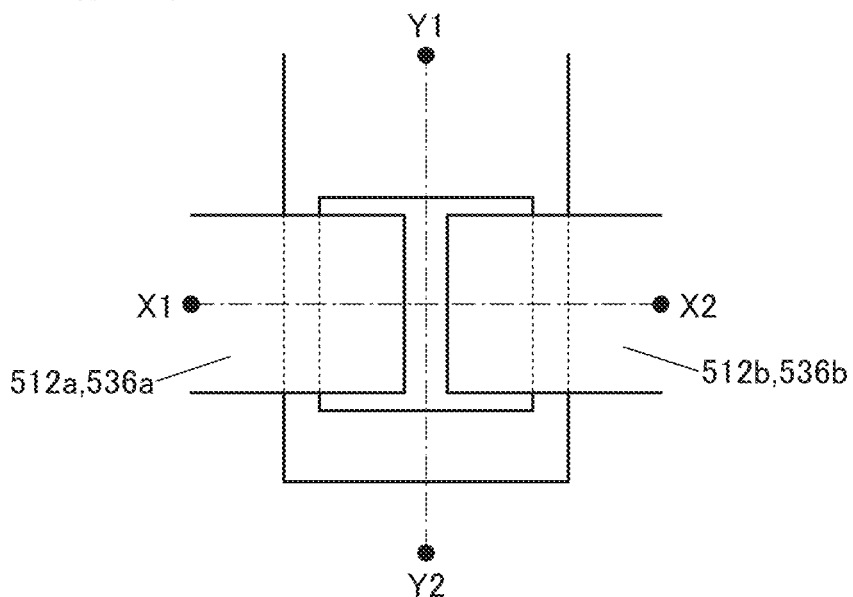
FIGS. 20A-20C A top view and cross-sectional views illustrating an example of a manufacturing process of a semiconductor device.
Figure 20B:
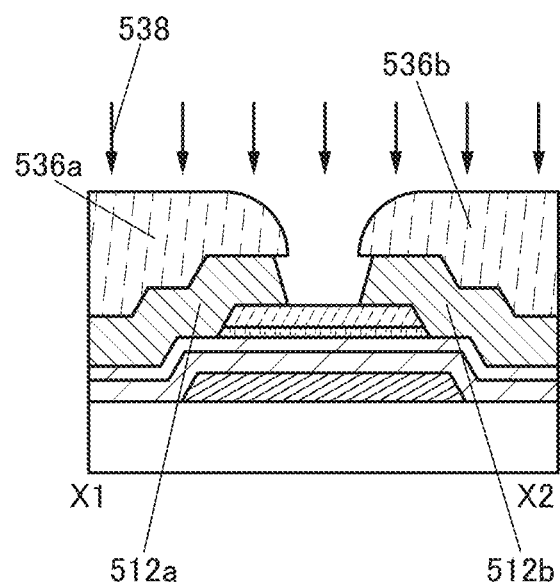
Figure 20C:
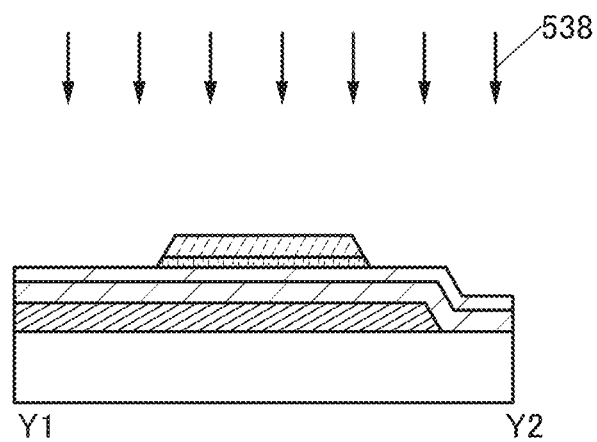

Then, an etchant 538 is applied from above the conductive film 512 and the mask 536a and the mask 536b so that the conductive film 512 is processed, whereby the conductive film 512a and the conductive film 512b separated from each other are formed (see FIG. 20).

In this embodiment, the conductive film 512 is processed with a dry etching apparatus. Note that a method for forming the conductive film 512 is not limited thereto. For example, the conductive film 512 and the oxide semiconductor film 508b may be processed using a chemical solution as the etchant 538 with a wet etching apparatus. Note that a finer pattern can be formed when a dry etching apparatus is used for processing the conductive film 512 than when a wet etching apparatus is used. However, when a wet etching apparatus is used for processing the conductive film 512, manufacturing cost can be more reduced than when a dry etching apparatus is used.

Figure 21A:
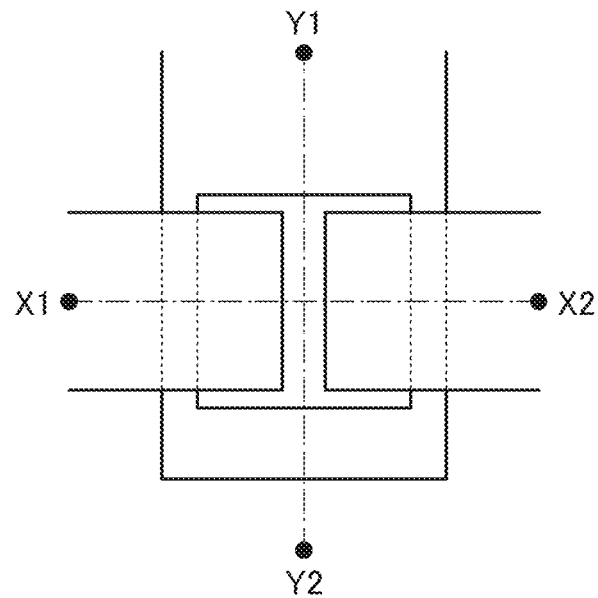
FIGS. 21A-21C A top view and cross-sectional views illustrating an example of a manufacturing process of a semiconductor device.
Figures 21B, 21C:
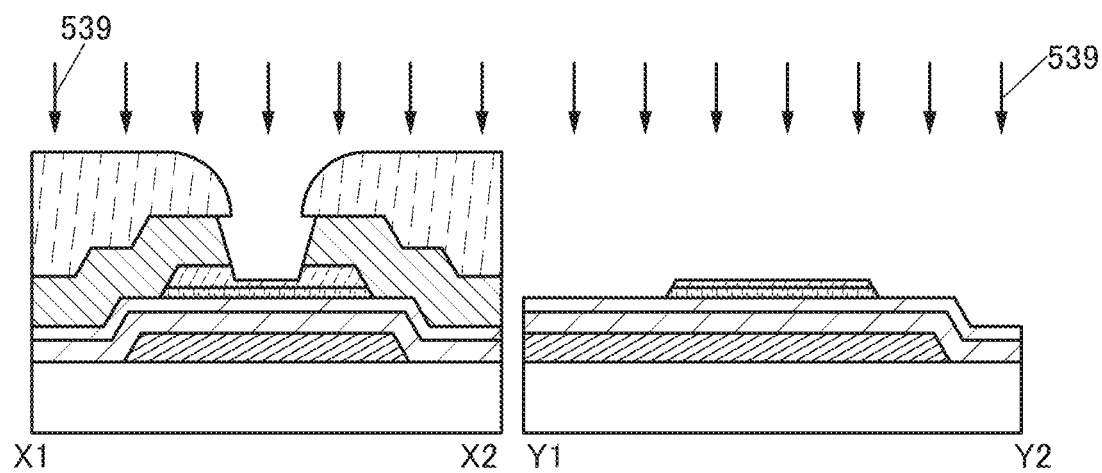

Then, with the use of an etchant 539, a surface of the oxide semiconductor film 508b is cleaned from above the oxide semiconductor film 508b, the conductive film 512a and the conductive film 512b, and the mask 536a and the mask 536b (see FIG. 21).

The cleaning may be performed, for example, using a chemical solution such as phosphoric acid. The cleaning using a chemical solution such as phosphoric acid can remove impurities (e.g., an element included in the conductive film 512a and the conductive film 512b) attached to the surface of the oxide semiconductor film 508b. Note that the cleaning is not necessarily performed; in some cases, the cleaning does not need to be performed.

Through the formation and/or the cleaning of the conductive film 512a and the conductive film 512b, a region of the oxide semiconductor film 508b which is not covered with the conductive film 512a or the conductive film 512b sometimes becomes thinner than the oxide semiconductor film 508a.

Figure 22A:
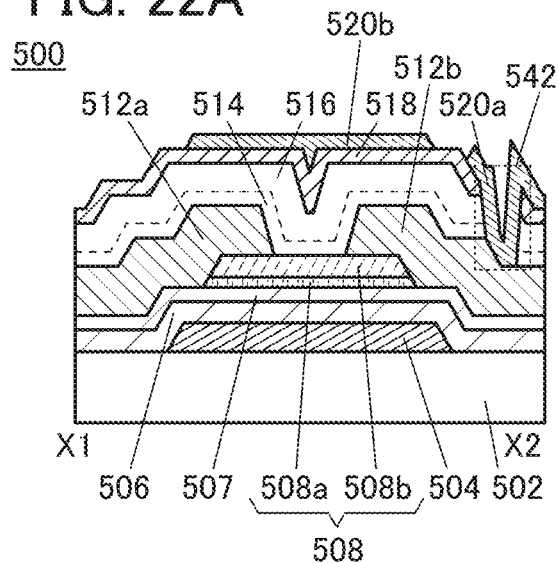
FIGS. 22A-22F Cross-sectional views illustrating embodiments of a semiconductor device.
Figure 22B:
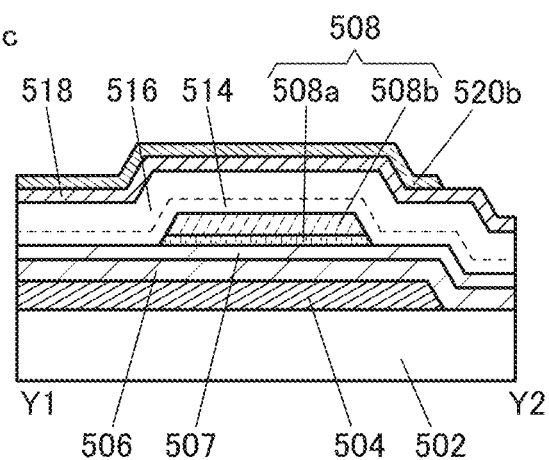
Figure 22C:
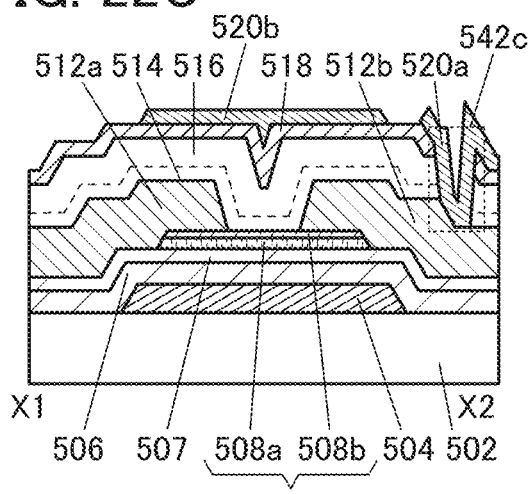
Figure 22D:
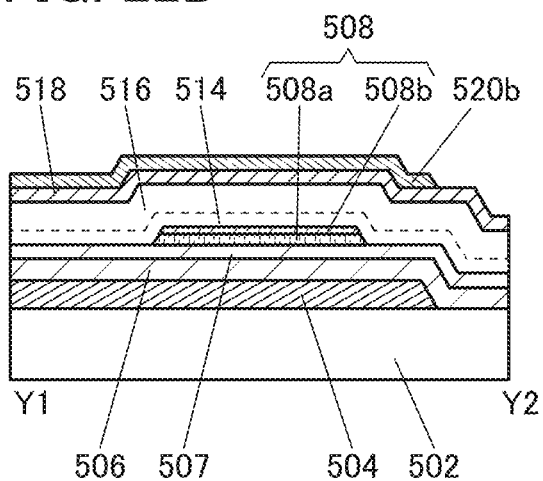
Figure 22E:
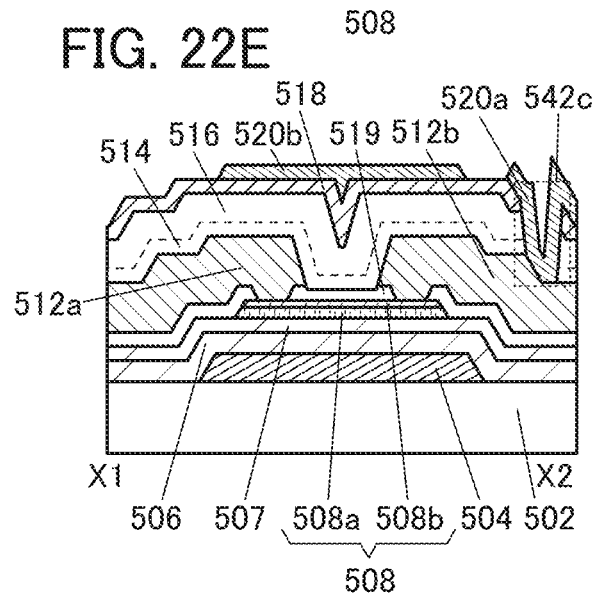
Figure 22F:
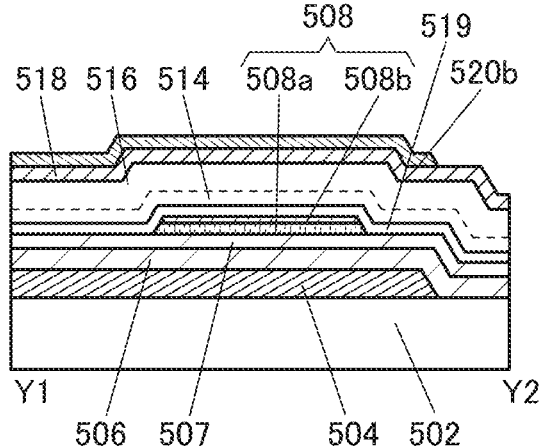
Figure 23A:
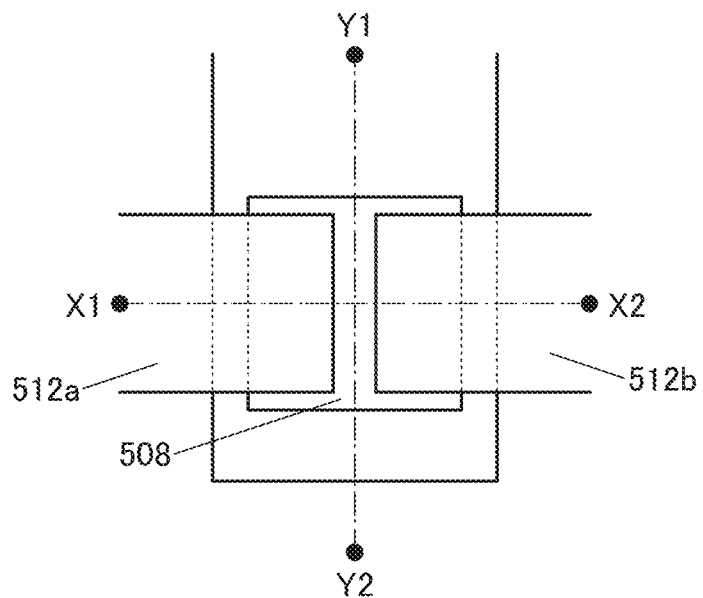
FIGS. 23A-23C A top view and cross-sectional views illustrating an example of a manufacturing process of a semiconductor device.
Figure 23B:
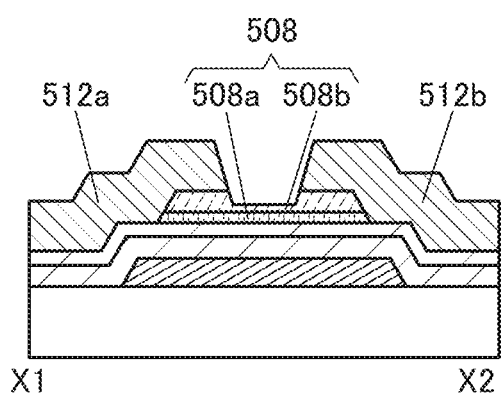
Figure 23C:
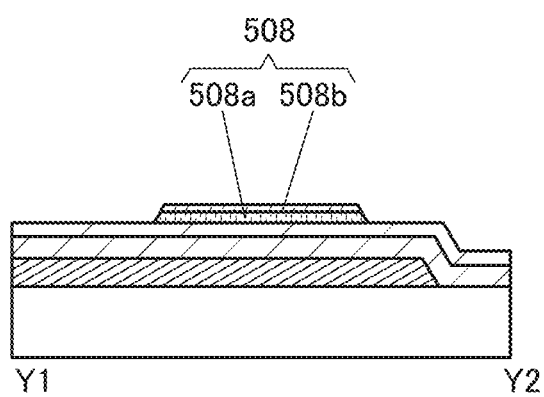

Note that, through the formation and/or the cleaning of the conductive film 512a and the conductive film 512b, the region of the oxide semiconductor film 508b which is exposed between the conductive film 512a and the conductive film 512b does not necessarily become thin. FIG. 22 illustrates examples of such a case. FIG. 22 shows cross-sectional views illustrating examples of a semiconductor device. FIGS. 22(A) and 22(B) illustrate an example of the case where the oxide semiconductor film 508b of the transistor 500 in FIG. 4 does not become thin. Alternatively, as illustrated in FIGS. 22(C) and 22(D), the oxide semiconductor film 508b may be formed thinner than the oxide semiconductor film 508a in advance, and the thickness of the region exposed between the conductive film 512a and the conductive film 512b may be equal to that in the transistor 500 in FIG. 4. Alternatively, as illustrated in FIGS. 22(E) and 22(F), the oxide semiconductor film 508b may be formed thinner than the oxide semiconductor film 508a in advance, and an insulating film 519 may further be formed over the oxide semiconductor film 508b and the insulating film 507. In this case, contact holes for electrically connecting the oxide semiconductor film 508b to the conductive films 512a and 512b are formed in the insulating film 519. The insulating film 519 can be formed using a material and a formation method similar to those of the insulating film 514.

Then, the mask 536a and the mask 536b are removed, whereby the conductive film 512a functioning as the source electrode and the conductive film 512b functioning as the drain electrode are formed over the oxide semiconductor film 508b. The oxide semiconductor film 508 has a layered structure of the oxide semiconductor film 508a and the oxide semiconductor film 508b (see FIG. 23).

Figure 24A:
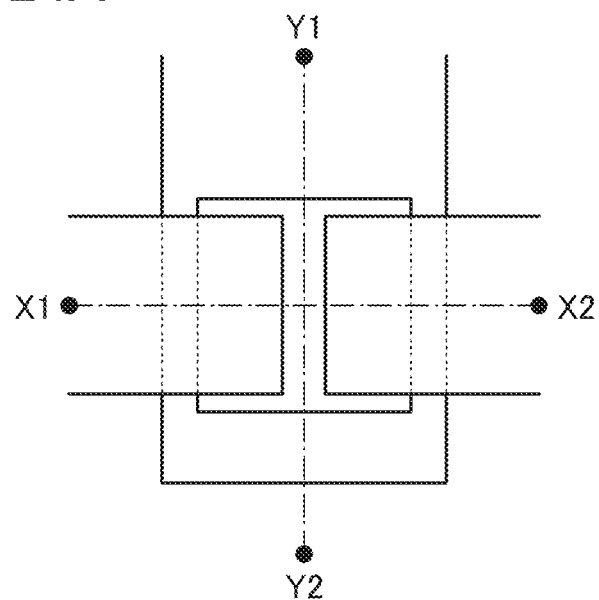
FIGS. 24A-24C A top view and cross-sectional views illustrating an example of a manufacturing process of a semiconductor device.
Figure 24B:
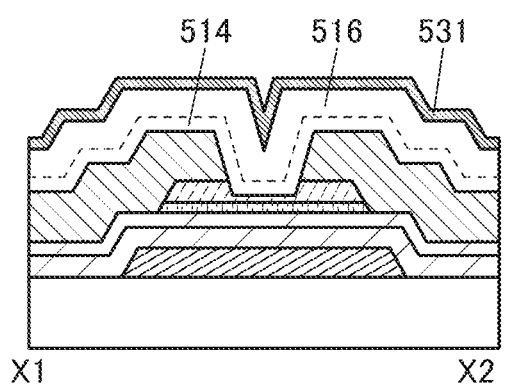
Figure 24C:
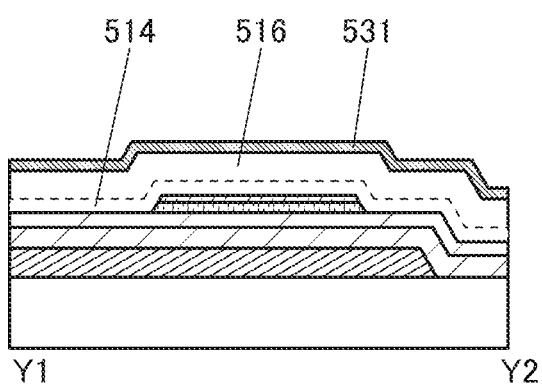

Next, the insulating film 514 and the insulating film 516 are formed over the oxide semiconductor film 508, the conductive film 512a, and the conductive film 512b, and then a barrier film 531 is formed (see FIG. 24).

Note that after the insulating film 514 is formed, the insulating film 516 is preferably formed in succession without exposure to the air. After the insulating film 514 is formed, the insulating film 516 is formed in succession by adjusting at least one of the flow rate of a source gas, pressure, a high-frequency power, and a substrate temperature without exposure to the air, whereby the concentration of impurities attributed to the atmospheric component at the interface between the insulating film 514 and the insulating film 516 can be reduced, and oxygen in the insulating film 514 and the insulating film 516 can be moved to the oxide semiconductor film 508; accordingly, the number of oxygen vacancies in the oxide semiconductor film 508 can be reduced.

For example, as the insulating film 514, a silicon oxynitride film can be formed by a PECVD method. In this case, a deposition gas containing silicon and an oxidizing gas are preferably used as a source gas. Typical examples of the deposition gas containing silicon include silane, disilane, trisilane, and silane fluoride. Examples of the oxidizing gas include dinitrogen monoxide and nitrogen dioxide. An insulating film containing nitrogen and having a small number of defects can be formed as the insulating film 514 by a PECVD method under the conditions where the flow rate of the oxidizing gas is higher than 20 times and lower than 100 times, preferably higher than or equal to 40 times and lower than or equal to 80 times, that of the deposition gas; and the pressure in a process chamber is lower than 100 Pa, preferably lower than or equal to 50 Pa.

As the insulating film 516, for example, a silicon oxide film or a silicon oxynitride film is formed under the conditions where the substrate placed in a process chamber of the PECVD apparatus, which is vacuum-evacuated, is held at a temperature higher than or equal to 180° C. and lower than or equal to 350° C., the pressure is greater than or equal to 100 Pa and less than or equal to 250 Pa, preferably greater than or equal to 100 Pa and less than or equal to 200 Pa, with introduction of a source gas into the process chamber, and a high-frequency power greater than or equal to 0.17 W/cm² and less than or equal to 0.5 W/cm², preferably greater than or equal to 0.25 W/cm² and less than or equal to 0.35 W/cm², is supplied to an electrode provided in the process chamber.

As the deposition conditions of the insulating film 516, the high-frequency power having the above power density is supplied to a reaction chamber having the above pressure, whereby the degradation efficiency of the source gas in plasma is increased, oxygen radicals are increased, and oxidation of the source gas is promoted; thus, the oxygen content in the insulating film 516 becomes higher than that in the stoichiometric composition. On the other hand, in the film formed at a substrate temperature within the above temperature range, the bond between silicon and oxygen is weak, and accordingly, part of oxygen in the film is released by heat treatment in a later step. Thus, an oxide insulating film which contains oxygen in excess of that in the stoichiometric composition and from which part of oxygen is released by heating can be formed.

Note that the insulating film 514 functions as a protective film for the oxide semiconductor film 508 in the step of forming the insulating film 516. Therefore, the insulating film 516 can be formed using the high-frequency power having a high power density while damage to the oxide semiconductor film 508 is reduced.

Note that in the deposition conditions of the insulating film 516, when the flow rate of the deposition gas containing silicon with respect to the oxidizing gas is increased, the number of defects in the insulating film 516 can be reduced. Typically, it is possible to form an oxide insulating film in which the number of defects is small, that is, the spin density of a signal which appears at g=2.001 owing to a dangling bond of silicon is lower than $6\times10^{17}$ spins/cm³, preferably lower than or equal to $3\times10^{17}$ spins/cm³, and further preferably lower than or equal to $1.5\times10^{17}$ spins/cm³, by ESR measurement. As a result, the reliability of the transistor can be improved.

After the insulating film 514 and the insulating film 516 are formed (i.e., after the insulating film 516 is formed and before the barrier film 531 is formed), heat treatment may be performed. The heat treatment can reduce nitrogen oxide contained in the insulating film 514 and the insulating film 516. By the heat treatment, part of oxygen contained in the insulating film 514 and the insulating film 516 can be moved to the oxide semiconductor film 508, so that the number of oxygen vacancies in the oxide semiconductor film 508 can be reduced.

The temperature of the heat treatment performed on the insulating film 514 and the insulating film 516 is typically up to 400° C., preferably lower than 375° C., further preferably higher than or equal to 150° C. and lower than 360° C., and still further preferably higher than or equal to 350° C. and lower than or equal to 360° C. The heat treatment may be performed under an atmosphere of nitrogen, oxygen, ultra-dry air (air in which the water content is 20 ppm or less, preferably 1 ppm or less, further preferably 10 ppb or less), or a rare gas (argon, helium, or the like). Note that it is preferable that hydrogen, water, and the like not be contained in the nitrogen, oxygen, ultra-dry air, or a rare gas. For the heat treatment, an electric furnace, an RTA apparatus, or the like can be used.

The barrier film 531 contains oxygen and metal (at least one of indium, zinc, titanium, aluminum, tungsten, tantalum, molybdenum, hafnium, and yttrium). Indium tin oxide (also referred to as ITO), indium tin silicon oxide (also referred to as ITSO), or indium oxide is preferably used for the barrier film 531 because unevenness can be favorably covered.

The barrier film 531 can be formed by, for example, a sputtering method. When the barrier film 531 is thin, it is sometimes difficult to inhibit release of oxygen from the insulating film 516 to the outside. In contrast, when the barrier film 531 is thick, oxygen cannot be favorably added to the insulating film 516 in some cases. Therefore, the thickness of the barrier film 531 is preferably greater than or equal to 1 nm and less than or equal to 20 nm, further preferably greater than or equal to 2 nm and less than or equal to 10 nm. In this embodiment, a 5-nm-thick ITSO film is formed as the barrier film 531.

After that, oxygen 540 is added to the insulating film 516 through the barrier film 531. Note that the drawing schematically illustrates the oxygen 540a as oxygen added to the insulating film 516 (see FIG. 25). The oxygen 540 is also added to the insulating film 514 in some cases.

As a method for adding the oxygen 540 to the insulating film 516 through the barrier film 531, an ion doping method, an ion implantation method, a plasma treatment method, or the like can be used. The oxygen 540 may be excess oxygen, oxygen radicals, or the like. By the bias application to the substrate side when the oxygen 540 is added, the oxygen 540 can be effectively added to the insulating film 516. As the bias, for example, power density can be greater than or equal to 1 W/cm$^2$ and less than or equal to 5 W/cm$^2$. When the barrier film 531 is provided over the insulating film 516 and then oxygen is added, the barrier film 531 functions as a protective film for inhibiting release of oxygen from the insulating film 516. Thus, a larger amount of oxygen can be added to the insulating film 516.

Figure 26A:
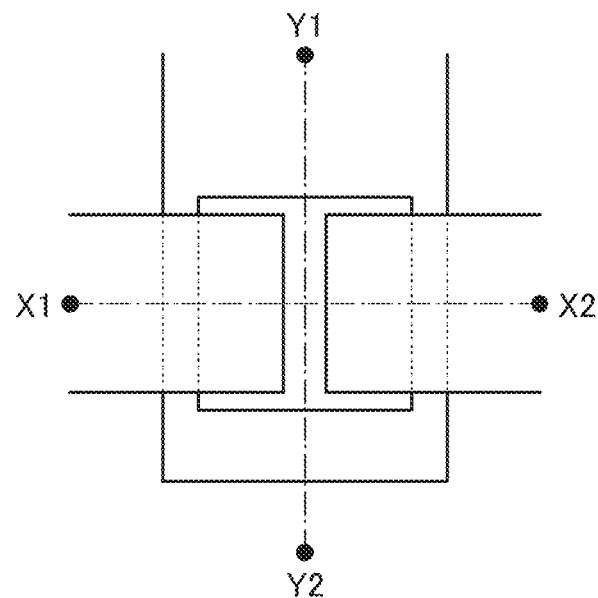
FIGS. 26A-26C A top view and cross-sectional views illustrating an example of a manufacturing process of a semiconductor device.
Figures 26B, 26C:
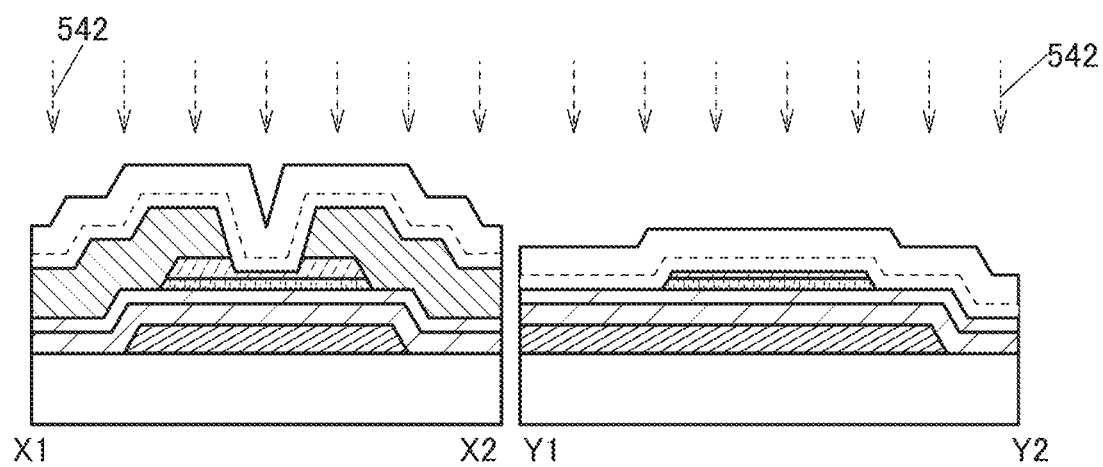

Next, the barrier film 531 or part of the barrier film 531, and part of the insulating film 516 are removed using an etchant 542 (see FIG. 26).

As a method for removing the barrier film 531 and part of the insulating film 516, a dry etching method, a wet etching method, a combination of a dry etching method and a wet etching method, and the like can be given. Note that the etchant 542 is an etching gas in the case of a dry etching method and is a chemical solution in the case of a wet etching method. In this embodiment, the barrier film 531 is removed by a wet etching method. A wet etching method is suitable for removing the barrier film 531 because manufacturing cost can be saved in that case.

Figure 27A:
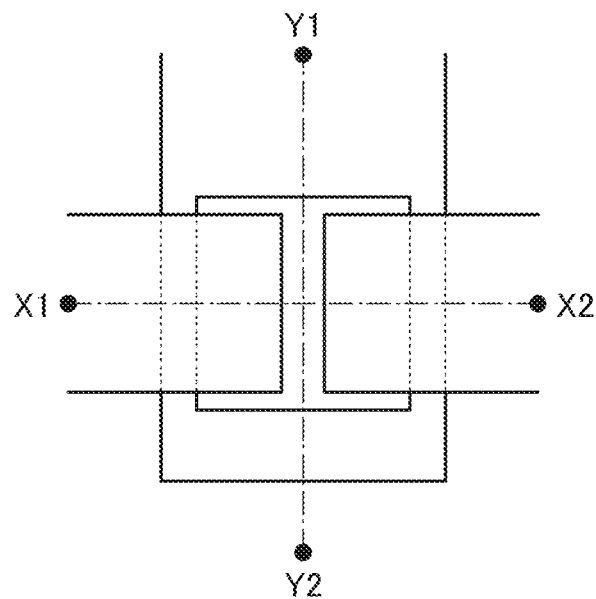
FIGS. 27A-27C A top view and cross-sectional views illustrating an example of a manufacturing process of a semiconductor device.
Figure 27B:
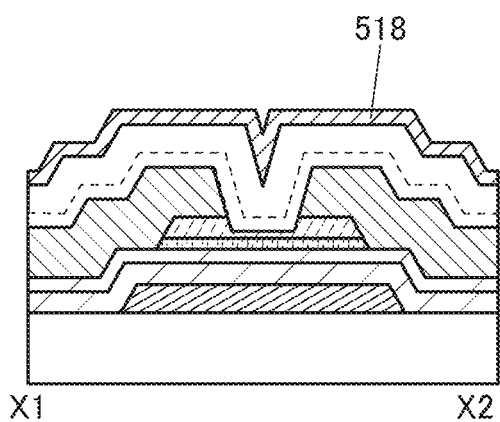
Figure 27C:
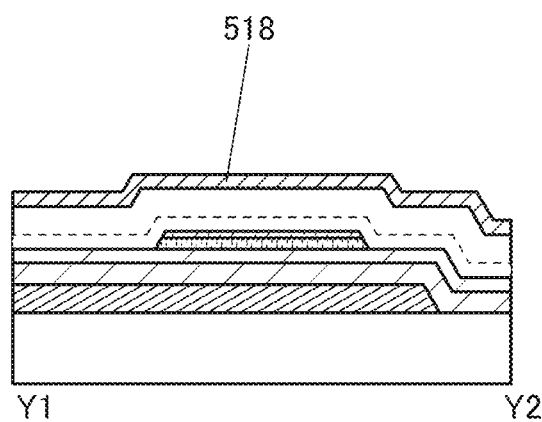

Next, the insulating film 518 is formed over the insulating film 516 (see FIG. 27).

In the case where the insulating film 518 is formed by a PECVD method, the substrate temperature is up to 400° C., preferably lower than 375° C., further preferably higher than or equal to 340° C. and lower than or equal to 360° C. When the substrate temperature at which the insulating film 518 is formed is within the above range, the above-described excess oxygen or the above-described oxygen radicals can be diffused into the oxide semiconductor film 508. Furthermore, the substrate temperature at which the insulating film 518 is formed is preferably within the above range, in which case a dense film can be formed.

For example, in the case where a silicon nitride film is formed by a PECVD method as the insulating film 518, a deposition gas containing silicon, nitrogen, and ammonia are preferably used as a source gas. The amount of ammonia is made smaller than that of nitrogen, whereby ammonia is dissociated in the plasma and activated species are generated. The activated species cleave a bond between silicon and hydrogen which are contained in a deposition gas containing silicon and a triple bond between nitrogen molecules. As a result, a dense silicon nitride film having few defects, in which bonds between silicon and nitrogen are promoted and bonds between silicon and hydrogen are few, can be formed. On the other hand, when the amount of ammonia with respect to nitrogen is large, decomposition of a deposition gas containing silicon and decomposition of nitrogen are not promoted, so that a sparse silicon nitride film in which bonds between silicon and hydrogen remain and defects are increased is formed. Therefore, the flow rate ratio of nitrogen to ammonia in the source gas is set to be greater than or equal to 5:1 and less than or equal to 50:1, preferably greater than or equal to 10:1 and less than or equal to 50:1.

Note that heat treatment may be performed after the insulating film 518 is formed. Through the heat treatment after the insulating film 518 is formed, excess oxygen or oxygen radicals in the insulating film 516 can be diffused into the oxide semiconductor film 508 to fill oxygen vacancies in the oxide semiconductor film 508. Alternatively, the insulating film 518 may be formed while heat treatment is performed, whereby excess oxygen or oxygen radicals in the insulating film 516 can be diffused into the oxide semiconductor film 508 to fill oxygen vacancies in the oxide semiconductor film 508.

Figure 28B:
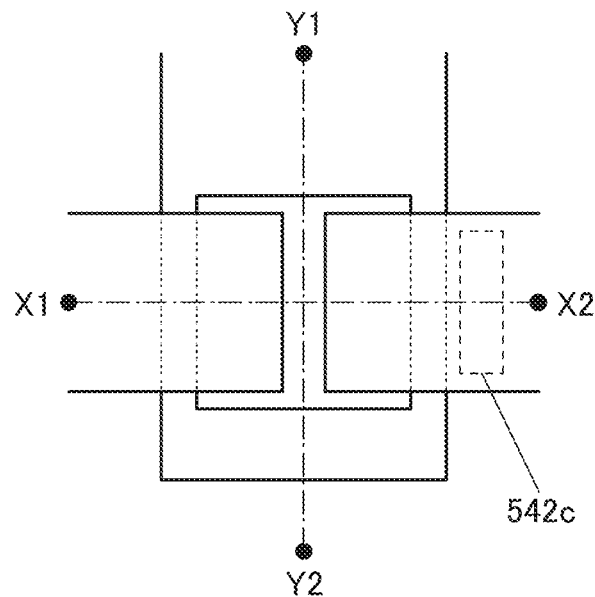
FIGS. 28A-28C A top view and cross-sectional views illustrating an example of a manufacturing process of a semiconductor device.
Figures 28A, 28C:
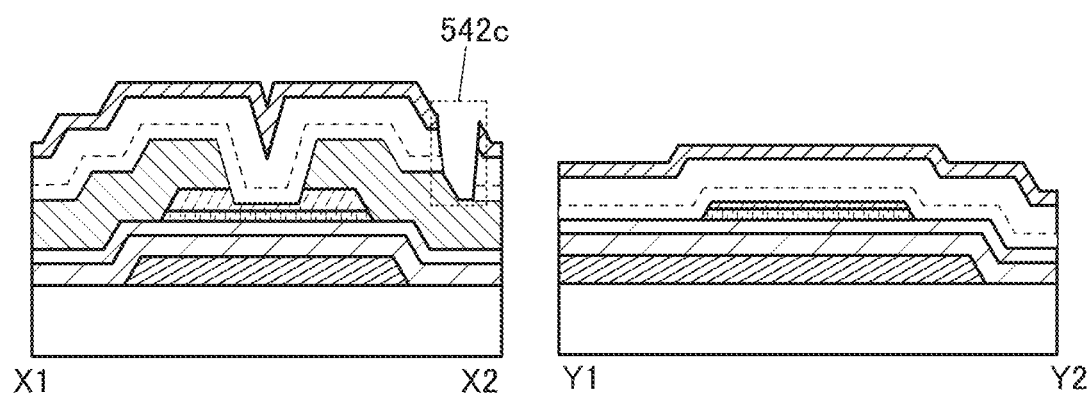

Next, a mask is formed over the insulating film 518 through a lithography process, and the contact hole 542c which reaches the conductive film 512b is formed in desired regions of the insulating film 514, the insulating film 516, and the insulating film 518 (see FIG. 28).

Figure 29A:
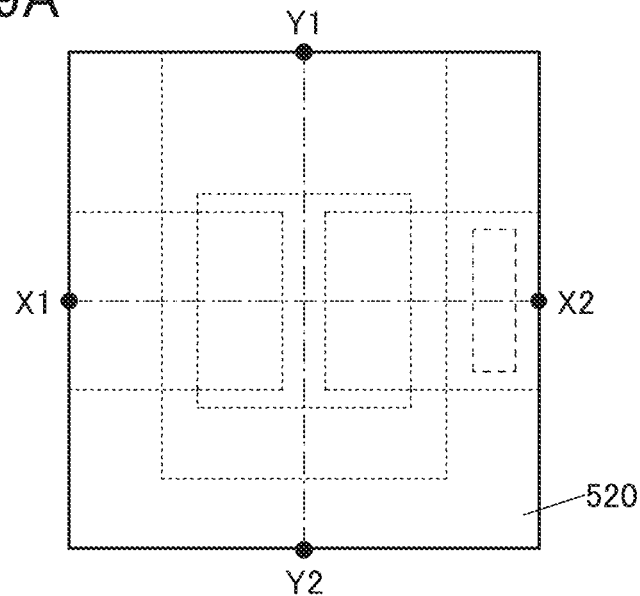
FIGS. 29A-29C A top view and cross-sectional views illustrating an example of a manufacturing process of a semiconductor device.
Figure 29B:
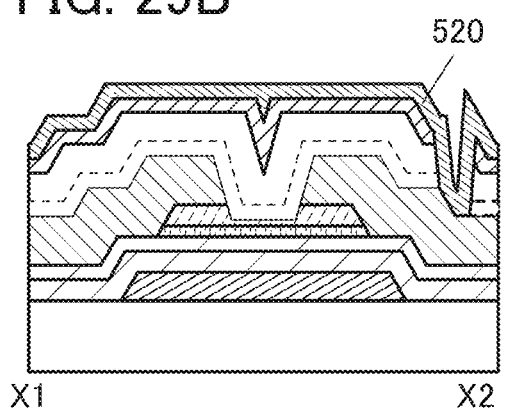
Figure 29C:
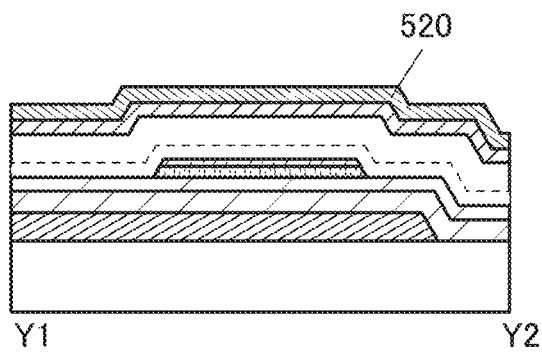

Next, a conductive film 520 is formed over the insulating film 518 to cover the contact hole 542c (see FIG. 29).

Figure 30A:
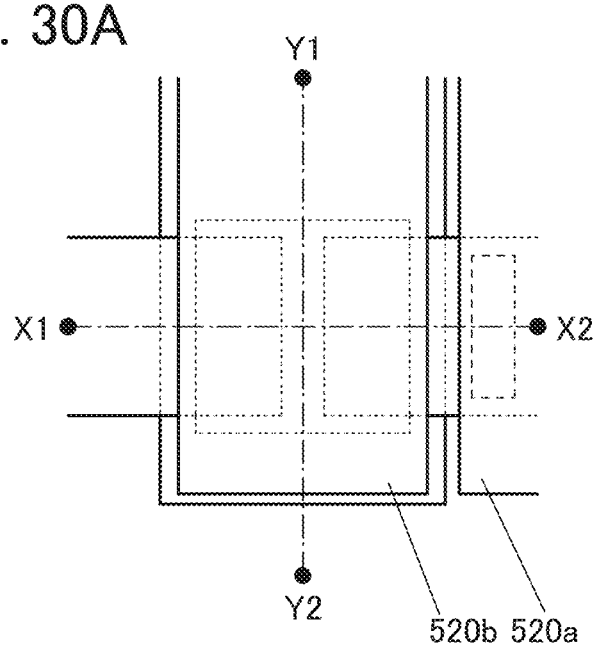
FIGS. 30A-30C A top view and cross-sectional views illustrating an example of a manufacturing process of a semiconductor device.
Figure 30B:
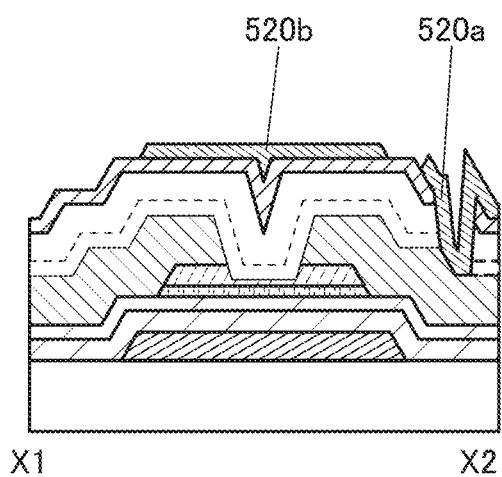
Figure 30C:
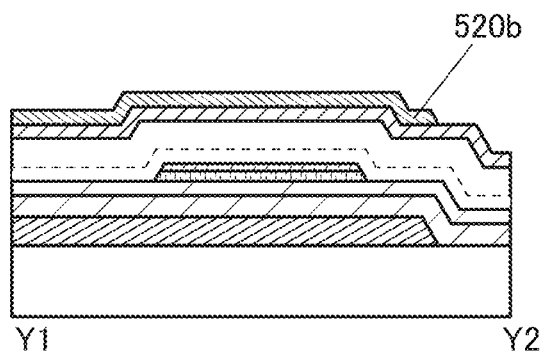

Next, a mask is formed over the conductive film 520 through a lithography process, and the conductive film 520 is processed into desired shapes to form the conductive film 520a and the conductive film 520b (see FIG. 30). As a method for forming the conductive film 520a and the conductive film 520b, for example, a dry etching method, a wet etching method, or a combination of a dry etching method and a wet etching method is used.

Note that the above-described variety of films such as the conductive films, the insulating films, and the oxide semiconductor films can be formed by another method, e.g., a thermal CVD method or an atomic layer deposition (ALD) method instead of the above-described methods. As an example of a thermal CVD method, an MOCVD (metal organic chemical vapor deposition) method can be given.

A thermal CVD method has an advantage that no defect due to plasma damage is generated since it does not utilize plasma for forming a film.

Deposition over a substrate by a thermal CVD method may be performed in such a manner that a source gas and an oxidizer are supplied to a chamber at a time, the pressure inside the chamber is set to an atmospheric pressure or a reduced pressure, and the source gas and the oxidizer react with each other in the vicinity of the substrate or over the substrate.

Deposition by an ALD method may be performed in such a manner that the pressure inside a chamber is set to an atmospheric pressure or a reduced pressure, source gases for reaction are sequentially introduced into the chamber, and then the sequence of the gas introduction is repeated. For example, two or more kinds of source gases are sequentially supplied to the chamber by switching respective switching valves (also referred to as high-speed valves). For example, a first source gas is introduced, an inert gas (e.g., argon or nitrogen) or the like is introduced when or after the first gas is introduced so that the source gases are not mixed, and then a second source gas is introduced. Note that in the case where the first source gas and the inert gas are introduced at a time, the inert gas serves as a carrier gas, and the inert gas may also be introduced at the same time as the second source gas. Alternatively, the first source gas may be exhausted by vacuum evacuation instead of the introduction of the inert gas, and then the second source gas may be introduced. The first source gas is adsorbed on the surface of the substrate to form a first layer; then the second source gas is introduced to react with the first layer; as a result, a second layer is stacked over the first layer, so that a thin film is formed. The sequence of the gas introduction is repeated a plurality of times until a desired thickness is obtained, whereby a thin film with excellent step coverage can be formed. The thickness of the thin film can be adjusted by the number of repetition times of the sequence of the gas introduction; therefore, an ALD method makes it possible to accurately adjust a thickness and thus is suitable for manufacturing a minute FET.

The variety of films such as the conductive films, the insulating films, the oxide semiconductor film, and the metal oxide film in this embodiment can be formed by a thermal CVD method such as an MOCVD method. For example, in the case where an In—Ga—ZnO film is formed, trimethylindium, trimethylgallium, and dimethylzinc are used. Note that the chemical formula of trimethylindium is $In(CH_3)_3$. The chemical formula of trimethylgallium is $Ga(CH_3)_3$. The chemical formula of dimethylzinc is $Zn(CH_3)_2$. Without limitation to the above combination, triethylgallium (chemical formula: $Ga(C_2H_5)_3$) can be used instead of trimethylgallium and diethylzinc (chemical formula: $Zn(C_2H_5)_2$) can be used instead of dimethylzinc.

For example, in the case where a hafnium oxide film is formed by a deposition apparatus using an ALD method, two kinds of gases, that is, ozone ($O_3$) as an oxidizer and a source gas which is obtained by vaporizing a liquid containing a solvent and a hafnium precursor compound (e.g., a hafnium alkoxide or a hafnium amide such as tetrakis(dimethylamide)hafnium (TDMAH)) are used. Note that the chemical formula of tetrakis(dimethylamide)hafnium is $Hf[N(CH_3)_2]_4$. Examples of another material liquid include tetrakis(ethylmethylamide)hafnium.

For example, in the case where an aluminum oxide film is formed by a deposition apparatus using an ALD method, two kinds of gases, e.g., $H_2O$ as an oxidizer and a source gas which is obtained by vaporizing a liquid containing a solvent and an aluminum precursor compound (e.g., trimethylaluminum (TMA)) are used. Note that the chemical formula of trimethylaluminum is $Al(CH_3)_3$. Examples of another material liquid include tris(dimethylamide)aluminum, triisobutylaluminum, and aluminum tris(2,2,6,6-tetramethyl-3,5-heptanedionate).

For example, in the case where a silicon oxide film is formed with a deposition apparatus using an ALD method, hexachlorodisilane is adsorbed on a surface where a film is to be formed, chlorine included in the adsorbate is removed, and radicals of an oxidizing gas (e.g., $O_2$ or dinitrogen monoxide) are supplied to react with the adsorbate.

For example, in the case where a tungsten film is formed with a deposition apparatus using an ALD method, a $WF_6$ gas and a $B_2H_6$ gas are sequentially and repeatedly introduced to form an initial tungsten film, and then a $WF_6$ gas and an $H_2$ gas are used to form a tungsten film. Note that an $SiH_4$ gas may be used instead of a $B_2H_6$ gas.

For example, in the case where an oxide semiconductor film, e.g., an In—Ga—ZnO film is formed with a deposition apparatus using an ALD method, an $In(CH_3)_3$ gas and an $O_3$ gas are sequentially and repeatedly introduced to form an In—O layer, then a $Ga(CH_3)_3$ gas and an $O_3$ gas are used to form a GaO layer, and then a $Zn(CH_3)_2$ gas and an $O_3$ gas are used to form a ZnO layer. Note that the order of these layers is not limited to this example. A mixed compound layer such as an In—Ga—O layer, an In—Zn—O layer, or a Ga—Zn—O layer may be formed by mixing these gases. Note that although an $H_2O$ gas which is obtained by bubbling with an inert gas such as Ar may be used instead of an $O_3$ gas, it is preferable to use an $O_3$ gas, which does not contain H. Furthermore, instead of an $In(CH_3)_3$ gas, an $In(C_2H_5)_3$ gas may be used. Instead of a $Ga(CH_3)_3$ gas, a $Ga(C_2H_5)_3$ gas may be used. Furthermore, a $Zn(CH_3)_2$ gas may be used.

Through the above process, the transistor 500 illustrated in FIG. 4 can be manufactured.

<Method 2 for Manufacturing Semiconductor Device>

Next, a method for manufacturing the transistor 500, which is different from the manufacturing method described with reference to FIG. 15 to FIG. 30, will be described below.

Figure 25A:
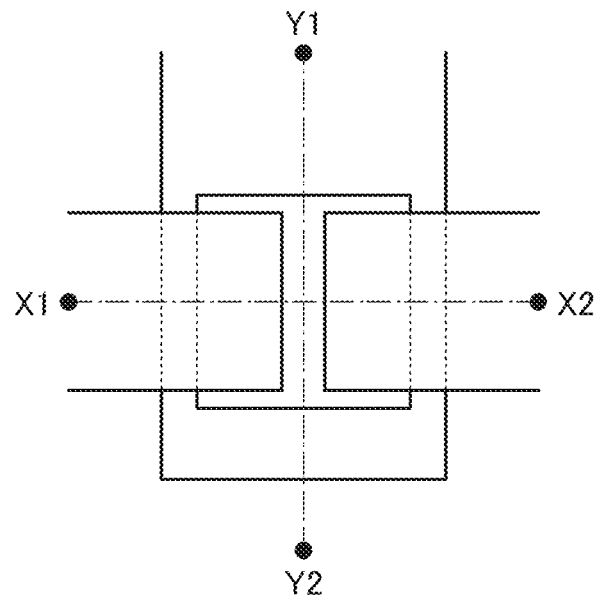
FIGS. 25A-25C A top view and cross-sectional views illustrating an example of a manufacturing process of a semiconductor device.
Figure 25B:
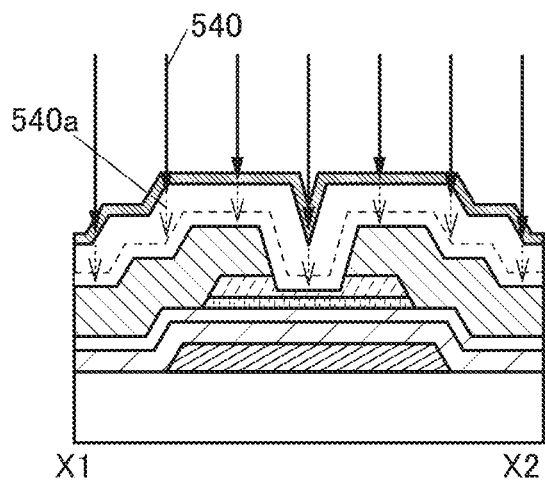
Figure 25C:
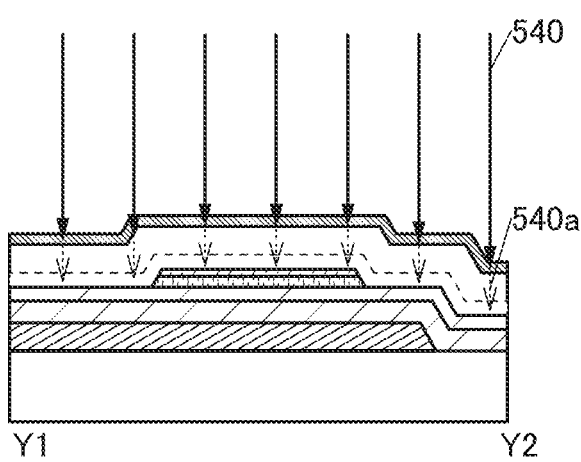

First, like in <Method 1 for manufacturing semiconductor device>, the steps illustrated in FIG. 15 to FIG. 24 are performed. After that, the steps illustrated in FIG. 25 to FIG. 27 are not performed, and the steps illustrated in FIG. 28 to FIG. 30 are performed.

In this case, it is preferable that a metal oxide film be used as the barrier film 531, and as the metal oxide film, aluminum oxide, hafnium oxide, or yttrium oxide be deposited.

When aluminum oxide, hafnium oxide, or yttrium oxide is deposited as the barrier film 531 by a sputtering method, a sputtering gas preferably contains at least oxygen. In some cases, oxygen for the sputtering gas for forming the barrier film 531 becomes oxygen radicals in plasma, and the oxygen and/or the oxygen radicals can be added to the insulating film 516. Thus, the step of adding the oxygen 540 illustrated in FIG. 25 can be skipped. In other words, the step of forming the barrier film 531 can double as oxygen adding treatment. The barrier film 531 has a function of adding oxygen during the formation of the first barrier film (in particular, at the initial stage of deposition), whereas it has a function of blocking oxygen after the formation of the barrier film 531.

In the case where aluminum oxide is deposited as the barrier film 531 by a sputtering method, a mixed layer is sometimes formed in the vicinity of the interface between the insulating film 516 and the barrier film 531. When the insulating film 516 is a silicon oxynitride film, $Al_xSi_yO_z$ is formed as the mixed layer in some cases.

In the case where aluminum oxide, hafnium oxide, or yttrium oxide is used for the barrier film 531, aluminum oxide, hafnium oxide, and yttrium oxide have a high insulating property and a high barrier property against oxygen. Thus, the step of removing the barrier film 531 illustrated in FIG. 26 and the step of forming the insulating film 518 illustrated in FIG. 27 are not necessarily performed. Therefore, the barrier film 531 has the same function as the insulating film 518.

Note that the barrier film 531 is formed while the substrate is heated at a temperature up to 400° C., preferably lower than 375° C., further preferably higher than or equal to 340° C. and lower than or equal to 360° C., whereby excess oxygen or oxygen radicals added to the insulating film 516 can be diffused into the oxide semiconductor film 508. Alternatively, after the barrier film 531 is formed, heat treatment is performed at a temperature up to 400° C., preferably lower than 375° C., further preferably higher than or equal to 340° C. and lower than or equal to 360° C., whereby excess oxygen or oxygen radicals added to the insulating film 516 can be diffused into the oxide semiconductor film 508.

In this manner, the use of aluminum oxide, hafnium oxide, or yttrium oxide for the barrier film 531 can shorten the manufacturing process of the semiconductor device and thus manufacturing cost can be saved.

The structure and method described in this embodiment can be used in appropriate combination with the structures and methods described in the other embodiments.

(Embodiment 3)

In this embodiment, the structure of a display device including a liquid crystal element as a display element will be described.

Figure 31:
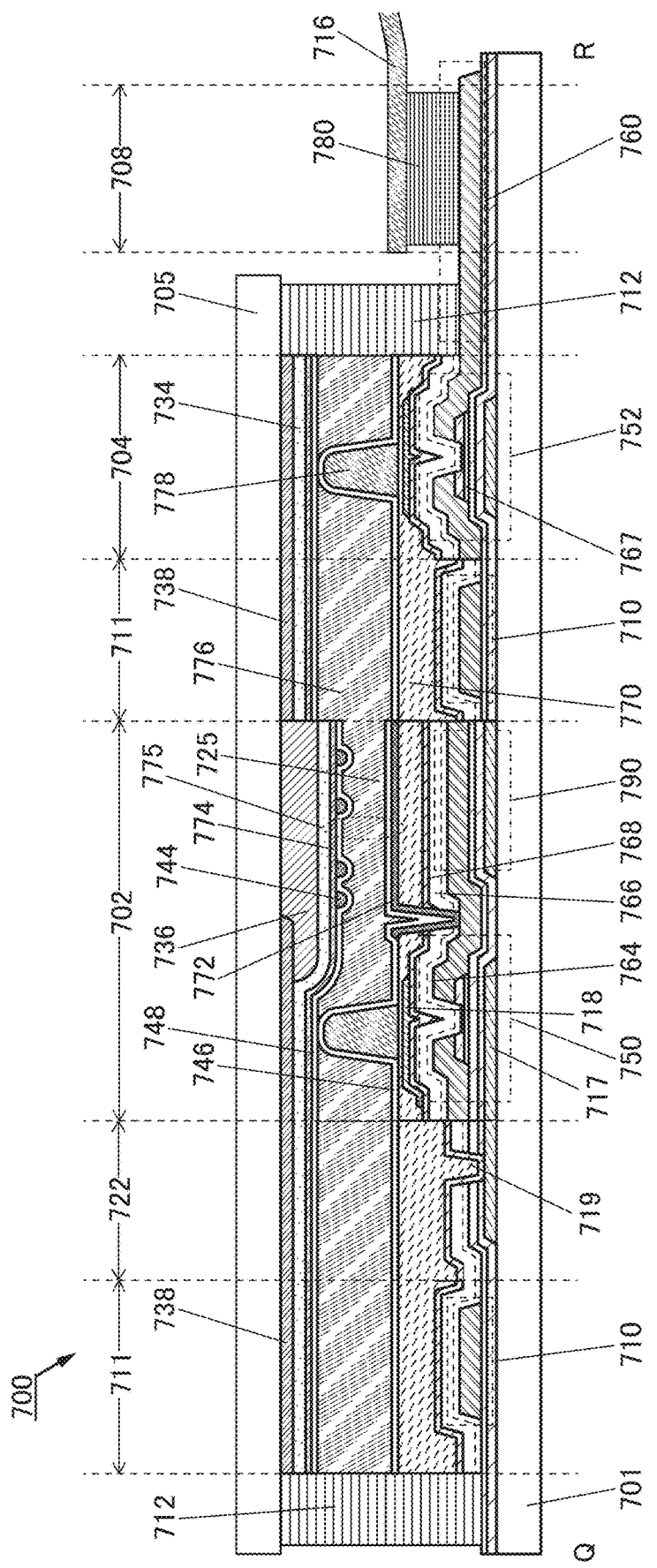
FIG. 31 A cross-sectional view illustrating one embodiment of a display device.

FIG. 31 is a cross-sectional view taken along the dashed-dotted line Q-R in FIG. 1(A). The semiconductor device 700 illustrated in FIG. 31 includes a lead wiring portion 711, the region 722, the pixel portion 702, the source driver 704, and the FPC terminal portion 708. Note that the lead wiring portion 711 includes the wiring 710. The pixel portion 702 includes a transistor 750 and a capacitor 790. The source driver 704 includes a transistor 752. The FPC terminal portion 708 includes a connection electrode 760, an anisotropic conductive film 780, and the FPC 716.

Any of the transistors described in Embodiment 2 can be used as the transistor 750 and the transistor 752.

The transistor 750 is placed over the scan line 717 in FIG. 1 to FIG. 3. A part of the scan line 717 serves as a first gate electrode of the transistor 750. Furthermore, a part of the wiring 718 which is placed to overlap with the scan line 717 serves as a second gate electrode of the transistor 750.

The scan line 717 and the wiring 718 are electrically connected to each other through the contact hole 719 formed in the region 722.

The transistors used in this embodiment each include an oxide semiconductor film which is highly purified and in which formation of oxygen vacancy is suppressed. In the transistors, the current in an off state (off-state current) can be made small. Accordingly, an electrical signal such as an image signal can be held for a longer period, and a writing interval can be set longer in an on state. Accordingly, the frequency of refresh operation can be reduced, which leads to an effect of reducing power consumption.

In addition, the transistors used in this embodiment can have high field-effect mobility and thus are capable of high-speed operation. For example, with such a transistor that can operate at high speed used for a liquid crystal display device, a transistor in a pixel portion and a transistor in a driver circuit portion can be formed over one substrate. That is, a semiconductor device formed using a silicon wafer or the like is not additionally needed as a driver circuit, by which the number of components of the semiconductor device can be reduced. In addition, the transistor that can operate at high speed can be used also in the pixel portion, whereby a high-quality image can be provided.

The capacitor 790 has a structure in which a dielectric is provided between a pair of electrodes. Specifically, a conductive film which is formed through the same process as the scan line 717 is used as one electrode of the capacitor 790, and the conductive film functioning as a source electrode or a drain electrode of the transistor 750 is used as the other electrode of the capacitor 790. Furthermore, an insulating film functioning as a gate insulating film of the transistor 750 is used as the dielectric between the pair of electrodes.

In FIG. 31, an insulating film 764, an insulating film 766, an insulating film 768, and a planarization insulating film 770 are provided over the transistor 750, the transistor 752, and the capacitor 790.

The insulating film 764, the insulating film 766, and the insulating film 768 can be formed using materials and methods similar to those of the insulating film 514, the insulating film 516, and the insulating film 518 described in Embodiment 2, respectively. The planarization insulating film 770 can be formed using a heat-resistant organic material, such as a polyimide resin, an acrylic resin, a polyimide amide resin, a benzocyclobutene resin, a polyamide resin, or an epoxy resin. Note that the planarization insulating film 770 may be formed by stacking a plurality of insulating films formed using these materials. Alternatively, a structure without the planarization insulating film 770 may be employed.

The wiring 710 is formed through the same process as conductive films functioning as the source electrode and the drain electrode of the transistor 750 or the transistor 752. In the case where the wiring 710 is formed using a material containing copper, wiring resistance can be reduced.

The connection electrode 760 is formed through the same process as the conductive films functioning as the source electrode and the drain electrode of the transistor 750 or the transistor 752. The connection electrode 760 is electrically connected to a terminal included in the FPC 716 through the anisotropic conductive film 780.

A structure 778 is provided between the first substrate 701 and the second substrate 705. The structure 778 is a columnar spacer obtained by selective etching of an insulating film and is provided to control the thickness (cell gap) between the first substrate 701 and the second substrate 705. Note that a spherical spacer may be used as the structure 778.

Although the example in which the structure 778 is provided on the first substrate 701 side is described in this embodiment, one embodiment of the present invention is not limited thereto. For example, the structure 778 may be provided on the second substrate 705 side, or both the first substrate 701 and the second substrate 705 may be provided with the structure 778.

A light-blocking film 738 functioning as a black matrix, a coloring layer 736 functioning as a color filter, and an insulating film 734 in contact with the light-blocking film 738 and the coloring layer 736 are provided on the second substrate 705 side.

The semiconductor device 700 includes a liquid crystal element 775. The liquid crystal element 775 includes a conductive film 772, a conductive film 774, and a liquid crystal layer 776. The conductive film 774 is provided on the second substrate 705 side and functions as a counter electrode. The semiconductor device 700 is capable of displaying an image in such a manner that transmission or non-transmission of light is controlled by change in the alignment state of the liquid crystal layer 776 depending on a voltage applied to the conductive film 772 and the conductive film 774. A protrusion 744 is provided on the conductive film 774.

The conductive film 772 is connected to the conductive film functioning as the source electrode or the drain electrode included in the transistor 750. The conductive film 772 is formed over the planarization insulating film 770 to function as a pixel electrode, i.e., one electrode of the display element. The conductive film 772 functions as a reflective electrode. The semiconductor device 700 is what is called a reflective color liquid crystal display device in which external light is reflected by the conductive film 772 to display an image through the coloring layer 736.

A conductive film that transmits visible light or a conductive film that reflects visible light can be used as the conductive film 772. For example, a material including one kind selected from indium (In), zinc (Zn), and tin (Sn) is preferably used for the conductive film that transmits visible light. For example, a material including aluminum or silver may be used for the conductive film that reflects visible light. In this embodiment, a conductive film that reflects visible light is used as the conductive film 772.

In the case where a conductive film which reflects visible light is used as the conductive film 772, the conductive film may have a stacked-layer structure. For example, a 100-nm-thick aluminum film is formed as the bottom layer, and a 30-nm-thick silver alloy film (e.g., an alloy film including silver, palladium, and copper) is formed as the top layer. Such a structure makes it possible to obtain the following effects.

(1) Adhesion between the base film and the conductive film 772 can be improved. (2) The aluminum film and the silver alloy film can be collectively etched depending on a chemical solution. (3) The conductive film 772 can have a favorable cross-sectional shape (e.g., a tapered shape). The reason for (3) is as follows: the etching rate of the aluminum film with the chemical solution is lower than that of the silver alloy film, or etching of the aluminum film that is the bottom layer is developed faster than that of the silver alloy film because when the aluminum film that is the bottom layer is exposed after the etching of the silver alloy film that is the top layer, electrons are extracted from metal that is less noble than the silver alloy film, i.e., aluminum that is metal having a high ionization tendency, and thus etching of the silver alloy film is suppressed.

Note that the semiconductor device 700 in FIG. 31 is a reflective color liquid crystal display device given as an example, but a display type is not limited thereto. For example, a transmissive color liquid crystal display device in which the conductive film 772 is a conductive film that transmits visible light may be used. In the case where the semiconductor device 700 is a transmissive liquid crystal display device, a pair of electrodes included in the capacitor 790 is provided in a position not overlapping with the conductive film 772. Furthermore, each of the layers provided on a path of light that is incident on the substrate 701 and is extracted through the liquid crystal element 775 and the coloring layer 736 is preferably a layer that transmits visible light.

Although not illustrated in FIG. 31, an optical member (an optical substrate) such as a polarizing member, a retardation member, or an anti-reflection member, and the like may be provided as appropriate. For example, circular polarization may be employed by using a polarizing substrate and a retardation substrate. In addition, a backlight, a side light, or the like may be used as a light source.

The structure described in this embodiment can be used in appropriate combination with the structure described in any of the other embodiments.

(Embodiment 4)

In this embodiment, a memory device including the semiconductor device of one embodiment of the present invention will be described with reference to FIG. 32 to FIG. 36.

Figure 32A:
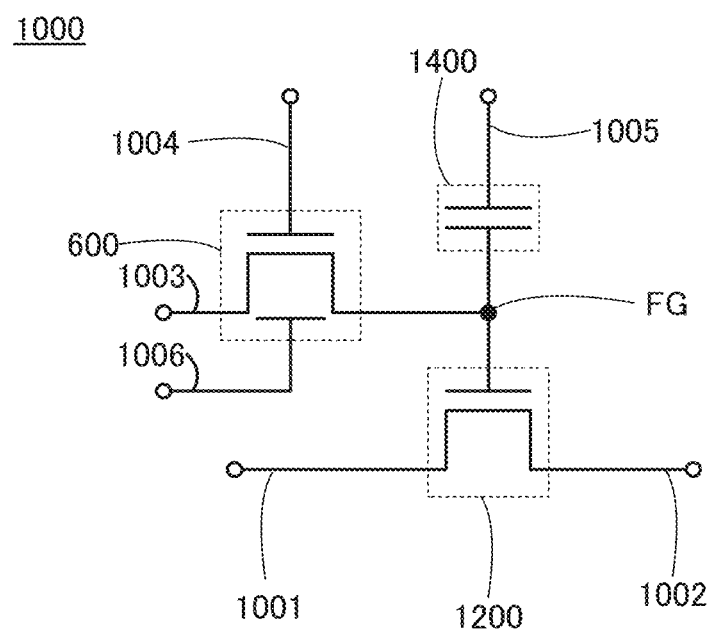
FIGS. 32A-32B Circuit diagrams each illustrating one embodiment of a memory device.

FIG. 32(A) shows a circuit diagram of a cell 1000 included in a memory device of this embodiment and illustrates a transistor 1200, a transistor 600, and a capacitor 1400.

As described above in Embodiment 2, the transistor 600 including an oxide semiconductor has low off-state current. Thus, stored data can be retained for a long period at a specific node of the semiconductor device. In other words, power consumption of the semiconductor device can be reduced because refresh operation becomes unnecessary or the frequency of refresh operation can be extremely low.

In the cell 1000, a first wiring 1001 is electrically connected to one of a source electrode and a drain electrode of the transistor 1200, and a second wiring 1002 is electrically connected to the other of the source electrode and the drain electrode of the transistor 1200. A third wiring 1003 is electrically connected to one of a source electrode and a drain electrode of the transistor 600 and a fourth wiring 1004 is electrically connected to a first gate electrode of the transistor 600. A gate electrode of the transistor 1200 and the other of the source electrode and the drain electrode of the transistor 600 are electrically connected to one electrode of the capacitor 1400 and a fifth wiring 1005 is electrically connected to the other electrode of the capacitor 1400. A sixth wiring 1006 is electrically connected to a second gate electrode (also referred to as a back gate electrode) of the transistor 600.

The memory device including the cell 1000 has a feature that the potential of the gate of the transistor 1200 can be retained, and thus enables writing, retaining, and reading of data as follows.

Writing and retaining of data will be described. First, the potential of the fourth wiring 1004 is set to a potential at which the transistor 600 is turned on, so that the transistor 600 is turned on. Accordingly, the potential of the third wiring 1003 is supplied to a node FG where the gate of the transistor 1200 and the one electrode of the capacitor 1400 are electrically connected to each other. That is, a predetermined charge is supplied to the gate of the transistor 1200 (writing). Here, one of two kinds of charges providing different potential levels (hereinafter referred to as a low-level charge and a high-level charge) is supplied. After that, the potential of the fourth wiring 1004 is set to a potential at which the transistor 600 is turned off, so that the transistor 600 is turned off. Thus, the charge is retained at the node FG (retaining).

Since the off-state current of the transistor 600 is small, the charge of the node FG is retained for a long time.

Next, reading of data is described. An appropriate potential (a reading potential) is supplied to the fifth wiring 1005 while a predetermined potential (a constant potential) is supplied to the first wiring 1001, whereby the potential of the second wiring 1002 varies depending on the amount of charge retained in the node FG. This is because in the case of using an n-channel transistor as the transistor 1200, an apparent threshold voltage $V_{th\_H}$ at the time when the high-level charge is given to the gate of the transistor 1200 is lower than an apparent threshold voltage $V_{th\_L}$ at the time when the low-level charge is given to the gate of the transistor 1200. Here, an apparent threshold voltage refers to the potential of the fifth wiring 1005 which is needed to make the transistor 1200 be in an on state. Thus, the potential of the fifth wiring 1005 is set to a potential $V_0$ which is between $V_{th\_H}$ and $V_{th\_L}$, whereby charge supplied to the node FG can be determined. For example, in the case where the high-level charge is supplied to the node FG in writing and the potential of the fifth wiring 1005 is $V_0$ ($>V_{th\_H}$), the transistor 1200 is brought into an on state. On the other hand, in the case where the low-level charge is supplied to the node FG in writing, even when the potential of the fifth wiring 1005 is $V_0$ ($<V_{th\_L}$), the transistor 1200 remains in the off state. Thus, the data retained in the node FG can be read by determining the potential of the second wiring 1002.

Note that it is necessary that data of a desired cell is read in read operation. In memory cells from which data is not read, a potential at which the transistor 1200 is turned off regardless of the charge supplied to the node FG, that is, a potential lower than $V_{th\_H}$ is supplied to the fifth wiring 1005. Alternatively, a potential at which the transistor 1200 is turned on regardless of the charge supplied to the node FG, that is, a potential higher than $V_{th\_L}$ is supplied to the fifth wiring 1005.

Figure 32B:
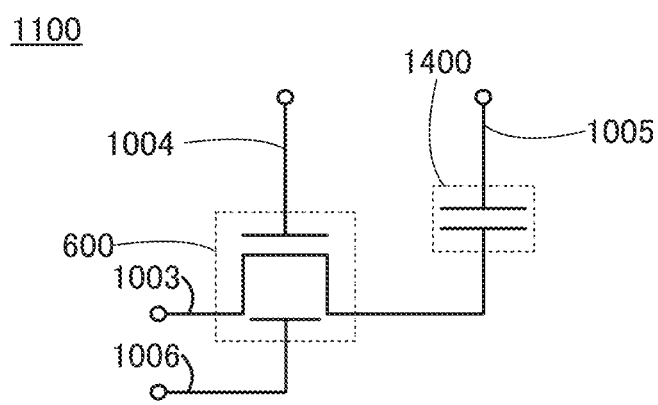

A cell 1100 in FIG. 32(B) is different from the cell 1000 in that the transistor 1200 is not provided. Also in this case, data can be written and retained in a manner similar to that of the cell 1000.

Reading of data in the cell 1100 is described. When the transistor 600 is brought into an on state, the third wiring 1003 which is in a floating state and the capacitor 1400 are brought into conduction, and the charge is redistributed between the third wiring 1003 and the capacitor 1400. As a result, the potential of the third wiring 1003 changes. The amount of change in the potential of the third wiring 1003 varies depending on the potential of the one electrode of the capacitor 1400 (or the charge accumulated in the capacitor 1400).

For example, the potential of the third wiring 1003 after the charge redistribution is $(C_B \times V_{B0} + C \times V)/(C_B + C)$, where V is the potential of the one electrode of the capacitor 1400, C is the capacitance of the capacitor 1400, $C_B$ is the capacitance component of the third wiring 1003, and $V_{B0}$ is the potential of the third wiring 1003 before the charge redistribution. Thus, it can be found that, assuming that the memory cell is in either of two states in which the potential of the one electrode of the capacitor 1400 is $V_1$ and $V_0$ ($V_1 > V_0$), the potential of the third wiring 1003 in the case of retaining the potential $V_1$ ($=(C_B \times V_{B0} + C \times V_1)/(C_B + C)$) is higher than the potential of the third wiring 1003 in the case of retaining the potential $V_0$ ($=(C_B \times V_{B0} + C \times V_0)/(C_B + C)$).

Then, by comparing the potential of the third wiring 1003 with a predetermined potential, data can be read.

In the memory device including the cell 1000 or the cell 1100, high voltage is not needed for writing data and deterioration of elements is less likely to occur. Unlike in a conventional nonvolatile memory, for example, it is not necessary to inject and extract electrons into and from a floating gate; thus, a problem such as deterioration of an insulating film is not caused. That is, the memory device of one embodiment of the present invention is a semiconductor device which does not have a limit on the number of times data can be rewritten, which is a problem of a conventional nonvolatile memory, and the reliability thereof is drastically improved. Furthermore, data is written depending on the on state or the off state of the transistor, whereby high-speed operation can be easily achieved.

Figure 33:
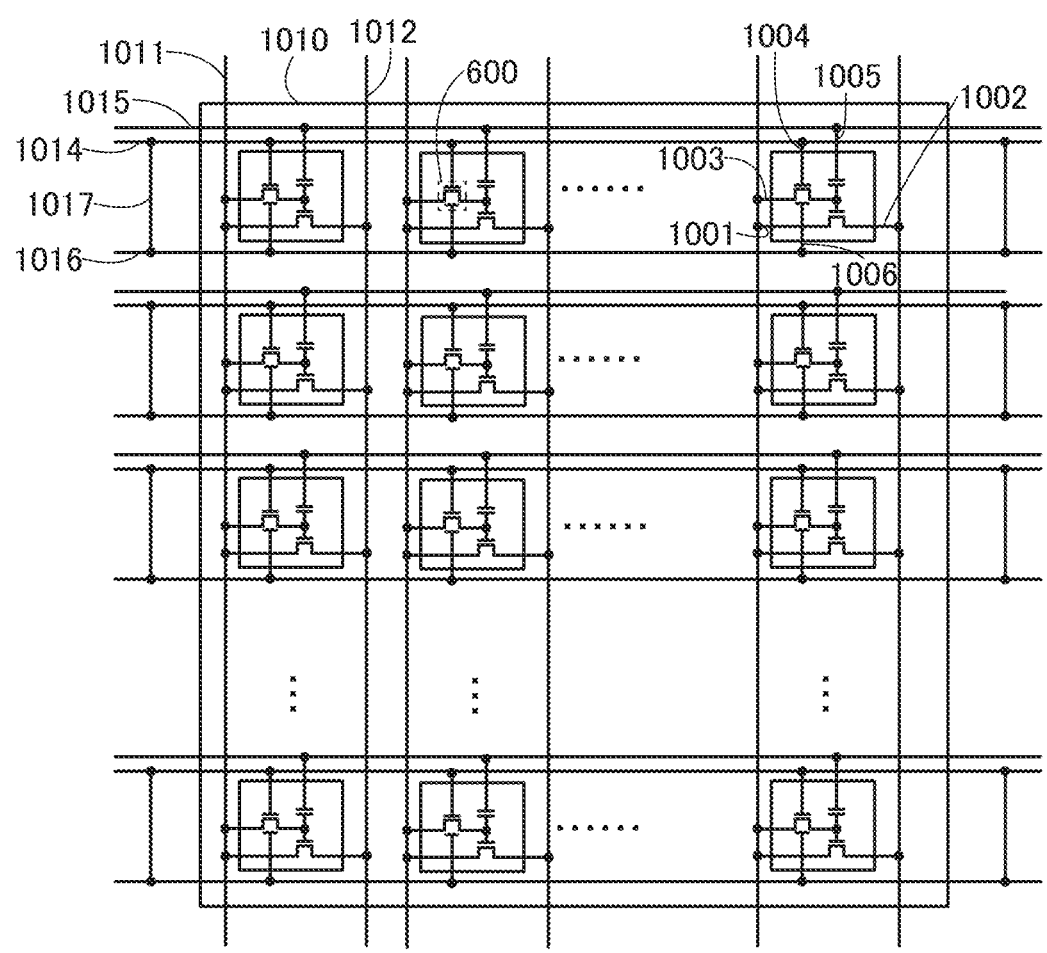
FIG. 33 A circuit diagram illustrating one embodiment of a memory device.

FIG. 33 illustrates a cell array 1010 in which the cells 1000 illustrated in FIG. 32(A) are arranged in a matrix. The wiring 1001 and the wiring 1003 are connected to a wiring 1011, the wiring 1002 is connected to a wiring 1012, the wiring 1004 is connected to a wiring 1014, the wiring 1005 is connected to a wiring 1015, and the wiring 1006 is connected to a wiring 1016. In other words, the wiring 1014 and the wiring 1016 are electrically connected to the first gate electrode of the transistor 600 and the second gate electrode of the transistor 600, respectively.

As illustrated in FIG. 33, the wiring 1014 and the wiring 1015 are electrically connected to each other via a wiring 1017 in a region outside the cell array 1010, whereby the cell 1000 does not need to have a contact hole for electrically connecting the wiring 1014 to the wiring 1015; as a result, the density of the cells 1000 can be increased.

Note that contact holes may be provided in some cells 1000 to electrically connect the wiring 1014 to the wiring 1015. For example, a contact hole may be provided for the cells 1000 in each chip. A contact hole is provided in the cell 1000 in addition to the region outside the cell array 1010, whereby a distance between the contact holes can be reduced. Thus, signal delay between the wirings 1014 and 1015 can be reduced. Note that the contact holes are preferably, but not necessarily, provided at regular intervals as much as possible.

Even if the contact holes for electrically connecting the wiring 1014 to the wiring 1015 are provided in some cells 1000, the density of the cells 1000 can be increased as compared with the case where the contact holes are provided in all the cells 1000.

Figure 34A:
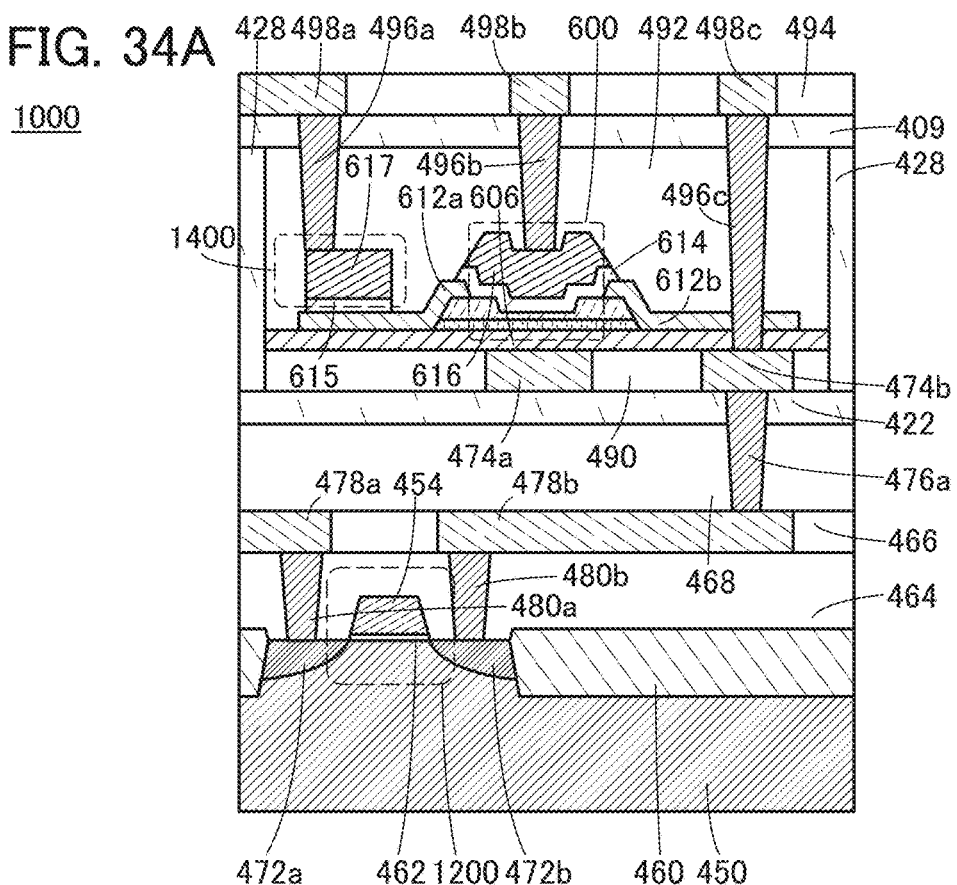
FIGS. 34A-34C Cross-sectional views illustrating one embodiment of a memory device.
Figure 34B:
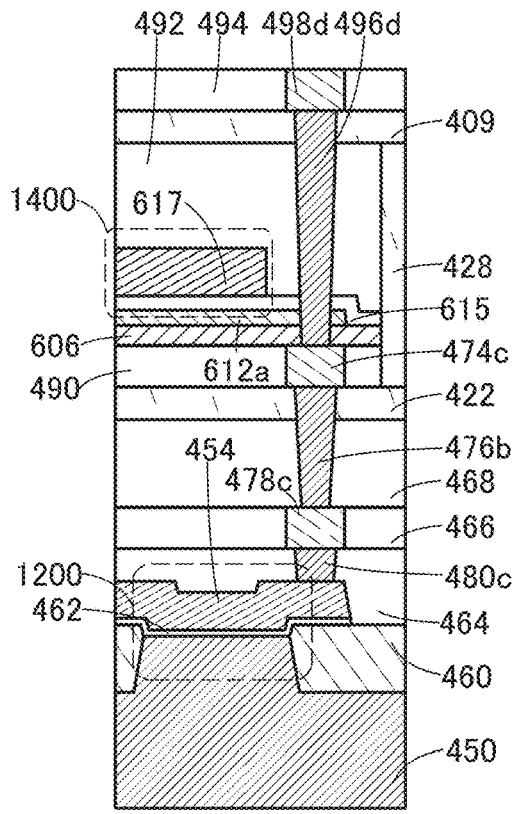
Figure 34C:
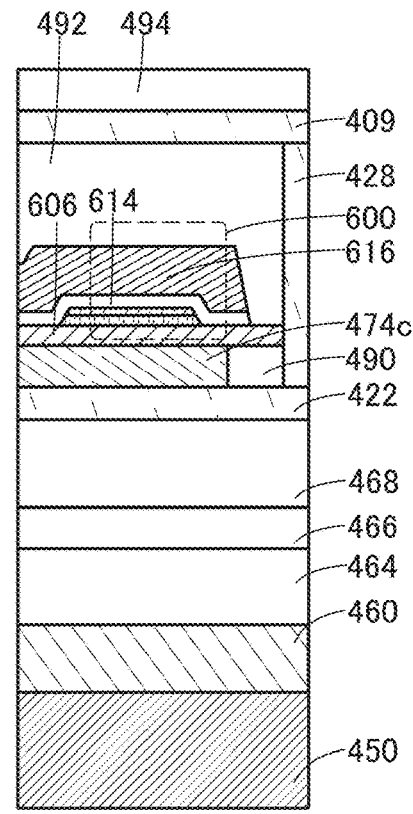

FIG. 34 is a cross-sectional view of the cell 1000 corresponding to FIG. 32(A). Note that FIG. 34(A), FIG. 34(B), and FIG. 34(C) are cross-sectional views of different portions.

The semiconductor device illustrated in FIG. 34 includes the transistor 1200, the transistor 600, and the capacitor 1400. The transistor 600 and the capacitor 1400 are placed above the transistor 1200.

The transistor 1200 illustrated is a transistor including a semiconductor substrate 450. The transistor 1200 includes a region 472a in the semiconductor substrate 450, a region 472b in the semiconductor substrate 450, an insulating film 462, and a conductive film 454.

In the transistor 1200, the regions 472a and 472b serve as a source region and a drain region. The insulating film 462 serves as a gate insulating film. The conductive film 454 serves as a gate electrode. Thus, the resistance of a channel formation region can be controlled by a potential applied to the conductive film 454. In other words, conduction or non-conduction between the region 472a and the region 472b can be controlled by the potential applied to the conductive film 454.

As the semiconductor substrate 450, a single material semiconductor substrate of silicon, germanium, or the like or a compound semiconductor substrate of silicon carbide, silicon germanium, gallium arsenide, indium phosphide, zinc oxide, gallium oxide, or the like may be used, for example. A single crystal silicon substrate is preferably used as the semiconductor substrate 450.

For the semiconductor substrate 450, a semiconductor substrate including impurities imparting n-type conductivity is used. However, a semiconductor substrate including impurities imparting p-type conductivity may be used as the semiconductor substrate 450. In that case, a well including impurities imparting the n-type conductivity may be provided in a region where the transistor 1200 is formed. Alternatively, the semiconductor substrate 450 may be an i-type semiconductor substrate.

The top surface of the semiconductor substrate 450 preferably has a (110) plane. Thus, on-state characteristics of the transistor 1200 can be improved.

The regions 472a and 472b are regions including impurities imparting the p-type conductivity. Accordingly, the transistor 1200 has a structure of a p-channel transistor.

Note that the transistor 1200 is apart from an adjacent transistor by a region 460 and the like. The region 460 is an insulating region.

The cell 1000 illustrated in FIG. 34 includes an insulating film 464, an insulating film 466, an insulating film 468, an insulating film 422, a conductive film 480*a*, a conductive film 480*b*, a conductive film 480*c*, a conductive film 478*a*, a conductive film 478*b*, a conductive film 478*c*, a conductive film 476*a*, a conductive film 476*b*, a conductive film 474*a*, a conductive film 474*b*, a conductive film 474*c*, a conductive film 496*a*, a conductive film 496*b*, a conductive film 496*c*, a conductive film 496*d*, a conductive film 498*a*, a conductive film 498*b*, a conductive film 498*c*, a conductive film 498*d*, an insulating film 490, an insulating film 492, the insulating film 428, the insulating film 409, and an insulating film 494.

The insulating film 422, the insulating film 428, and the insulating film 409 have barrier properties. This means that the semiconductor device illustrated in FIG. 34 has a structure in which the transistor 600 is surrounded by insulating films having barrier properties. Note that one or more of the insulating film 422, the insulating film 428, and the insulating film 409 are not necessarily provided.

The insulating film 464 is placed over the transistor 1200. The insulating film 466 is placed over the insulating film 464. The insulating film 468 is placed over the insulating film 466. The insulating film 490 is placed over the insulating film 468. The transistor 600 is placed over the insulating film 490. The insulating film 492 is placed over the transistor 600. The insulating film 494 is placed over the insulating film 492.

The insulating film 464 includes a contact hole reaching the region 472*a*, a contact hole reaching the region 472*b*, and a contact hole reaching the conductive film 454. In the contact holes, the conductive film 480*a*, the conductive film 480*b*, and the conductive film 480*c* are embedded.

The insulating film 466 includes a contact hole reaching the conductive film 480*a*, a contact hole reaching the conductive film 480*b*, and a contact hole reaching the conductive film 480*c*. In the contact holes, the conductive film 478*a*, the conductive film 478*b*, and the conductive film 478*c* are embedded.

The insulating film 468 and the insulating film 422 include a contact hole reaching the conductive film 478*b* and a contact hole reaching the conductive film 478*c*. In the contact holes, the conductive film 476*a* and the conductive film 476*b* are embedded.

The insulating film 490 includes a contact hole overlapping a channel formation region of the transistor 600, a contact hole reaching the conductive film 476*a*, and a contact hole reaching the conductive film 476*b*. In the contact holes, the conductive film 474*a*, the conductive film 474*b*, and the conductive film 474*c* are embedded.

The conductive film 474*a* serves as a second gate electrode (also referred to as a back gate electrode) of the transistor 600. That is, the transistor 600 has the s-channel structure described above in Embodiment 2. Thus, the on-state current of the transistor 600 can be increased. A punch-through phenomenon can be suppressed; thus, stable electrical characteristics in a saturation region of the transistor 600 can be obtained.

Furthermore, the insulating film 409 and the insulating film 492 includes a contact hole which reaches a conductive film 617 overlapping with the conductive film 612*a* serving as one of the source electrode and the drain electrode of the transistor 600 with an insulating film 615 provided therebetween, a contact hole which reaches a conductive film 616 serving as the gate electrode of the transistor 600, a contact hole which reaches the conductive film 474*b* through the conductive film 612*b* serving as the other of the source electrode and the drain electrode of the transistor 600, and a contact hole which reaches the conductive film 474*c* through the conductive film 612*a* serving as one of the source electrode and the drain electrode of the transistor 600. Furthermore, the conductive film 496*a*, the conductive film 496*b*, the conductive film 496*c*, and the conductive film 496*d* are embedded in the respective contact holes. Note that in some cases, each of the contact holes is provided with a contact hole included in any of components of the transistor 600 and the like provided therebetween.

The insulating film 494 includes a contact hole reaching the conductive film 496*a*, a contact hole reaching the conductive film 496*b*, a contact hole reaching the conductive film 496*c*, and a contact hole reaching the conductive film 496*d*. In the contact holes, the conductive film 498*a*, the conductive film 498*b*, the conductive film 498*c*, and the conductive film 498*d* are embedded.

The insulating films 464, 466, 468, 490, 492, and 494 may be formed to have a single-layer structure or a stacked-layer structure including an insulating film containing, for example, boron, carbon, nitrogen, oxygen, fluorine, magnesium, aluminum, silicon, phosphorus, chlorine, argon, gallium, germanium, yttrium, zirconium, lanthanum, neodymium, hafnium, or tantalum. The insulating film 401 may be formed using aluminum oxide, magnesium oxide, silicon oxide, silicon oxynitride, silicon nitride oxide, silicon nitride, gallium oxide, germanium oxide, yttrium oxide, zirconium oxide, lanthanum oxide, neodymium oxide, hafnium oxide, or tantalum oxide, for example.

At least one of the insulating films 464, 466, 468, 490, 492, and 494 preferably includes an insulating film having a barrier property.

An insulating film with a function of blocking oxygen and impurities such as hydrogen may be formed to have a single-layer structure or a stacked-layer structure including an insulating film containing, for example, boron, carbon, nitrogen, oxygen, fluorine, magnesium, aluminum, silicon, phosphorus, chlorine, argon, gallium, germanium, yttrium, zirconium, lanthanum, neodymium, hafnium, or tantalum.

Each of the conductive films 480*a*, 480*b*, 480*c*, 478*a*, 478*b*, 478*c*, 476*a*, 476*b*, 474*a*, 474*b*, 474*c*, 496*a*, 496*b*, 496*c*, 496*d*, 498*a*, 498*b*, 498*c*, and 498*d* may be formed to have, for example, a single-layer structure or a stacked-layer structure including a conductive film containing one or more kinds selected from boron, nitrogen, oxygen, fluorine, silicon, phosphorus, aluminum, titanium, chromium, manganese, cobalt, nickel, copper, zinc, gallium, yttrium, zirconium, molybdenum, ruthenium, silver, indium, tin, tantalum, and tungsten. An alloy or a compound of the above element may be used, for example, and a conductive film containing aluminum, a conductive film containing copper and titanium, a conductive film containing copper and manganese, a conductive film containing indium, tin, and oxygen, a conductive film containing titanium and nitrogen, or the like may be used. At least one of the conductive films 480*a*, 480*b*, 480*c*, 478*a*, 478*b*, 478*c*, 476*a*, 476*b*, 474*a*, 474*b*, 474*c*, 496*a*, 496*b*, 496*c*, 496*d*, 498*a*, 498*b*, 498*c*, and 498*d* preferably includes a conductive film having a barrier property.

The source electrode or the drain electrode of the transistor 1200 is electrically connected to the conductive film 612*b* that serves as the other of the source electrode and the drain electrode of the transistor 600 through the conductive film 480*b*, the conductive film 478*b*, the conductive film 476a, the conductive film 474b, and the conductive film 496c. The conductive film 454 that serves as the gate electrode of the transistor 1200 is electrically connected to the conductive film 612a that serves as the one of the source and the drain of the transistor 600 through the conductive film 480c, the conductive film 478c, the conductive film 476b, the conductive film 474c, and the conductive film 496d.

The capacitor 1400 includes the insulating film 615 and the conductive film 617. The insulating film 615 can be formed in the same step as the insulating film 614 serving as a gate insulating film of the transistor 600. Thus, productivity can be preferably increased in some cases. When a layer formed by the same step as the conductive film 616 serving as a gate electrode of the transistor 600 is used as the conductive film 617, productivity can be preferably increased in some cases. However, they may be formed in different steps.

Figure 35A:
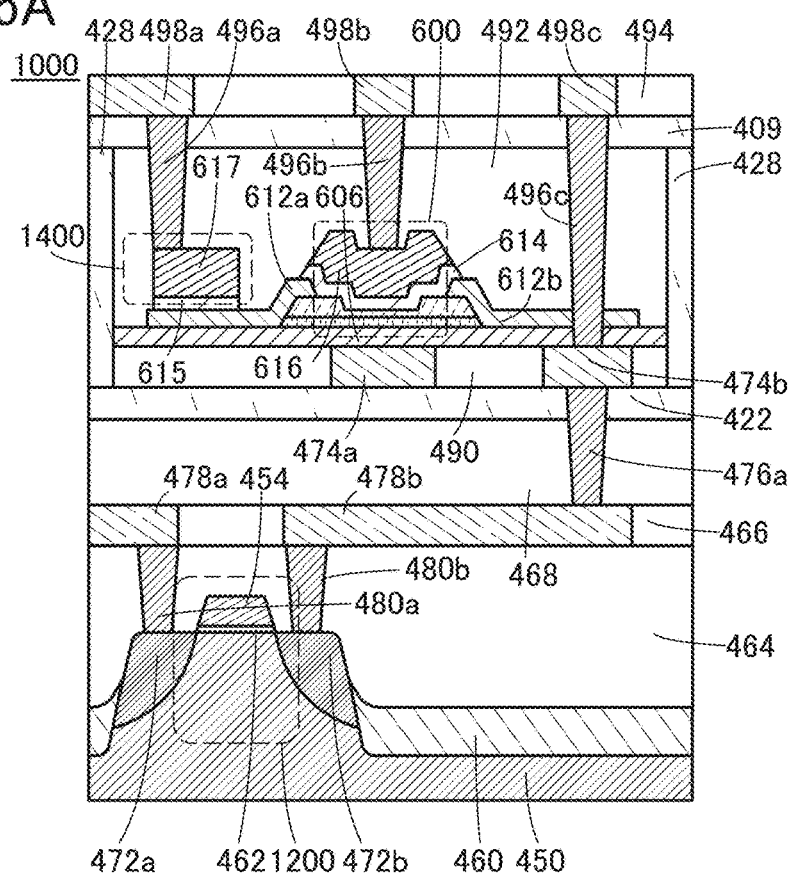
FIGS. 35A-35C Cross-sectional views illustrating one embodiment of a memory device.
Figure 35B:
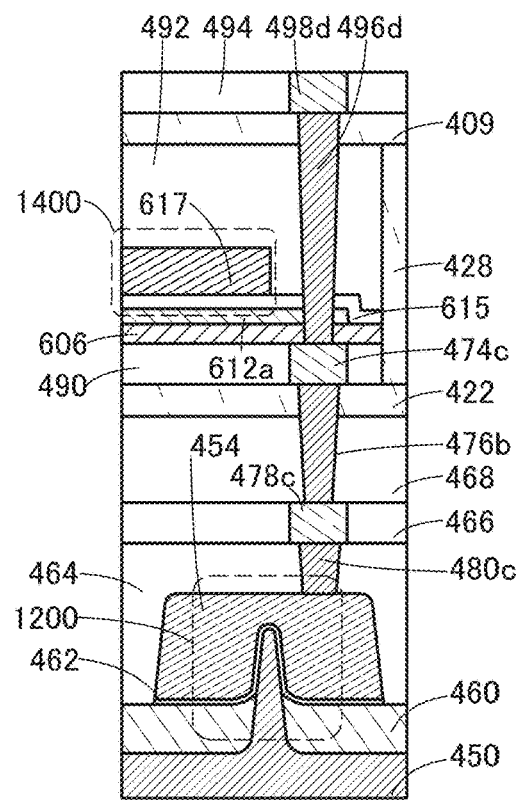
Figure 35C:
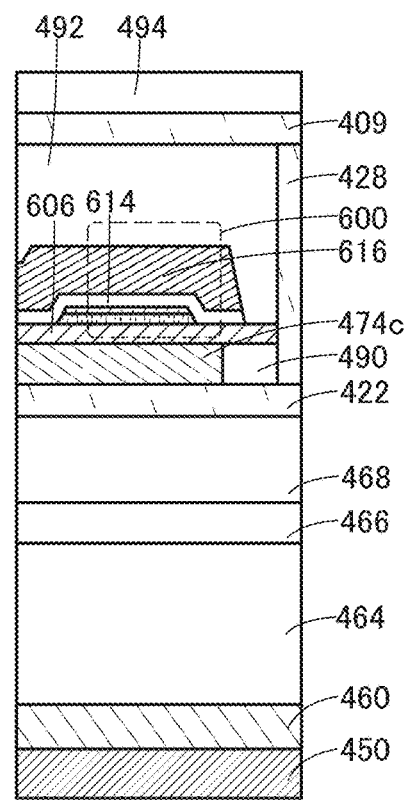

Note that the cell 1000 in FIG. 35 is the same as the cell 1000 in FIG. 34 except for the structure of the transistor 1200. Therefore, the description of the cell 1000 in FIG. 34 is referred to for the cell 1000 in FIG. 35. Specifically, in the cell 1000 in FIG. 35, the transistor 1200 is a Fin-type transistor. The effective channel width is increased in the Fin-type transistor 1200, whereby the on-state characteristics of the transistor 1200 can be improved. In addition, since contribution of the electric field of the gate electrode can be increased, the off-state characteristics of the transistor 1200 can be improved. Note that FIG. 35(A), FIG. 35(B), and FIG. 35(C) are cross-sectional views of different portions.

Figure 36A:
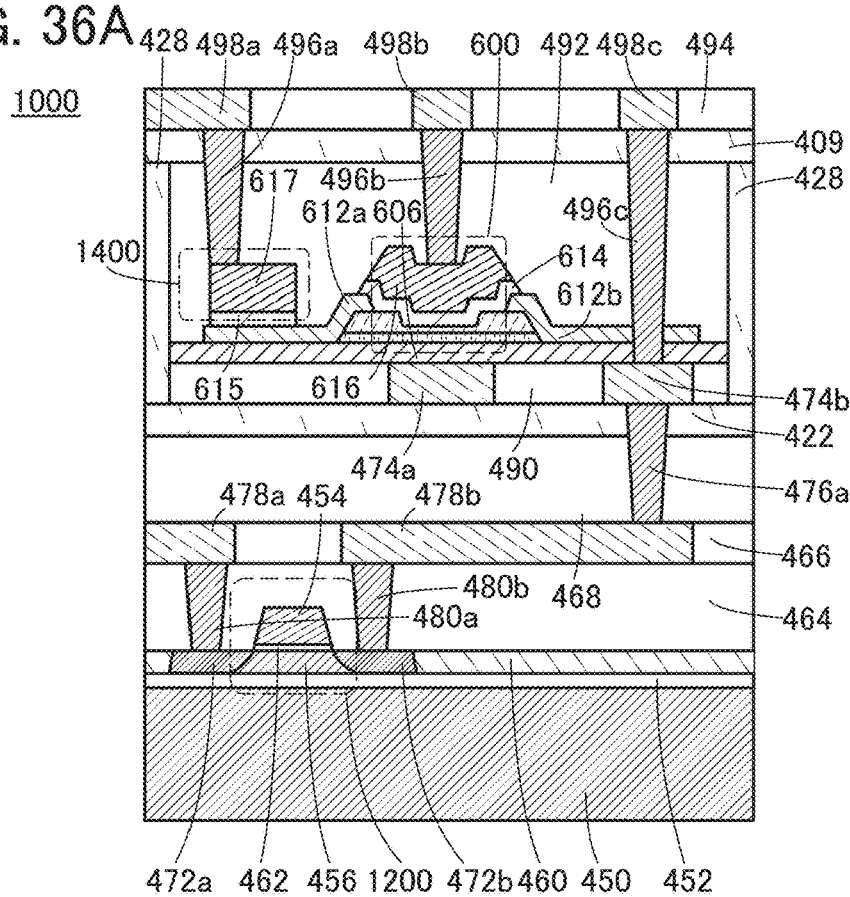
FIGS. 36A-36C Cross-sectional views illustrating one embodiment of a memory device.
Figure 36B:
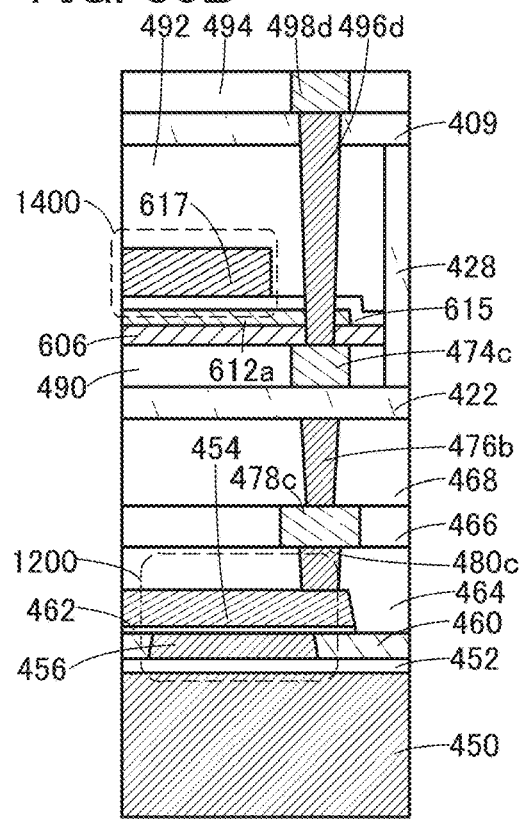
Figure 36C:
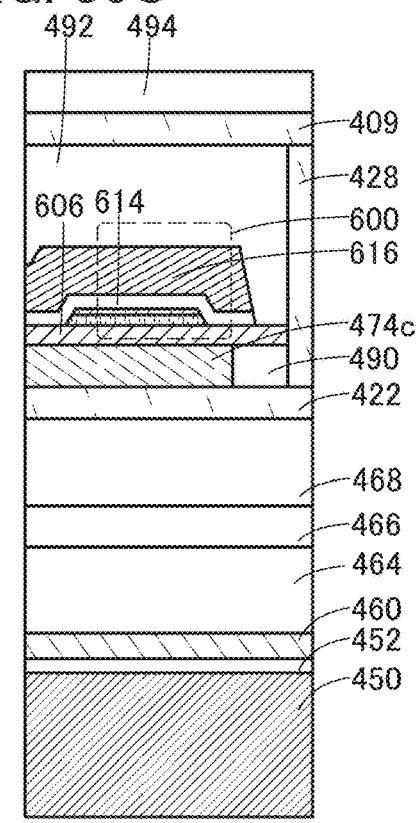

Note that the cell 1000 in FIG. 36 is the same as the cell 1000 in FIG. 34 except for the structure of the transistor 1200. Therefore, the description of the cell 1000 in FIG. 34 is referred to for the cell 1000 in FIG. 36. Specifically, in the cell 1000 in FIG. 36, the transistor 1200 is formed in an SOI substrate. In the structure in FIG. 36, a region 456 is apart from the semiconductor substrate 450 with an insulating film 452 provided therebetween. Since the SOI substrate is used, a punch-through phenomenon and the like can be suppressed; thus, the off-state characteristics of the transistor 1200 can be improved. Note that the insulating film 452 can be formed by turning part of the semiconductor substrate 450 into an insulator. For example, silicon oxide can be used as the insulating film 452. Note that FIG. 36(A), FIG. 36(B), and FIG. 36(C) are cross-sectional views of different portions.

In each of the cells 1000 shown in FIG. 34 to FIG. 36, a p-channel transistor is formed utilizing a semiconductor substrate, and an n-channel transistor is formed above that; accordingly, an occupation area of the element can be reduced. That is, the integration degree of the semiconductor device can be improved. In addition, the process can be simplified compared to the case where an n-channel transistor and a p-channel transistor are formed utilizing the same semiconductor substrate; therefore, the productivity of the semiconductor device can be increased. Moreover, the yield of the semiconductor device can be improved. For the p-channel transistor, some complicated steps such as formation of LDD (lightly doped drain) regions, formation of a shallow trench structure, or distortion design can be omitted in some cases. Therefore, the productivity and yield of the semiconductor device can be increased in some cases, compared to a semiconductor device where an n-channel transistor is formed utilizing the semiconductor substrate.

Note that although the transistor 1200 is described as a p-channel transistor in this embodiment, the transistor 1200 may be an n-channel transistor.

Note that the transistor 600 in this embodiment may be the transistor 500.

The structure described in this embodiment can be used in appropriate combination with the structure described in any of the other embodiments.

(Embodiment 5)

In this embodiment, a display module and electronic devices that include a semiconductor device of one embodiment of the present invention will be described with reference to FIG. 37 and FIG. 38.

Figure 37:
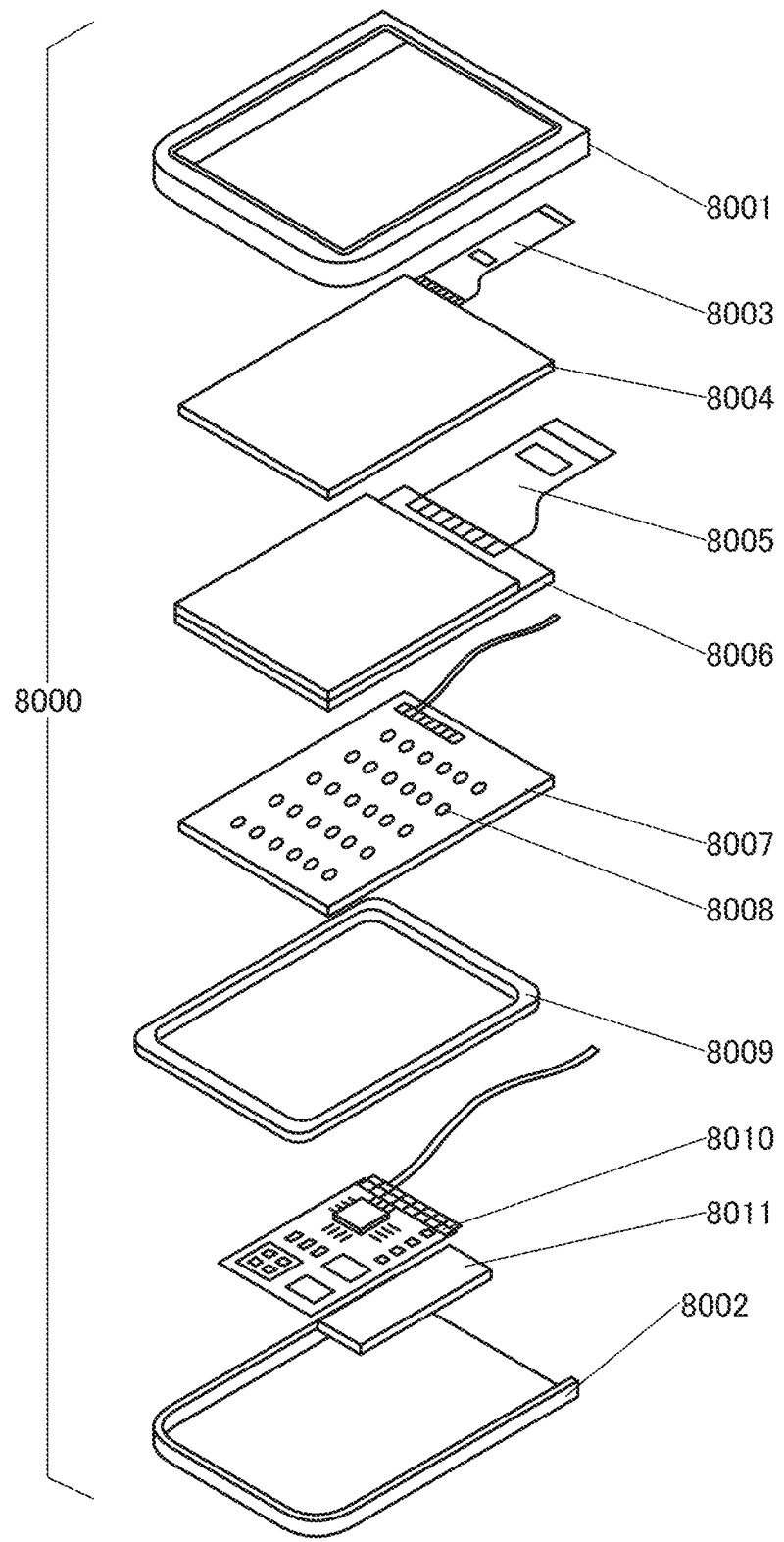
FIG. 37 A view illustrating a display module.

In a display module 8000 illustrated in FIG. 37, a touch panel 8004 connected to an FPC 8003, a display panel 8006 connected to an FPC 8005, a backlight 8007, a frame 8009, a printed board 8010, and a battery 8011 are provided between an upper cover 8001 and a lower cover 8002.

The semiconductor device of one embodiment of the present invention can be used for, for example, the display panel 8006.

The shapes and sizes of the upper cover 8001 and the lower cover 8002 can be changed as appropriate in accordance with the sizes of the touch panel 8004 and the display panel 8006.

The touch panel 8004 can be a resistive touch panel or a capacitive touch panel and can be formed so as to overlap with the display panel 8006. A counter substrate (sealing substrate) of the display panel 8006 can have a touch panel function. A photosensor may be provided in each pixel of the display panel 8006 so that an optical touch panel is obtained.

The backlight 8007 includes light sources 8008. Note that although a structure in which the light sources 8008 are provided over the backlight 8007 is illustrated in FIG. 37, one embodiment of the present invention is not limited to this structure. For example, a structure in which the light sources 8008 are provided at an end portion of the backlight 8007 and a light diffusion plate is further provided may be employed. Note that the backlight 8007 need not be provided in the case where a self-luminous light-emitting element such as an organic EL element is used or in the case where a reflective panel or the like is employed.

The frame 8009 protects the display panel 8006 and also functions as an electromagnetic shield for blocking electromagnetic waves generated by the operation of the printed board 8010. The frame 8009 may function as a radiator plate.

The printed board 8010 is provided with a power supply circuit and a signal processing circuit for outputting a video signal and a clock signal. As a power source for supplying power to the power supply circuit, an external commercial power source or a power source using the battery 8011 provided separately may be used. The battery 8011 can be omitted in the case of using a commercial power source.

The display module 8000 may be additionally provided with a member such as a polarizing plate, a retardation plate, or a prism sheet.

FIG. 38(A) to FIG. 38(G) illustrate electronic devices. These electronic devices can include a housing 5000, a display portion 5001, a speaker 5003, an LED lamp 5004, operation keys 5005 (including a power switch and an operation switch), a connection terminal 5006, a sensor 5007 (a sensor having a function of measuring force, displacement, position, speed, acceleration, angular velocity, rotational frequency, distance, light, liquid, magnetism, temperature, chemical substance, sound, time, hardness, electric field, current, voltage, electric power, radiation, flow rate, humidity, gradient, oscillation, odor, or infrared ray), a microphone 5008, and the like.

Figure 38A:
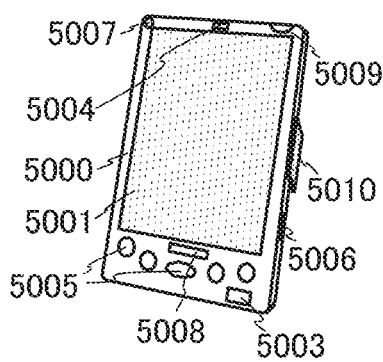
FIGS. 38A-38G Views illustrating electronic devices.
Figure 38B:
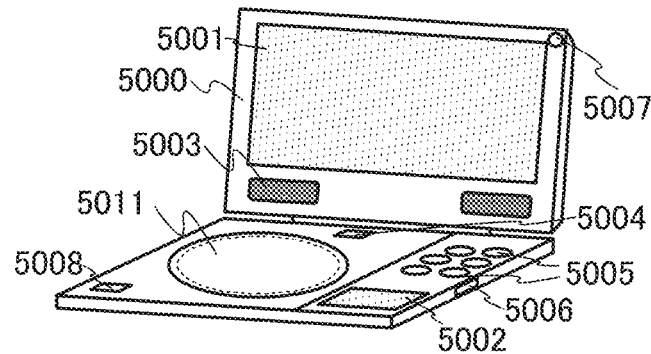
Figure 38C:
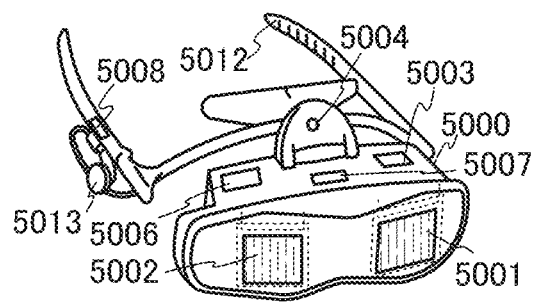
Figure 38D:
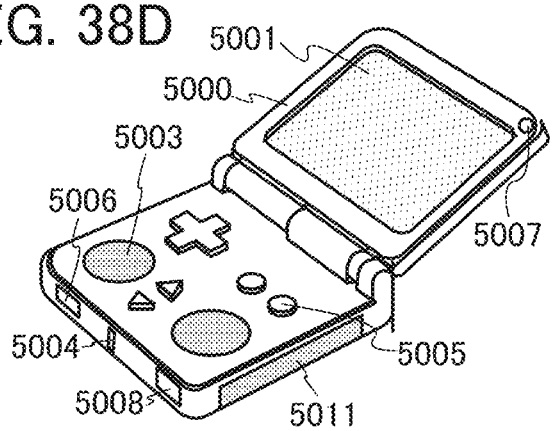
Figure 38E:
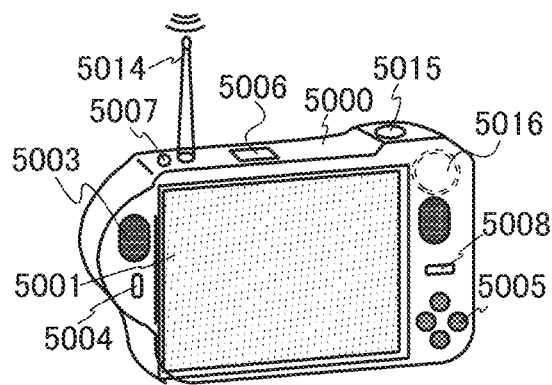
Figure 38F:
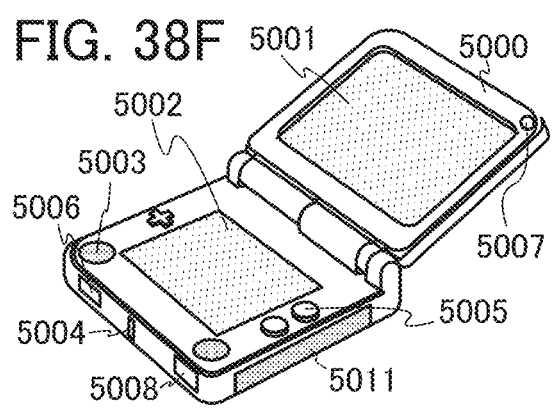
Figure 38G:
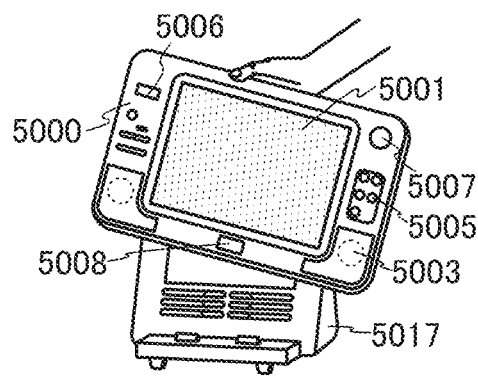

FIG. 38(A) illustrates a mobile computer that can include a switch 5009, an infrared port 5010, and the like in addition to the above components. FIG. 38(B) illustrates a portable image reproducing device (e.g., a DVD reproducing device) provided with a recording medium, and the portable image reproducing device can include a second display portion 5002, a recording medium reading portion 5011, and the like in addition to the above components. FIG. 38(C) illustrates a goggle-type display that can include the second display portion 5002, a support portion 5012, an earphone 5013, and the like in addition to the above components. FIG. 38(D) illustrates a portable game console that can include the recording medium reading portion 5011 and the like in addition to the above components. FIG. 38(E) illustrates a digital camera with a television reception function, and the digital camera can include an antenna 5014, a shutter button 5015, an image receiving portion 5016, and the like in addition to the above components. FIG. 38(F) illustrates a portable game console that can include the second display portion 5002, the recording medium reading portion 5011, and the like in addition to the above components. FIG. 38(G) illustrates a portable television receiver that can include a charger 5017 capable of transmitting and receiving signals, and the like in addition to the above components.

The electronic devices in FIG. 38(A) to FIG. 38(G) can have a variety of functions such as a function of displaying a variety of data (e.g., a still image, a moving image, and a text image) on the display portion, a touch panel function, a function of displaying a calendar, date, time, and the like, a function of controlling processing with a variety of software (programs), a wireless communication function, a function of being connected to a variety of computer networks with a wireless communication function, a function of transmitting and receiving a variety of data with a wireless communication function, and a function of reading out a program or data stored in a recording medium and displaying it on the display portion. Furthermore, the electronic device including a plurality of display portions can have a function of displaying image data mainly on one display portion while displaying text data mainly on another display portion, a function of displaying a three-dimensional image by displaying images on a plurality of display portions with a parallax taken into account, or the like. Furthermore, the electronic device including an image receiving portion can have a function of shooting a still image, a function of taking moving images, a function of automatically or manually correcting a shot image, a function of storing a shot image in a recording medium (an external recording medium or a recording medium incorporated in the camera), a function of displaying a shot image on the display portion, or the like. Note that functions of the electronic devices in FIG. 38(A) to FIG. 38(G) are not limited thereto, and the electronic devices can have a variety of functions.

In the electronic devices described in this embodiment, any of the semiconductor devices described in Embodiment 1 to Embodiment 4 can be used.

The structure described in this embodiment can be used in appropriate combination with the structure described in any of the other embodiments.

REFERENCE NUMERALS

401: insulating film
409: insulating film
422: insulating film
428: insulating film
450: semiconductor substrate
452: insulating film
454: conductive film
456: region
460: region
462: insulating film
464: insulating film
466: insulating film
468: insulating film
472*a*: region
472*b*: region
474*a*: conductive film
474*b*: conductive film
474*c*: conductive film
476*a*: conductive film
476*b*: conductive film
478*a*: conductive film
478*b*: conductive film
478*c*: conductive film
480*a*: conductive film
480*b*: conductive film
480*c*: conductive film
490: insulating film
492: insulating film
494: insulating film
496*a*: conductive film
496*b*: conductive film
496*c*: conductive film
496*d*: conductive film
498*a*: conductive film
498*b*: conductive film
498*c*: conductive film
498*d*: conductive film
500: transistor
502: substrate
504: conductive film
506: insulating film
507: insulating film
508: oxide semiconductor film
508*a*: oxide semiconductor film
508*b*: oxide semiconductor film
509: oxide semiconductor film
509*a*: insulating film
509*b*: oxide semiconductor film
512: conductive film
512*a*: conductive film
512*b*: conductive film
514: insulating film
516: insulating film
518: insulating film
519: insulating film
520: conductive film
520*a*: conductive film
520*b*: conductive film
531: barrier film
536*a*: mask
536*b*: mask
538: etchant
539: etchant
540: oxygen
540*a*: oxygen
542: etchant
542*a*: contact hole
542*b*: contact hole
542*c*: contact hole
570: transistor
600: transistor
602: substrate 604: conductive film
606: insulating film
608: oxide semiconductor film
608a: oxide semiconductor film
608b: oxide semiconductor film
612a: conductive film
612b: conductive film
614: insulating film
615: insulating film
616: conductive film
617: conductive film
618: insulating film
700: semiconductor device
701: substrate
702: pixel portion
703: pixel
704: source driver
705: substrate
706: gate driver
706a: gate driver
706b: gate driver
708: FPC terminal portion
710: wiring
711: wiring portion
712: sealant
716: FPC
717: scan line
717a: scan line
717b: scan line
718: wiring
719: contact hole
719a: contact hole
719b: contact hole
719c: contact hole
720: signal line
721: region
722: region
730: region
734: insulating film
736: coloring layer
738: light-blocking film
744: projection
750: transistor
752: transistor
760: connection electrode
764: insulating film
766: insulating film
768: insulating film
770: planarization insulating film
772: conductive film
774: conductive film
775: liquid crystal element
776: liquid crystal layer
778: structure
780: anisotropic conductive film
790: capacitor
1000: cell
1001: wiring
1002: wiring
1003: wiring
1004: wiring
1005: wiring
1006: wiring
1010: cell array
1011: wiring
1012: wiring
1014: wiring
1015: wiring
1016: wiring
1017: wiring
1100: cell
1200: transistor
1400: capacitor
5000: housing
5001: display portion
5002: display portion
5003: speaker
5004: LED lamp
5005: operation key
5006: connection terminal
5007: sensor
5008: microphone
5009: switch
5010: infrared port
5011: memory medium reading portion
5012: support
5013: earphone
5014: antenna
5015: shutter button
5016: image receiving portion
5017: charger
8000: display module
8001: upper cover
8002: lower cover
8003: FPC
8004: touch panel
8005: FPC
8006: display panel
8007: backlight
8008: light source
8009: frame
8010: printed board
8011: battery

The invention claimed is:

1. A semiconductor device comprising:
a first driver circuit;
a second driver circuit;
a first wiring electrically connected to the first driver circuit;
a second wiring electrically connected to the second driver circuit;
a third wiring; and
a cell array comprising a plurality of cells,
wherein a first cell in the plurality of cells comprises a transistor comprising a first gate electrode, an oxide semiconductor film, and a second gate electrode,
wherein the second wiring serves as the first gate electrode,
wherein the third wiring serves as the second gate electrode,
wherein the second wiring is electrically connected to the third wiring through a first contact hole outside the cell array, and
wherein the second wiring is electrically connected to the third wiring through a second contact hole inside the cell array.

2. The semiconductor device according to claim 1, wherein the first contact hole is in a region between the cell array and the second driver circuit.

3. The semiconductor device according to claim 2, wherein a width of the second wiring in the region is larger than a width of the second wiring overlapping with the cell array.

4. The semiconductor device according to claim 1,
wherein electric resistance of the third wiring is lower than or equal to electric resistance of the second wiring.

5. The semiconductor device according to claim 1, wherein the third wiring comprises copper.

6. The semiconductor device according to claim 1, wherein the first cell is a pixel, and
wherein the cell array is a pixel portion.

7. An electronic device comprising the semiconductor device according to claim 1.

8. A semiconductor device comprising:
a first driver circuit;
a second driver circuit;
a third driver circuit;
a first wiring electrically connected to the first driver circuit;
a second wiring electrically connected to one of the second driver circuit and the third driver circuit;
a third wiring; and
a cell array comprising a plurality of cells, the cell array being between the second driver circuit and the third driver circuit,
wherein a first cell in the plurality of cells comprises a transistor comprising a first gate electrode, an oxide semiconductor film, and a second gate electrode,
wherein the second wiring serves as the first gate electrode,
wherein the third wiring serves as the second gate electrode,
wherein the second wiring is electrically connected to the third wiring through a first contact hole outside the cell array, and
wherein the second wiring is electrically connected to the third wiring through a second contact hole inside the cell array.

9. The semiconductor device according to claim 8,
wherein the first contact hole is in a region between the cell array and the second driver circuit.

10. The semiconductor device according to claim 9,
wherein a width of the second wiring in the region is larger than a width of the second wiring overlapping with the cell array.

11. The semiconductor device according to claim 8,
wherein electric resistance of the third wiring is lower than or equal to electric resistance of the second wiring.

12. The semiconductor device according to claim 8,
wherein the third wiring comprises copper.

13. The semiconductor device according to claim 8,
wherein the first cell is a pixel, and
wherein the cell array is a pixel portion.

14. An electronic device comprising the semiconductor device according to claim 8.

15. A semiconductor device comprising:
a first driver circuit;
a second driver circuit;
a first wiring electrically connected to the first driver circuit;
a second wiring electrically connected to the second driver circuit;
a third wiring; and
a cell array comprising a plurality of cells,
wherein a first cell in the plurality of cells comprises a transistor comprising a first gate electrode, an oxide semiconductor film, and a second gate electrode,
wherein the second wiring serves as the first gate electrode,
wherein the third wiring serves as the second gate electrode,
wherein the second wiring is electrically connected to the third wiring through a first contact hole outside the cell array,
wherein the first contact hole is in a region between the cell array and the second driver circuit, and
wherein a width of the second wiring in the region is larger than a width of the second wiring overlapping with the cell array.

16. A semiconductor device comprising:
a first driver circuit;
a second driver circuit;
a third driver circuit;
a first wiring electrically connected to the first driver circuit;
a second wiring electrically connected to one of the second driver circuit and the third driver circuit;
a third wiring; and
a cell array comprising a plurality of cells, the cell array being between the second driver circuit and the third driver circuit,
wherein a first cell in the plurality of cells comprises a transistor comprising a first gate electrode, an oxide semiconductor film, and a second gate electrode,
wherein the second wiring serves as the first gate electrode,
wherein the third wiring serves as the second gate electrode,
wherein the second wiring is electrically connected to the third wiring through a first contact hole outside the cell array,
wherein the first contact hole is in a region between the cell array and the second driver circuit, and
wherein a width of the second wiring in the region is larger than a width of the second wiring overlapping with the cell array.

* * * * *